United States Patent
Magome et al.

(10) Patent No.: US 8,451,424 B2
(45) Date of Patent: *May 28, 2013

(54) EXPOSURE APPARATUS, METHOD FOR PRODUCING DEVICE, AND METHOD FOR CONTROLLING EXPOSURE APPARATUS

(75) Inventors: Nobutaka Magome, Kumagaya (JP);
Naoyuki Kobayashi, Fukaya (JP);
Yasuyuki Sakakibara, Moriya (JP);
Hiroaki Takaiwa, Kumagaya (JP);
Hisatsune Kadota, Hachioji (JP)

(73) Assignee: Nikon Corporation, Tokyo (JP)

( * ) Notice: Subject to any disclaimer, the term of this patent is extended or adjusted under 35 U.S.C. 154(b) by 603 days.

This patent is subject to a terminal disclaimer.

(21) Appl. No.: 11/338,661

(22) Filed: Jan. 25, 2006

(65) Prior Publication Data

US 2006/0132737 A1    Jun. 22, 2006

Related U.S. Application Data

(63) Continuation of application No. PCT/JP2004/010991, filed on Jul. 26, 2004.

(30) Foreign Application Priority Data

Jul. 28, 2003   (JP) ................................. 2003-281183
Feb. 20, 2004  (JP) ................................. 2004-045104

(51) Int. Cl.
*G03B 27/42*   (2006.01)
*G03B 27/52*   (2006.01)

(52) U.S. Cl.
USPC ............................................ 355/53; 355/30

(58) Field of Classification Search
USPC .................... 355/30, 53, 55, 72, 75; 359/380, 359/886; 250/492.4; 427/553
See application file for complete search history.

(56) References Cited

U.S. PATENT DOCUMENTS

| | | |
|---|---|---|
| 4,270,049 A | 5/1981 | Tanaka et al. |
| 4,346,164 A | 8/1982 | Tabarelli et al. |
| 4,465,368 A | 8/1984 | Matsuura et al. |
| 4,480,910 A | 11/1984 | Takanashi et al. |

(Continued)

FOREIGN PATENT DOCUMENTS

| | | |
|---|---|---|
| DE | 221 563 A1 | 4/1985 |
| DE | 224 448 A1 | 7/1985 |

(Continued)

OTHER PUBLICATIONS

Emerging Lithographic Technologies VI, Proceedings of SPIE, vol. 4688 (2002), "Semiconductor Foundry, Lithography, and Partners", B.J. Lin, pp. 11-24.

(Continued)

*Primary Examiner* — Peter B Kim
(74) *Attorney, Agent, or Firm* — Oliff & Berridge, PLC

(57) ABSTRACT

An exposure apparatus (EX) exposes a substrate (P) by projecting an image of a pattern on the substrate (P) via a projection optical system (PL) and a liquid (1). The exposure device (EX) has a liquid supply mechanism (10) which supplies the liquid (1) between the projection optical system (PL) and the substrate (P). The liquid feeding mechanism (10) stops the supply of the liquid (1) when abnormality is detected. This suppresses influence to devices and members in the periphery of the substrate caused by leakage of the liquid forming a liquid immersion area, thereby realizing satisfactory exposure processing.

51 Claims, 21 Drawing Sheets

U.S. PATENT DOCUMENTS

| | | | |
|---|---|---|---|
| 4,672,271 A | 6/1987 | Gear et al. |
| 5,194,893 A | 3/1993 | Nishi |
| 5,493,403 A | 2/1996 | Nishi |
| 5,528,118 A | 6/1996 | Lee |
| 5,559,582 A | 9/1996 | Nishi et al. |
| 5,610,683 A | 3/1997 | Takahashi |
| 5,623,853 A | 4/1997 | Novak et al. |
| 5,646,413 A | 7/1997 | Nishi |
| 5,657,129 A | 8/1997 | Nishi |
| 5,715,039 A | 2/1998 | Fukuda et al. |
| 5,744,924 A | 4/1998 | Lee |
| 5,815,246 A | 9/1998 | Sperling et al. |
| 5,815,256 A | 9/1998 | Fukunaga |
| 5,825,043 A | 10/1998 | Suwa |
| 5,844,247 A | 12/1998 | Nishi |
| 5,874,820 A | 2/1999 | Lee |
| 5,885,134 A | 3/1999 | Shibata et al. |
| 5,942,871 A | 8/1999 | Lee |
| 5,969,441 A | 10/1999 | Loopstra et al. |
| 5,982,128 A | 11/1999 | Lee |
| 5,995,234 A | 11/1999 | Nishi |
| 6,008,500 A | 12/1999 | Lee |
| 6,020,710 A | 2/2000 | Lee |
| 6,020,964 A | 2/2000 | Loopstra et al. |
| 6,049,186 A | 4/2000 | Lee |
| 6,051,843 A | 4/2000 | Nishi |
| 6,087,797 A | 7/2000 | Lee |
| 6,150,787 A | 11/2000 | Lee |
| 6,151,105 A | 11/2000 | Lee |
| 6,175,404 B1 | 1/2001 | Lee |
| 6,188,195 B1 | 2/2001 | Lee |
| 6,195,154 B1 | 2/2001 | Imai |
| 6,208,407 B1 | 3/2001 | Loopstra |
| 6,246,202 B1 | 6/2001 | Lee |
| 6,262,796 B1 | 7/2001 | Loopstra et al. |
| 6,268,904 B1 | 7/2001 | Mori et al. |
| 6,271,640 B1 | 8/2001 | Lee |
| 6,279,881 B1 | 8/2001 | Nishi |
| 6,281,654 B1 | 8/2001 | Lee |
| 6,316,901 B2 | 11/2001 | Lee |
| 6,341,007 B1 | 1/2002 | Nishi et al. |
| 6,400,441 B1 | 6/2002 | Nishi et al. |
| 6,498,352 B1 | 12/2002 | Nishi |
| 6,549,269 B1 | 4/2003 | Nishi et al. |
| 6,566,770 B1 | 5/2003 | Nakamura |
| 6,590,634 B1 | 7/2003 | Nishi et al. |
| 6,642,994 B2 | 11/2003 | Mori et al. |
| 6,683,433 B2 | 1/2004 | Lee |
| 6,747,732 B1 | 6/2004 | Lee |
| 6,778,257 B2 | 8/2004 | Bleeker et al. |
| 6,798,491 B2 | 9/2004 | Nishi et al. |
| 6,841,965 B2 | 1/2005 | Lee |
| 6,878,916 B2 | 4/2005 | Schuster |
| 6,891,596 B2 | 5/2005 | Rostalski et al. |
| 6,891,683 B2 | 5/2005 | Schuster |
| 6,897,963 B1 | 5/2005 | Taniguchi et al. |
| 6,927,840 B2 | 8/2005 | Lee |
| 6,940,582 B1 | 9/2005 | Tanaka |
| 6,989,647 B1 | 1/2006 | Lee |
| 7,092,069 B2 | 8/2006 | Schuster |
| 7,154,676 B2 | 12/2006 | Schuster |
| 7,177,008 B2 | 2/2007 | Nishi et al. |
| 7,190,527 B2 | 3/2007 | Rostalski et al. |
| 7,203,008 B2 | 4/2007 | Schuster |
| 7,256,869 B2 | 8/2007 | Nishi |
| 7,312,847 B2 | 12/2007 | Rostalski et al. |
| 7,339,743 B2 | 3/2008 | Schuster |
| 7,365,513 B1 | 4/2008 | Lee |
| 7,379,158 B2 | 5/2008 | Mizutani et al. |
| 7,382,540 B2 | 6/2008 | Rostalski et al. |
| 7,436,487 B2 | 10/2008 | Mizutani et al. |
| 7,442,908 B2 | 10/2008 | Schuster |
| 7,460,207 B2 | 12/2008 | Mizutani et al. |
| 7,495,840 B2 | 2/2009 | Schuster |
| 7,505,115 B2 | 3/2009 | Magome et al. |
| 2001/0013580 A1 | 8/2001 | Buis et al. |
| 2001/0019250 A1 | 9/2001 | Lee |
| 2001/0030522 A1 | 10/2001 | Lee |
| 2002/0017889 A1 | 2/2002 | Lee |
| 2002/0041377 A1 | 4/2002 | Hagiwara et al. |
| 2002/0054231 A1 | 5/2002 | Masuyuki |
| 2002/0061469 A1 | 5/2002 | Tanaka |
| 2002/0163629 A1 | 11/2002 | Switkes et al. |
| 2003/0022396 A1 | 1/2003 | Ogawa |
| 2003/0030916 A1 | 2/2003 | Suenaga |
| 2003/0174408 A1 | 9/2003 | Rostalski et al. |
| 2004/0000627 A1 | 1/2004 | Schuster |
| 2004/0004757 A1 | 1/2004 | Schuster |
| 2004/0032575 A1 | 2/2004 | Nishi et al. |
| 2004/0075895 A1 | 4/2004 | Lin |
| 2004/0083966 A1 | 5/2004 | Takahashi et al. |
| 2004/0095085 A1 | 5/2004 | Lee |
| 2004/0109237 A1 | 6/2004 | Epple et al. |
| 2004/0114117 A1 | 6/2004 | Bleeker |
| 2004/0118184 A1 | 6/2004 | Violette |
| 2004/0119954 A1 | 6/2004 | Kawashima et al. |
| 2004/0120051 A1 | 6/2004 | Schuster |
| 2004/0125351 A1 | 7/2004 | Krautschik |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. |
| 2004/0211920 A1 | 10/2004 | Maria Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0233405 A1 | 11/2004 | Kato et al. |
| 2004/0233407 A1 | 11/2004 | Nishi et al. |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2004/0263809 A1 | 12/2004 | Nakano |
| 2005/0002004 A1 | 1/2005 | Kolesynchenko et al. |
| 2005/0002009 A1 | 1/2005 | Lee |
| 2005/0007569 A1 | 1/2005 | Streefkerk et al. |
| 2005/0007570 A1 | 1/2005 | Streefkerk et al. |
| 2005/0018155 A1 | 1/2005 | Cox et al. |
| 2005/0018156 A1 | 1/2005 | Mulkens et al. |
| 2005/0024609 A1 | 2/2005 | De Smit et al. |
| 2005/0030497 A1 | 2/2005 | Nakamura |
| 2005/0030498 A1 | 2/2005 | Mulkens |
| 2005/0030506 A1 | 2/2005 | Schuster |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0041225 A1 | 2/2005 | Sengers et al. |
| 2005/0042554 A1 | 2/2005 | Dierichs et al. |
| 2005/0046813 A1 | 3/2005 | Streefkerk et al. |
| 2005/0046934 A1 | 3/2005 | Ho et al. |
| 2005/0048220 A1* | 3/2005 | Mertens et al. ............... 427/553 |
| 2005/0048223 A1 | 3/2005 | Pawloski et al. |
| 2005/0068639 A1 | 3/2005 | Pierrat et al. |
| 2005/0073670 A1 | 4/2005 | Carroll |
| 2005/0084794 A1 | 4/2005 | Meagley et al. |
| 2005/0094116 A1 | 5/2005 | Flagello et al. |
| 2005/0094125 A1 | 5/2005 | Arai |
| 2005/0100745 A1 | 5/2005 | Lin et al. |
| 2005/0110973 A1 | 5/2005 | Streefkerk et al. |
| 2005/0111108 A1 | 5/2005 | Schuster |
| 2005/0117224 A1 | 6/2005 | Shafer et al. |
| 2005/0122497 A1 | 6/2005 | Lyons et al. |
| 2005/0132914 A1 | 6/2005 | Mulkens et al. |
| 2005/0134815 A1 | 6/2005 | Van Santen et al. |
| 2005/0134817 A1 | 6/2005 | Nakamura |
| 2005/0141098 A1 | 6/2005 | Schuster |
| 2005/0145265 A1 | 7/2005 | Ravkin et al. |
| 2005/0145803 A1 | 7/2005 | Hakey et al. |
| 2005/0146694 A1 | 7/2005 | Tokita |

| | | | | | | |
|---|---|---|---|---|---|---|
| 2005/0146695 A1 | 7/2005 | Kawakami | | JP | A-5-062877 | 3/1993 |
| 2005/0147920 A1 | 7/2005 | Lin et al. | | JP | A-05-062877 | 3/1993 |
| 2005/0153424 A1 | 7/2005 | Coon | | JP | U-05-090351 | 12/1993 |
| 2005/0158673 A1 | 7/2005 | Hakey et al. | | JP | A-06-053120 | 2/1994 |
| 2005/0164502 A1 | 7/2005 | Deng et al. | | JP | A-06-124873 | 5/1994 |
| 2005/0174549 A1 | 8/2005 | Duineveld et al. | | JP | A-06-168866 | 6/1994 |
| 2005/0175940 A1 | 8/2005 | Dierichs | | JP | A-06-188169 | 7/1994 |
| 2005/0178944 A1 | 8/2005 | Schuster | | JP | A-7-176468 | 7/1995 |
| 2005/0185269 A1 | 8/2005 | Epple et al. | | JP | A-7-220990 | 8/1995 |
| 2005/0190435 A1 | 9/2005 | Shafer et al. | | JP | A-07-220990 | 8/1995 |
| 2005/0190455 A1 | 9/2005 | Rostalski et al. | | JP | A-08-037149 | 2/1996 |
| 2005/0205108 A1 | 9/2005 | Chang et al. | | JP | A-8-166475 | 6/1996 |
| 2005/0213061 A1 | 9/2005 | Hakey et al. | | JP | A-08-316125 | 11/1996 |
| 2005/0213072 A1 | 9/2005 | Schenker et al. | | JP | A-8-316125 | 11/1996 |
| 2005/0217135 A1 | 10/2005 | O'Donnell et al. | | JP | A-8-330224 | 12/1996 |
| 2005/0217137 A1 | 10/2005 | Smith et al. | | JP | A-09-072943 | 3/1997 |
| 2005/0217703 A1 | 10/2005 | O'Donnell | | JP | A-10-163099 | 6/1998 |
| 2005/0219481 A1 | 10/2005 | Cox et al. | | JP | A-10-214783 | 8/1998 |
| 2005/0219482 A1 | 10/2005 | Baselmans et al. | | JP | A-10-303114 | 11/1998 |
| 2005/0219499 A1 | 10/2005 | Maria Zaal et al. | | JP | A-10-335235 | 12/1998 |
| 2005/0225737 A1 | 10/2005 | Weissenrieder et al. | | JP | A-10-335236 | 12/1998 |
| 2005/0231694 A1 | 10/2005 | Kolesynchenko et al. | | JP | A-10-340846 | 12/1998 |
| 2005/0231813 A1 | 10/2005 | Rostalski et al. | | JP | A-11-16816 | 1/1999 |
| 2005/0231814 A1 | 10/2005 | Rostalski et al. | | JP | A-11-135400 | 5/1999 |
| 2005/0237501 A1 | 10/2005 | Furukawa et al. | | JP | A-11-176727 | 7/1999 |
| 2005/0243292 A1 | 11/2005 | Baselmans et al. | | JP | A-11-204390 | 7/1999 |
| 2005/0245005 A1 | 11/2005 | Benson | | JP | A-11-264756 | 9/1999 |
| 2005/0253090 A1 | 11/2005 | Gau et al. | | JP | A-2000-058436 | 2/2000 |
| 2005/0259232 A1 | 11/2005 | Streefkerk et al. | | JP | A-2000-505958 | 5/2000 |
| 2005/0259233 A1 | 11/2005 | Streefkerk et al. | | JP | A-2001-203145 | 7/2001 |
| 2005/0264774 A1 | 12/2005 | Mizutani et al. | | JP | A-2001-345245 | 12/2001 |
| 2005/0264778 A1 | 12/2005 | Lof et al. | | JP | A-2002-14005 | 1/2002 |
| 2005/0270505 A1 | 12/2005 | Smith | | JP | A-2002-015978 | 1/2002 |
| 2006/0007419 A1 | 1/2006 | Streefkerk et al. | | JP | A-2002-039938 | 2/2002 |
| 2006/0023186 A1 | 2/2006 | Binnard | | JP | A-2002-15978 | 11/2002 |
| 2006/0126043 A1 | 6/2006 | Mizutani et al. | | JP | A-2004-193252 | 7/2004 |
| 2006/0126044 A1 | 6/2006 | Mizutani et al. | | JP | A-2004-207696 | 7/2004 |
| 2006/0132737 A1 | 6/2006 | Magome et al. | | JP | A-2005-184004 | 7/2005 |
| 2006/0146305 A1 | 7/2006 | Magome et al. | | JP | A-2005-259789 | 9/2005 |
| 2007/0019301 A1 | 1/2007 | Schuster | | JP | A-2005-268700 | 9/2005 |
| 2007/0109515 A1 | 5/2007 | Nishi | | JP | A-2005-268742 | 9/2005 |
| 2007/0159609 A1* | 7/2007 | Takaiwa et al. ............... 355/53 | | JP | A-2006-024939 | 1/2006 |
| 2007/0188880 A1 | 8/2007 | Schuster | | JP | A-2007-5830 | 1/2007 |
| 2007/0222967 A1 | 9/2007 | Poon et al. | | KR | 2003-0002514 | 1/2003 |
| 2007/0247722 A1 | 10/2007 | Rostalski et al. | | WO | WO/98/28665 | 7/1998 |
| 2008/0100810 A1* | 5/2008 | Shiraishi ..................... 355/30 | | WO | WO 99/49504 A1 | 9/1999 |
| 2008/0180053 A1 | 7/2008 | Lee | | WO | WO 01/35168 A1 | 5/2001 |
| | | | | WO | WO 01/67505 A2 | 9/2001 |
| FOREIGN PATENT DOCUMENTS | | | | WO | WO 02/091078 A1 | 11/2002 |
| EP | 0 422 814 A2 | 4/1991 | | WO | WO 03/077036 A1 | 9/2003 |
| EP | 0 605 103 A1 | 7/1994 | | WO | WO 03/077037 A1 | 9/2003 |
| EP | 0 834 773 A2 | 4/1998 | | WO | WO 2004/019128 A2 | 3/2004 |
| EP | 0 874 283 A2 | 10/1998 | | WO | WO 2004/053953 A1 | 6/2004 |
| EP | 1 018 669 A2 | 7/2000 | | WO | WO 2004/053958 A1 | 6/2004 |
| EP | 1 107 067 A2 | 6/2001 | | WO | WO 2004/055803 A1 | 7/2004 |
| EP | 1 420 298 A2 | 5/2004 | | WO | WO 2004/057589 A1 | 7/2004 |
| EP | 1 528 431 A2 | 5/2005 | | WO | WO 2004/057590 A1 | 7/2004 |
| EP | 1 571 695 A1 | 9/2005 | | WO | WO 2004/077154 A2 | 9/2004 |
| EP | 1 571 696 A1 | 9/2005 | | WO | WO 2004/081666 A1 | 9/2004 |
| EP | 1 571 699 A1 | 9/2005 | | WO | WO 2004/090577 A2 | 10/2004 |
| EP | 1 628 329 A1 | 2/2006 | | WO | WO 2004/090633 A2 | 10/2004 |
| EP | 1 653 501 A1 | 5/2006 | | WO | WO 2004/090634 A2 | 10/2004 |
| EP | 1 713 114 A1 | 10/2006 | | WO | WO 2004/092830 A2 | 10/2004 |
| JP | A-57-117238 | 7/1982 | | WO | WO 2004/092833 A2 | 10/2004 |
| JP | A-57-153433 | 9/1982 | | WO | WO 2004/093130 A2 | 10/2004 |
| JP | A-58-202448 | 11/1983 | | WO | WO 2004/093159 A2 | 10/2004 |
| JP | A-59-19912 | 2/1984 | | WO | WO 2004/093160 A2 | 10/2004 |
| JP | A-59-019912 | 2/1984 | | WO | WO 2004/095135 A2 | 11/2004 |
| JP | A-62-65326 | 3/1987 | | WO | WO 2004/105107 A1 | 12/2004 |
| JP | A-62-065326 | 3/1987 | | WO | WO 2005/001432 A2 | 1/2005 |
| JP | A-63-157419 | 6/1988 | | WO | WO 2005/001572 A2 | 1/2005 |
| JP | A-1-276043 | 11/1989 | | WO | WO 2005/003864 A2 | 1/2005 |
| JP | U-03-036940 | 4/1991 | | WO | WO 2005/006026 A2 | 1/2005 |
| JP | A-4-065603 | 3/1992 | | WO | WO 2005/008339 A2 | 1/2005 |
| JP | A-04-277612 | 10/1992 | | WO | WO 2005/010962 A2 | 2/2005 |
| JP | A-4-305915 | 10/1992 | | WO | WO 2005/013008 A2 | 2/2005 |
| JP | A-04-305915 | 10/1992 | | WO | WO 2005/015283 A1 | 2/2005 |
| JP | A-04-305917 | 10/1992 | | WO | WO 2005/017625 A2 | 2/2005 |
| JP | A-4-305917 | 10/1992 | | WO | WO 2005/019935 A2 | 3/2005 |

| | | |
|---|---|---|
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/076321 A1 | 8/2005 |
| WO | WO 2005/081030 A1 | 9/2005 |
| WO | WO 2005/081067 A1 | 9/2005 |
| WO | WO 2005/098504 A1 | 10/2005 |
| WO | WO 2005/098505 A1 | 10/2005 |
| WO | WO 2005/098506 A1 | 10/2005 |
| WO | WO 2005/106589 A1 | 11/2005 |
| WO | WO 2005/111689 A2 | 11/2005 |
| WO | WO 2005/111722 A2 | 11/2005 |
| WO | WO 2005/119368 A2 | 12/2005 |
| WO | WO 2005/119369 A1 | 12/2005 |

OTHER PUBLICATIONS

Optical Microlithography XV, Proceedings of SPIE, vol. 4691 (2002), "Resolution Enhancement of 157 nm Lithography by Liquid Immersion", M. Switkes et al., pp. 459-465.

J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.

Nikon Corporation, $3^{rd}$ 157 nm symposium, Sep. 4, 2002, "Nikon F2 Exposure Tool", Soichi Owa et al., 25 pages (slides 1-25).

Nikon Corporation, Immersion Lithography Workshop, Dec. 11, 2002, 24 pages (slides 1-24).

Optical Microlithography XVI, Proceedings of SPIE vol. 5040 (2003), "Immersion lithography; its potential performance and issues", Soichi Owa et al., pp. 724-733.

Nikon Corporation, Immersion Workshop, Jan. 27, 2004, "Update on 193 nm immersion exposure tool", S. Owa et al., 38 pages (slides 1-38).

Nikon Corporation, Litho Forum, Jan. 28, 2004, "Update on 193 nm immersion exposure tool", S. Owa et al., 51 pages (slides 1-51).

Nikon Corporation, NGL Workshop, Jul. 10, 2003, :Potential performance and feasibility of immersion lithography, Soichi Owa et al., 33 pages, slides 1-33.

Dec. 7, 2007 Office Action issued in Chinese Patent Application No. 200480021856.1 (with translation).

Jun. 2, 2010 Office Action in Chinese Application No. 200810173386.0, with translation.

Jun. 2, 2010 Office Action in Chinese Application No. 200810173388.X, with translation.

Oct. 30, 2008 Notice of Allowance in U.S. Appl. No. 11/366,743.

Dec. 15, 2009 Japanese Office Action in Application No. 2004-218934, with translation.

Mar. 16, 2010 Japanese Notice of Allowance in Application No. 2004-218934, with translation.

Dec. 15, 2009 Japanese Office Action in Application No. 2006-274331, with translation.

Mar. 16, 2010 Japanese Notice of Allowance in Application No. 2006-274331, with translation.

Nov. 2, 2004 International Search Report and Written Opinion in Application No. PCT/JP2004/010991, with translation.

Aug. 19, 2008 Communication Pursuant to Article 94(3) in European Application No. 04 748 150.2.

Sep. 5, 2008 Chinese Notice of Allowance in Application No. 200480021856.1, with translation.

Mar. 16, 2010 Chinese Office Action in Application No. 200810173387.5, with translation.

May 13, 2011 Office Action issued in Chinese Application No. 200810173387.5 (with English translation).

Dec. 28, 2010 Office Action in Taiwanese Application No. 093122481, with translation.

Feb. 28, 2011 Office Action in Korean Application No. 2006-7001706, with translation.

Mar. 17, 2011 Communication Pursuant to Article 94(3) in European Application No. 04748150.2.

Mar. 21, 2011 European Search Report in European Application No. 10184278.9.

Mar. 21, 2011 European Search Report in European Application No. 10184336.5.

Mar. 21, 2011 European Search Report in European Application No. 10184326.6.

Mar. 11, 2011 Office Action in Chinese Application No. 200810173396.4, with translation.

Mar. 14, 2011 Office Action in Chinese Application No. 200810173395.X, with translation.

Streefkerk et al., "Extending optical lithography with immersion." Optical Microlithography XVII, edited by Bruce W. Smith. Proceedings of SPIE vol. 5377. Published Feb. 2004.

Jan. 30, 2008 Search Report issued in EP Application No. 05758280.1.

Jul. 11, 2008 Office Action issued in EP Application No. 05758280.1.

Mar. 6, 2009 Notice of Allowance issued in EP Application No. 05758280.1.

Jun. 18, 2010 Notice of Opposition issued in EP Application No. 05758280.1.

Mar. 18, 2008 Office Action issued in SG Application No. 200700191-0.

Oct. 14, 2008 Notice of Allowance issued in SG Application No. 200700191-0.

Oct. 18, 2005 Written Opinion issued in Application No. PCT/JP2005/012776 (with English translation).

Oct. 18, 2005 International Search Report issued in Application No. PCT/JP2005/012776 (with English translation).

Jul. 26, 2011 Office Action issued in JP Application No. 2006-529038 (with English translation).

Oct. 28, 2011 Office Action issued in U.S. Appl. No. 11/632,070.

Feb. 8, 2012 Summons to Attend Oral Proceedings issued in EP Application No. 05758280.1.

Aug. 28, 2012 Decision of Revocation issued in EP Application No. 05758280.1.

Aug. 14, 2012 Office Action issued in JP Application No. 2010-030696 (with English translation).

Nov. 30, 2012 Office Action issued in TW Application No. 093122481 (with English translation).

Dec. 21, 2012 Office Action issued in JP Application No. 2010-255405 (with English translation).

Dec. 21, 2012 Office Action issued in JP Application No. 2011-209554 (with English translation).

Mar. 20, 2007 Office Action in child U.S. Appl. No. 11/366,743.

Dec. 17, 2007 Office Action in child U.S. Appl. No. 11/366,743.

May 22, 2008 Office Action in child U.S. Appl. No. 11/366,743.

Apr. 17, 2008 Supplemental European Search Report in corresponding Application No. EP 04 74 8150.

* cited by examiner

EXPOSURE APPARATUS, METHOD FOR PRODUCING DEVICE, AND METHOD FOR CONTROLLING EXPOSURE APPARATUS

CROSS-REFERENCE

This application is a Continuation Application of International Application No. PCT/JP2004/010991 which was filed on Jul. 26, 2004 claiming the conventional priority of Japanese patent Applications No. 2003-281183 filed on Jul. 28, 2003 and No. 2004-045104 filed on Feb. 20, 2004.

BACKGROUND OF THE INVENTION

1. Field of the Invention

The present invention relates to an exposure apparatus for exposing a substrate via a projection optical system and a liquid, a method for producing a device based on the use of the exposure apparatus, and a method for controlling the exposure apparatus.

2. Description of the Related Art

Semiconductor devices and liquid crystal display devices are produced by means of the so-called photolithography technique in which a pattern formed on a mask is transferred onto a photosensitive substrate. The exposure apparatus, which is used in the photolithography step, includes a mask stage for supporting the mask and a substrate stage for supporting the substrate. The pattern on the mask is transferred onto the substrate via a projection optical system while successively moving the mask stage and the substrate stage. In recent years, it is demanded to realize the higher resolution of the projection optical system in order to respond to the further advance of the higher integration of the device pattern. As the exposure wavelength to be used is shorter, the resolution of the projection optical system becomes higher. As the numerical aperture of the projection optical system is larger, the resolution of the projection optical system becomes higher. Therefore, the exposure wavelength, which is used for the exposure apparatus, is shortened year by year, and the numerical aperture of the projection optical system is increased as well. The exposure wavelength, which is dominantly used at present, is 248 nm of the KrF excimer laser. However, the exposure wavelength of 193 nm of the ArF excimer laser, which is shorter than the above, is also practically used in some situations. When the exposure is performed, the depth of focus (DOF) is also important in the same manner as the resolution. The resolution R and the depth of focus δ are represented by the following expressions respectively.

$$R = k_1 \cdot \lambda/NA \quad (1)$$

$$\delta = \pm k_2 \cdot \lambda/NA^2 \quad (2)$$

In the expressions, $\lambda$ represents the exposure wavelength, NA represents the numerical aperture of the projection optical system, and $k_1$ and $k_2$ represent the process coefficients. According to the expressions (1) and (2), the following fact is appreciated. That is, when the exposure wavelength $\lambda$ is shortened and the numerical aperture NA is increased in order to enhance the resolution R, then the depth of focus $\delta$ is narrowed.

If the depth of focus $\delta$ is too narrowed, it is difficult to match the substrate surface with respect to the image plane of the projection optical system. It is feared that the margin is insufficient during the exposure operation. Accordingly, the liquid immersion method has been suggested, which is disclosed, for example, in International Publication No. 99/49504 as a method for substantially shortening the exposure wavelength and widening the depth of focus. In this liquid immersion method, the space between the lower surface of the projection optical system and the substrate surface is filled with a liquid such as water or any organic solvent to form a liquid immersion area so that the resolution is improved and the depth of focus is magnified about n times by utilizing the fact that the wavelength of the exposure light beam in the liquid is 1/n as compared with that in the air (n represents the refractive index of the liquid, which is about 1.2 to 1.6 in ordinary cases).

In the case of the liquid immersion exposure apparatus, if the liquid for the exposure causes any leakage or any invasion, there is such a possibility that any inconvenience may be caused such that the apparatus and the members undergo, for example, the malfunction, the electric leakage, and the rust due to the liquid. Further, such a situation makes it impossible to perform the exposure process satisfactorily.

SUMMARY OF THE INVENTION

The present invention has been made taking the foregoing circumstances into consideration, an object of which is to provide an exposure apparatus, a method for producing a device, and a method for controlling the exposure apparatus, in which the exposure process can be performed satisfactorily even when the liquid immersion method is used. Another object of the present invention is to provide an exposure apparatus, a method for producing a device, and a method for controlling the exposure apparatus, in which the exposure process can be performed satisfactorily while suppressing the influence exerted by the leakage and the invasion of the liquid for the exposure.

In order to achieve the objects as described above, the present invention adopts the following constructions.

According to a first aspect of the present invention, there is provided an exposure apparatus which exposes a substrate by radiating an exposure light beam onto the substrate through a liquid, the exposure apparatus comprising:
a projection optical system which projects an image of a pattern onto the substrate; and
a liquid supply mechanism which supplies the liquid to a space between the projection optical system and the substrate, wherein:
the liquid supply mechanism stops the supply of the liquid when any abnormality or trouble is detected.

According to the present invention, the supply of the liquid by the liquid supply mechanism is stopped when the abnormality is detected. Accordingly, it is possible to avoid the leakage and the invasion of the liquid, and it is possible to avoid the expansion of the damage caused thereby. Therefore, it is possible to avoid the occurrence of the inconvenience such as the malfunction and the rust of the peripheral unit and the member which would be otherwise caused by the liquid, and the variation or fluctuation of the environment in which the substrate is placed. Further, it is possible to reduce the influence of the inconvenience as described above.

According to a second aspect of the present invention, there is provided an exposure apparatus which exposes a substrate by radiating an exposure light beam onto the substrate through a liquid, the exposure apparatus comprising:
a projection optical system which projects an image of a pattern through the liquid onto the substrate; and
an electric unit, wherein:
supply of electric power to the electric unit is stopped when any abnormality is detected to avoid any electric leakage due to adhesion of the liquid.

According to the present invention, the supply of the electric power to the electric unit is stopped to avoid the electric leakage which would be otherwise caused by the adhesion of the liquid. Therefore, it is possible to suppress the occurrence of the inconvenience including, for example, the influence on the peripheral unit caused by the electric leakage and the malfunction of the electric unit itself. Further, it is possible to reduce the damage caused thereby.

According to a third aspect of the present invention, there is provided an exposure apparatus which exposes a substrate by radiating an exposure light beam onto the substrate through a liquid, the exposure apparatus comprising:

- a projection optical system which projects an image of a pattern through the liquid onto the substrate; and
- a suction port which is communicated with a suction system, wherein:
- suction through the suction port is stopped when any abnormality is detected to avoid any inflow of the liquid.

The exposure apparatus includes, for example, various suction ports including, for example, the suction port for the air bearing (gas bearing) for supporting the stage unit in a non-contact manner with respect to the guide surface, and the suction port for the holder unit for attracting and holding the mask and the substrate. If the liquid flows into such a suction port, the malfunction is caused in the vacuum system (suction system) such as the vacuum pump communicated with the suction port. According to the present invention, the suction through the suction port is stopped when the abnormality is detected. Therefore, it is possible to avoid the inconvenience which would be otherwise caused such that the liquid flows into the vacuum system via the suction port. In the first to third aspects of the present invention, the phrase "abnormality is detected" means the fact that any situation, in which the exposure of the substrate through the liquid, i.e., the liquid immersion exposure is harmfully affected, is detected. This concept also includes the detection of not only the abnormality concerning the flow of the liquid but also the abnormality in relation to the operation of the stage which is movable while holding the substrate. Further, this concept also includes the detection of the abnormality in the related unit connected to the exposure apparatus. This concept also includes such a case that the abnormal signal (alarm) is detected, for example, for the related unit of the liquid-producing unit for producing the liquid to be supplied to the exposure apparatus.

According to a fourth aspect of the present invention, there is provided an exposure apparatus which exposes a substrate by radiating an exposure light beam onto the substrate through a liquid, the exposure apparatus comprising:

- a projection optical system which projects an image of a pattern through the liquid onto the substrate;
- a suction port which is communicated with a suction system;
- a separator which separates gas from the liquid sucked through the suction port; and
- a drying unit which dries the gas separated by the separator.

For example, when the liquid is sucked through the liquid suction port (recovery port) of the liquid recovery mechanism by using the vacuum system, if the recovered liquid component flows into the vacuum system (suction system), then the malfunction of the vacuum system or the like is caused. According to the present invention, the liquid and the gas, which are sucked through the suction port, are subjected to the gas/liquid separation by using the separator, and the gas separated by the separator is further dried by using the drying unit. Accordingly, it is possible to avoid the inconvenience which would be otherwise caused such that the liquid component (including the wet gas) flows into the vacuum system. Therefore, the operation for recovering the liquid by the liquid recovery mechanism can be maintained satisfactorily for a long period of time while avoiding the occurrence of the inconvenience such as the malfunction of the vacuum system (suction system) or the like. It is possible to avoid the leakage of the liquid which would be otherwise caused by the impossibility of the recovery operation to be performed by the liquid recovery mechanism.

According to a fifth aspect of the present invention, there is provided an exposure apparatus which exposes a substrate by radiating an exposure light beam onto the substrate through a liquid, the exposure apparatus comprising:

- a substrate stage which is movable while holding the substrate and which has a first area thereon;
- a projection optical system which projects an image of a pattern onto the substrate, which includes an end portion disposed on an image plane side, and which has a second area which is opposed to the first area to retain the liquid between at least a part of the first area and the second area; and
- a control unit which restricts movement of the substrate stage depending on positional relationship between the first area and the second area.

According to the present invention, when the exposure apparatus is constructed such that the liquid is retained between the first area and the second area, it is possible to avoid the inconvenience such as the leakage of the liquid, for example, by restricting the movement of the substrate stage so as to avoid the positional relationship in which the liquid cannot be retained between the first area and the second area.

According to a sixth aspect of the present invention, there is provided an exposure apparatus which exposes a substrate by radiating an exposure light beam onto the substrate through a liquid, the exposure apparatus comprising:

- a projection optical system which projects an image of a pattern through the liquid onto the substrate;
- a substrate stage which is movable while holding the substrate;
- a base member which movably supports the substrate stage;
- a first detector which is provided for the substrate stage and which detects the liquid;
- a second detector which is provided for the base member and which detects the liquid; and
- a control unit which controls operation of the exposure apparatus depending on detection results of the first detector and the second detector.

According to the present invention, the operation of the exposure apparatus is controlled depending on the detection results of the first detector and the second detector which are provided at the mutually different positions. Accordingly, it is possible to apply the appropriate treatment or countermeasure corresponding to the range of diffusion of the leaked liquid. Therefore, it is possible to shorten the period of time required for the restoring operation after the occurrence of the leakage of the liquid, and it is possible to avoid the decrease in the working rate of the exposure apparatus. For example, when the first detector, which is provided for the substrate stage, detects the presence of the liquid, the control unit judges that the range of diffusion of the leaked liquid is a relatively narrow range. The control unit applies the appropriate treatment corresponding to the range, for example, such that the supply of the liquid to be performed by the liquid supply mechanism is stopped. Accordingly, it is possible to suppress the period of time required for the restoring operation to be minimum. On the other hand, when the second detector, which is provided for the base member, detects the presence of the liquid, the control unit judges that the range of diffusion of the leaked liquid resides in a relatively wide area. The control unit stops the supply of the electric power to the electric unit represented, for example, by the driving unit for driving the substrate stage. Accordingly, even when the leaked liquid is diffused in the wide range, it is possible to avoid the occurrence of the damage such as the malfunction and the electric leakage of the electric unit.

According to a seventh aspect of the present invention, there is provided an exposure apparatus which exposes a substrate by radiating an exposure light beam onto the substrate through a liquid, the exposure apparatus comprising:
  a projection optical system which projects an image of a pattern onto the substrate;
  a liquid supply mechanism which supplies the liquid to a space between the projection optical system and the substrate;
  a substrate stage which is movable while holding the substrate; and
  a control unit which restricts a movement range of the substrate stage to be a first range during the supply of the liquid by the liquid supply mechanism and which restricts the movement range of the substrate stage to be a second range that is wider than the first range during stop of the supply of the liquid by the liquid supply mechanism.

According to the present invention, the movement range of the substrate stage is restricted, for example, to the first range capable of retaining the liquid on the substrate stage during the period in which the liquid supply mechanism supplies the liquid. Accordingly, it is possible to avoid the inconvenience such as the leakage of the liquid or the like. On the other hand, when the liquid supply mechanism stops the supply of the liquid, the movement range of the substrate stage is the second range which is wider than the first range. Accordingly, it is possible to smoothly perform the predetermined operation in relation to the substrate stage, including, for example, the movement of the substrate stage to the substrate exchange position.

According to an eighth aspect of the present invention, there is provided an exposure apparatus which exposes a substrate by radiating an exposure light beam onto the substrate through a liquid, the exposure apparatus comprising:
  a projection optical system which projects an image of a pattern onto the substrate;
  a liquid supply mechanism which supplies the liquid to an image plane side of the projection optical system;
  a stage which is movable on the image plane side of the projection optical system; and
  a control unit which controls a movement range of the stage, wherein:
  the control unit restricts the movement range of the stage, which is adopted when the liquid is retained between the projection optical system and the stage, to be narrower than that of the stage which is adopted when the liquid is not retained between the projection optical system and the stage.

According to the eighth aspect of the present invention, the liquid can be satisfactorily retained continuously between the projection optical system and the stage, for example, during the exposure of the substrate on the stage. When the liquid is not retained between the projection optical system and the stage, it is possible to smoothly perform another operation such as the substrate exchange.

According to a ninth aspect of the present invention, there is provided a method for producing a device, comprising using the exposure apparatus as defined in any one of the aspects described above. According to the present invention, the driving of the predetermined unit is stopped when the abnormality is detected. Therefore, it is possible to avoid the occurrence of the inconvenience such as the malfunction of the apparatus, and it is possible to produce the device in a satisfactory environment for the apparatus.

According to a tenth aspect of the present invention, there is provided a method for controlling an exposure apparatus which exposes a substrate by radiating an exposure light beam onto the substrate through a liquid, the exposure apparatus being provided with components including a projection optical system which projects an image of a pattern onto the substrate, a liquid supply mechanism which supplies the liquid to an image plane side of the projection optical system, a unit which uses electric energy as driving force, and a unit which serves to suck gas, and the exposure apparatus being connected to an external related unit, the method for controlling the exposure apparatus comprising:
  supplying the liquid to the image plane side of the projection optical system;
  receiving a signal notifying any abnormality from at least one of the components and the external related unit; and
  restricting operation of at least one of the liquid supply mechanism, the unit which uses the electric energy as the driving force, and the unit which serves to suck the gas, on the basis of the signal.

According to the method for controlling the exposure apparatus of the present invention, when the abnormality arises in the exposure apparatus or in the related unit disposed outside the exposure apparatus, and the abnormality is the signal notifying such abnormality that the exposure of the substrate or the like is affected thereby, then the operation is restricted for at least one of the liquid supply mechanism, the unit which uses the electric energy as the driving force, and the unit which has the function to suck the gas. Accordingly, it is possible to avoid, for example, the liquid leakage, the electric leakage caused thereby, and the suction of the liquid by the suction unit.

DESCRIPTION OF THE PREFERRED
EMBODIMENTS OF THE INVENTION

An explanation will be made below about embodiments of the exposure apparatus of the present invention. However, the present invention is not limited thereto.

Figure 1:
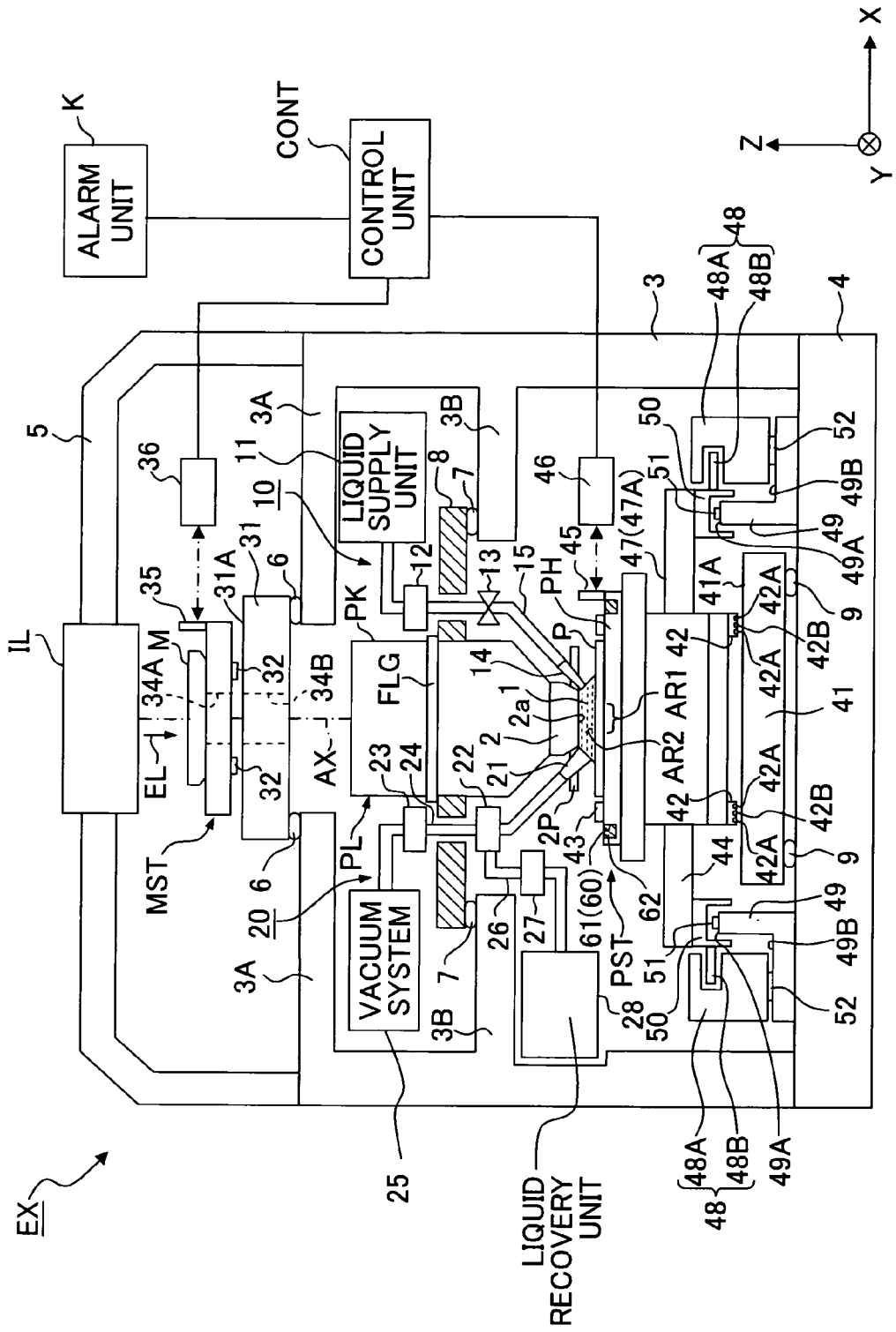
FIG. 1 shows a schematic arrangement illustrating a first embodiment of the exposure apparatus of the present invention.
Figure 23:
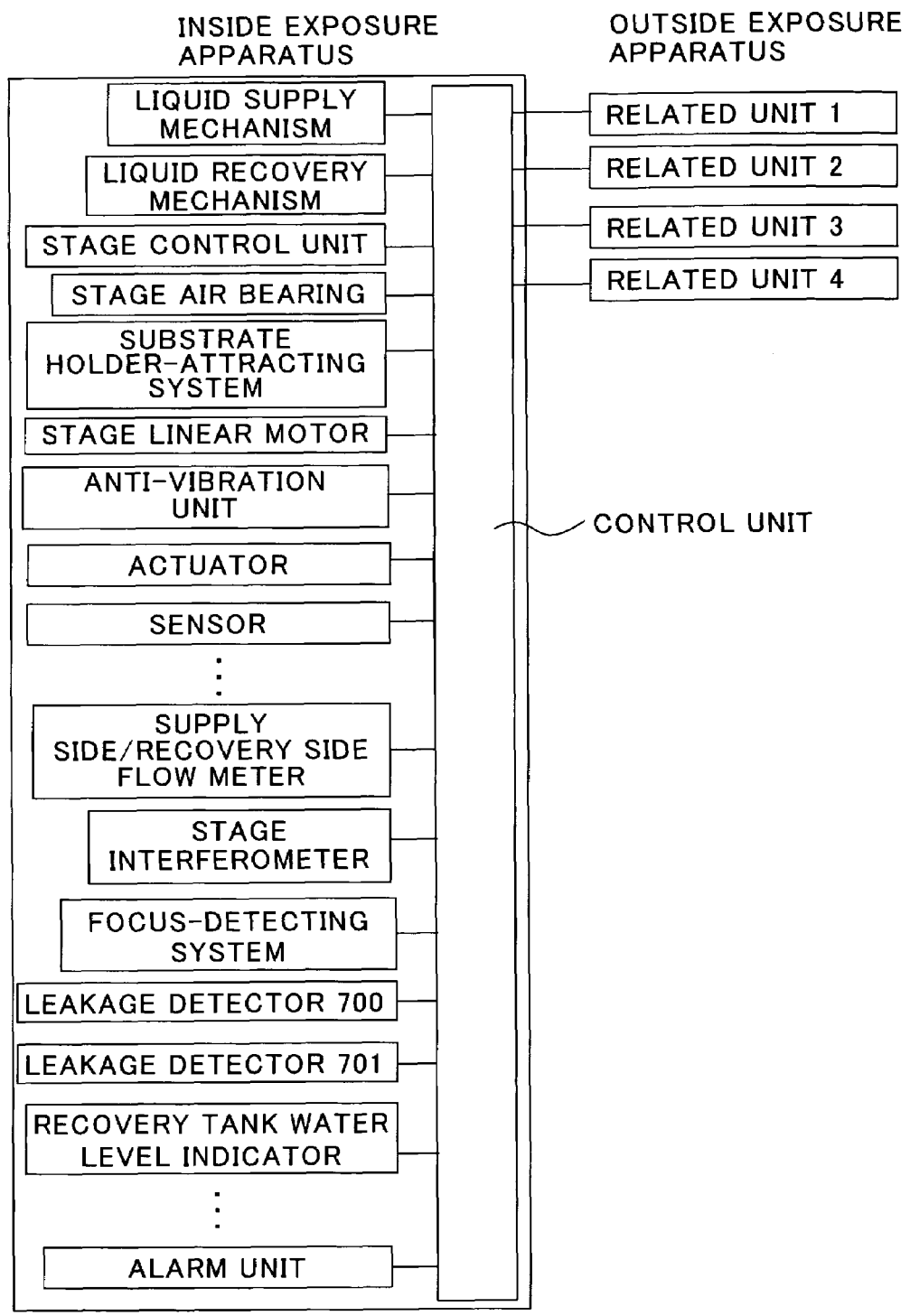
FIG. 23 shows a block diagram illustrating the relationship of connection between a control unit and various units disposed inside the exposure apparatus and related units disposed outside the exposure apparatus to be controlled by the control unit on the basis of the detection signals supplied from various detectors of the exposure apparatus according to the present invention.

FIG. 1 shows a schematic arrangement illustrating a first embodiment of the exposure apparatus of the present invention. With reference to FIG. 1, an exposure apparatus EX includes a mask stage MST which supports a mask M, a substrate stage PST which supports a substrate P, an illumination optical system IL which illuminates, with an exposure light beam EL, the mask M supported by the mask stage MST, a projection optical system PL which performs projection exposure for the substrate P supported by the substrate stage PST with an image of a pattern of the mask M illuminated with the exposure light beam EL, and a control unit CONT which collectively controls the overall operation of the exposure apparatus EX. An alarm unit K, which generates an alarm when any abnormality arises in relation to the exposure process, is connected to the control unit CONT. The exposure apparatus EX further includes a main column 3 which supports the mask stage MST and the projection optical system PL. The main column 3 is installed on a base plate 4 which is placed horizontally on the floor surface. The main column 3 is formed with an upper step 3A and a lower step 3B which protrude inwardly. As shown in FIG. 23, the control unit is connected to the various components for constructing the exposure apparatus and the related units disposed outside the exposure apparatus. The contents of the control of the control unit will be described later on.

The exposure apparatus EX of this embodiment is a liquid immersion exposure apparatus to which the liquid immersion method is applied in order that the exposure wavelength is substantially shortened to improve the resolution and the depth of focus is substantially widened. The exposure apparatus EX includes a liquid supply mechanism 10 which supplies the liquid 1 onto the substrate P, and a liquid recovery mechanism 20 which recovers the liquid 1 from the substrate P. The exposure apparatus EX forms a liquid immersion area AR2 on a part of the substrate P including a projection area AR1 of the projection optical system PL by the liquid 1 supplied from the liquid supply mechanism 10 at least during the period in which the pattern image of the mask M is transferred onto the substrate P. Specifically, the exposure apparatus EX is operated as follows. That is, the space between the surface of the substrate P and the optical element 2 disposed at the end portion (terminal end portion) of the projection optical system PL is filled with the liquid 1. The pattern image of the mask M is projected onto the substrate P to expose the substrate P therewith via the projection optical system PL and the liquid 1 disposed between the projection optical system PL and the substrate P.

The embodiment of the present invention will be explained as exemplified by a case using the scanning type exposure apparatus (so-called scanning stepper) as the exposure apparatus EX in which the substrate P is exposed with the pattern formed on the mask M while synchronously moving the mask M and the substrate P in mutually different directions (opposite directions) in the scanning directions. In the following explanation, the Z axis direction is the direction which is coincident with the optical axis AX of the projection optical system PL, the X axis direction is the synchronous movement direction (scanning direction) for the mask M and the substrate P in the plane perpendicular to the Z axis direction, and the Y axis direction is the direction (non-scanning direction) perpendicular to the Z axis direction and the Y axis direction. The directions of rotation (inclination) about the X axis, the Y axis, and the Z axis are designated as θX, θY, and θZ directions respectively. The term "substrate" referred to herein includes those obtained by coating a semiconductor wafer surface with a photoresist as a photosensitive material, and the term "mask" includes a reticle formed with a device pattern to be subjected to the reduction projection onto the substrate.

The illumination optical system IL is supported by a support column 5 which is fixed to the upper portion of the main column 3. The illumination optical system IL is used so that the mask M, which is supported on the mask stage MST, is illuminated with the exposure light beam EL. The illumination optical system IL includes, for example, an exposure light source, an optical integrator which uniformizes the illuminance of the light flux radiated from the exposure light source, a condenser lens which collects the exposure light beam EL emitted from the optical integrator, a relay lens system, and a variable field diaphragm which sets the illumination area on the mask M illuminated with the exposure light beam EL to be slit-shaped. The predetermined illumination area on the mask M is illuminated with the exposure light beam EL having a uniform illuminance distribution by the illumination optical system IL. Those usable as the exposure light beam EL radiated from the illumination optical system IL include, for example, emission lines (g-ray, h-ray, i-ray) in the ultraviolet region radiated, for example, from a mercury lamp, far ultraviolet light beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm). In this embodiment, the ArF excimer laser beam is used.

In this embodiment, pure water is used for the liquid 1. Those capable of being transmitted through pure water include the ArF excimer laser beam as well as the emission line (g-ray, h-ray, i-ray) in the ultraviolet region radiated, for example, from a mercury lamp and the far ultraviolet light beam (DUV light beam) such as the KrF excimer laser beam (wavelength: 248 nm).

The mask stage supports the mask M. The mask stage MST has an opening 34A which is provided at a central portion of the mask stage for allowing the pattern image of the mask M to pass therethrough. A mask surface plate 31 is supported on the upper step 3A of the main column 3 by the aid of an anti-vibration unit 6. An opening 34B, which allows the pattern image of the mask M to pass therethrough, is also formed at a central portion of the mask surface plate 31. A plurality of gas bearings (air bearings) 32, which are non-contact bearings, are provided on the lower surface of the mask stage MST. The mask stage MST is supported in a non-contact manner with respect to an upper surface (guide surface) 31A of the mask surface plate 31 by the aid of the air bearings 32. The mask stage MST is two-dimensionally movable in the plane perpendicular to the optical axis AX of the projection optical system PL, i.e., in the XY plane, and it is finely rotatable in the θZ direction by the aid of a mask stage-driving mechanism such as a linear motor. A movement mirror 35, which is movable with respect to the projection optical system PL together with the mask stage MST, is provided on the mask stage MST. A laser interferometer 36 is provided at a position opposed to the movement mirror 35. The position in the two-dimensional direction and the angle of rotation in the θZ direction (including the angles of rotation in the θX and θY directions in some cases) of the mask M on the mask stage MST are measured in real-time by the laser interferometer 36. The result of the measurement is outputted to the control unit CONT. The control unit CONT drives the mask stage-driving unit on the basis of the result of the measurement obtained by the laser interferometer 36 to thereby control the position of the mask M supported on the mask stage MST.

The projection optical system PL projects the pattern on the mask M onto the substrate P at a predetermined projection magnification β to perform the exposure. The projection optical system PL includes a plurality of optical elements including the optical element (lens) 2 provided at the end portion on the side of the substrate P. The optical elements are supported by a barrel PK. In this embodiment, the projection optical system PL is based on the reduction system having the projection magnification β which is, for example, ¼ or ⅕. The projection optical system PL may be any one of the 1× magnification system and the magnifying system. A flange portion FLG is provided on the outer circumference of the barrel PK. A barrel surface plate 8 is supported on the lower step 3B of the main column 3 by the aid of an anti-vibration unit 7. The flange portion FLG of the projection optical system PL is engaged with the barrel surface plate 8, and thus the projection optical system PL is supported by the barrel surface plate 8.

The optical element 2, which is disposed at the end portion of the projection optical system PL of this embodiment, is provided detachably (exchangeably) with respect to the barrel PK. The liquid 1 in the liquid immersion area AR2 makes contact with the optical element 2. The optical element 2 is formed of fluorite. Fluorite has a high affinity for water. Therefore, the liquid 1 is successfully allowed to make tight contact with substantially the entire surface of the liquid contact surface 2a of the optical element 2. That is, in this embodiment, the liquid (water) 1, which has the high affinity for the liquid contact surface 2a of the optical element 2, is supplied. Therefore, the highly tight contact is effected between the liquid 1 and the liquid contact surface 2a of the optical element 2. The optical path between the optical element 2 and the substrate P can be reliably filled with the liquid 1. The optical element 2 may be formed of quartz having a high affinity for water. A water-attracting (lyophilic or liquid-attracting) treatment may be applied to the liquid contact surface 2a of the optical element 2 to further enhance the affinity for the liquid 1.

A plate member 2P is provided to surround the optical element 2. The surface (i.e., the lower surface) of the plate member 2P opposed to the substrate P is a flat surface. The lower surface (liquid contact surface) 2a of the optical element 2 is also a flat surface. The lower surface of the plate member 2P is substantially flush with the lower surface of the optical element 2. Accordingly, the liquid immersion area AR2 can be satisfactorily formed in a wide range. A surface treatment (lyophilic or liquid-attracting treatment) can be applied to the lower surface of the plate member 2P in the same manner as the optical element 2.

The substrate stage (movable member) PST is provided movably while attracting and holding the substrate P by the aid of a substrate holder (substrate-retaining member) PH. A plurality of gas bearings (air bearings) 42, which are non-contact bearings, are provided on the lower surface of the substrate stage. A substrate surface plate 41 is supported on the base plate 4 by the aid of an anti-vibration unit 9. The air bearings 42 are provided with discharge ports 42B for allowing the gas (air) to blow against the upper surface (guide surface) 41A of the substrate surface plate 41, and suction ports 42A for sucking the gas from the space between the guide surface 41A and the lower surface (bearing surface) of the substrate stage PST. A constant gap is maintained between the lower surface of the substrate stage PST and the guide surface 41A in accordance with the balance between the repulsive force based on the blow of the gas from the discharge ports 42B and the attracting force exerted by the suction ports 42A. That is, the substrate stage PST is supported in a non-contact manner with respect to the upper surface (guide surface) 41A of the substrate surface plate (base member) 41 by the aid of the air bearings 42. The substrate stage PST is two-dimensionally movable in the plane perpendicular to the optical axis AX of the projection optical system PL, i.e., in the XY plane, and it is finely rotatable in the θZ direction by the aid of a substrate stage-driving mechanism such as a linear motor. Further, the substrate holder PH is provided movably in the Z axis direction, the θX direction, and the θY direction as well. The substrate stage-driving mechanism is controlled by the control unit CONT. That is, the substrate holder PH controls the focus position (Z position) and the angle of inclination of the substrate P so that the surface of the substrate P is adjusted to match the image plane of the projection optical system PL in the auto-focus manner and the auto-leveling manner. Further, the substrate holder PH positions the substrate P in the X axis direction and the Y axis direction.

A movement mirror 45, which is movable together with the substrate stage PST with respect to the projection optical system PL, is provided on the substrate stage PST (substrate holder PH). A laser interferometer 46 is provided at a position opposed to the movement mirror 45. The angle of rotation and the position in the two-dimensional direction of the substrate P on the substrate stage PST are measured in real-time by the laser interferometer 46. The result of the measurement is outputted to the control unit CONT. The control unit CONT drives the substrate stage-driving mechanism including the linear motor on the basis of the result of the measurement performed by the laser interferometer 46 to thereby position the substrate P supported on the substrate stage PST.

Figure 2:
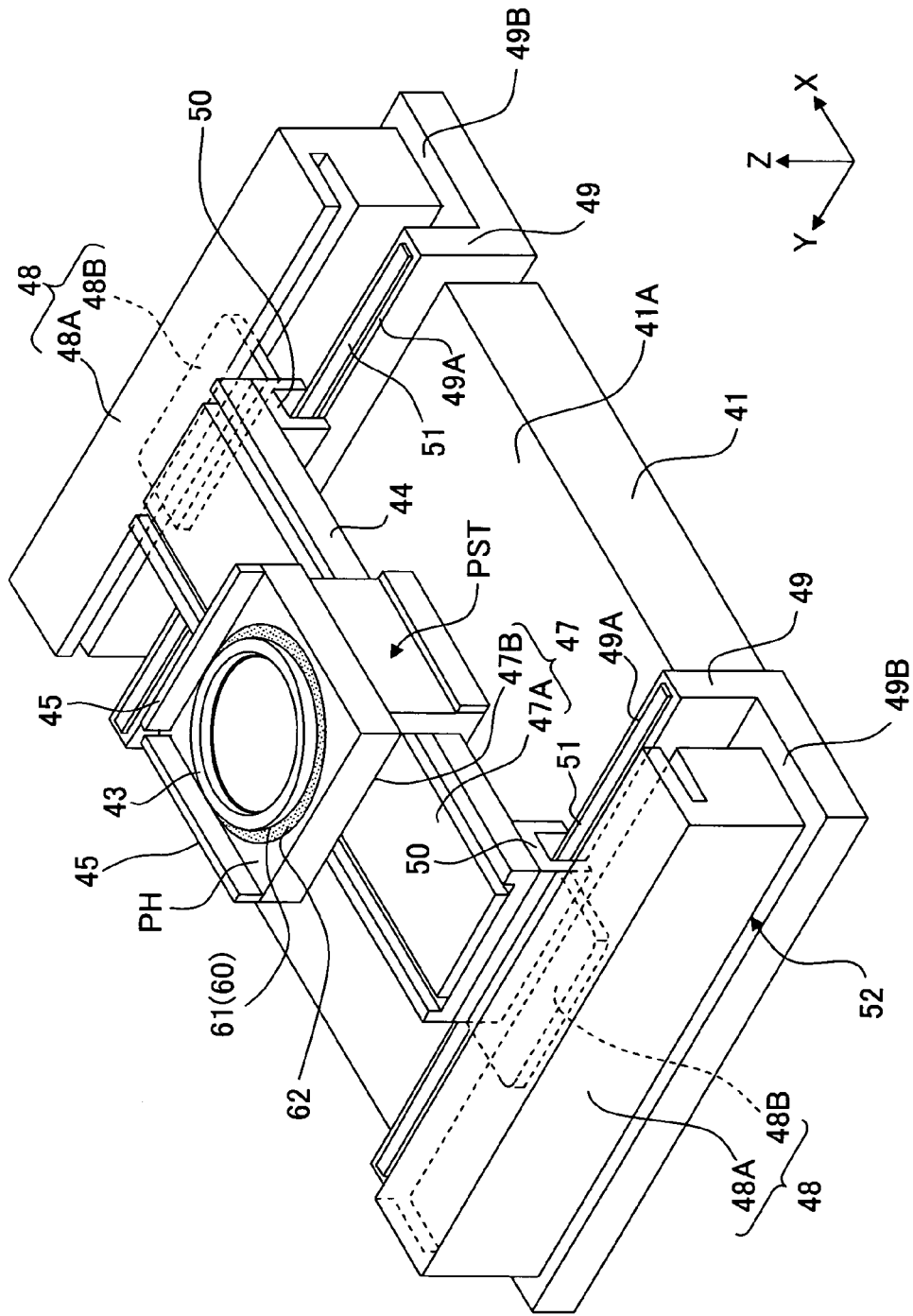
FIG. 2 shows a perspective view illustrating a substrate stage.

An auxiliary plate 43 is provided on the substrate stage PST (substrate holder PH) so that the substrate P is surrounded thereby (see FIG. 2). The auxiliary plate 43 has a flat surface which has approximately the same height as that of the surface of the substrate P held by the substrate holder PH. Even when the edge area of the substrate P is subjected to the exposure, the liquid 1 can be retained under the projection optical system PL by the aid of the auxiliary plate 43.

A recovery port (suction port) 61 of a recovery unit 60, which recovers the liquid 1 flown to the outside of the substrate P, is provided outside of the auxiliary plate 43 of the substrate holder PH. The recovery port 61 is an annular groove formed to surround the auxiliary plate 43. A liquid-absorbing member 62, which is formed of, for example, a sponge-like member or a porous member, is arranged therein.

FIG. 2 shows a schematic perspective view illustrating the substrate stage PST and the substrate stage-driving mechanism for driving the substrate stage PST. With reference to FIG. 2, the substrate stage PST is supported movably in the X axis direction by an X guide stage 44. The substrate stage PST is movable by a predetermined stroke in the X axis direction by an X linear motor 47 while being guided by the X guide stage 44. The X linear motor 47 includes a stator 47A which is provided to extend in the X axis direction for the X guide stage 44, and a mover 47B which is provided corresponding to the stator 47A and which is fixed to the substrate stage PST. The mover 47B is driven with respect to the stator 47A, and thus the substrate stage PST is moved in the X axis direction. In this arrangement, the substrate stage PST is supported in a non-contact manner by a magnetic guide including a magnet and an actuator to maintain a predetermined amount of gap in the Z axis direction with respect to the X guide stage 44. The substrate stage PST is moved in the X axis direction by the X linear motor 47 in a state of being supported in a non-contact manner by the X guide stage 44.

A pair of Y linear motors 48, which are capable of moving the X guide stage 44 in the Y axis direction together with the substrate stage PST, are provided at the both ends of the X guide stage 44 in the longitudinal direction. Each of the Y linear motors 48 includes a mover 48B which is provided at each of the both ends of the X guide stage 44 in the longitudinal direction, and a stator 48A which is provided corresponding to the mover 48B. The movers 48B are driven with respect to the stators 48A, and thus the X guide stage 44 is moved in the Y axis direction together with the substrate stage PST. The X guide stage 44 is capable of effecting the rotational movement in the θz direction as well by adjusting the driving of the Y linear motors 48 respectively. Therefore, the Y linear motors 48 make it possible for the substrate stage PST to move in the Y axis direction and in the θZ direction substantially integrally with the X guide stage 44.

A guide portion 49, which is formed to be L-shaped as viewed in a front view and which guides the movement of the X guide stage 44 in the Y axis direction, is provided on each of the both sides of the substrate surface plate 41 in the X axis direction. The guide portions 49 are supported on the base plate 4 (FIG. 1). In this embodiment, the stator 48A of the Y linear motor 48 is provided on a flat portion 49B of the guide portion 49. On the other hand, a recessed guide objective member 50 is provided on each of the both ends of the lower surface of the X guide stage 44 in the longitudinal direction. The guide portion 49 is provided to make engagement with the guide objective member 50, and the upper surface (guide surface) 49A of the guide portion 49 is opposed to the inner surface of the guide objective member 50. A gas bearing (air bearing) 51, which is a non-contact bearing, is provided for the guide surface 49A of the guide portion 49. The X guide stage 44 is supported in a non-contact manner with respect to the guide surfaces 49A.

A gas bearing (air bearing) 52, which is a non-contact bearing, is allowed to intervene between the stator 48A of the Y linear motor 48 and the flat portion 49B of the guide portion 49. The stator 48A is supported in a non-contact manner with respect to the flat portion 49B of the guide portion 49 by the air bearing 52. Therefore, the stators 48A are moved in the −Y direction (+Y direction) in accordance with the movement of the X guide stage 44 and the substrate stage PST in the +Y direction (−Y direction) according to the law of conservation of momentum. The movement of the stator 48A offsets the reaction force caused by the X guide stage 44 and the substrate stage PST, and it is possible to avoid the change of the position of the center of gravity. That is, the stator 48A has a function to serve as the so-called counter mass.

Figure 3:
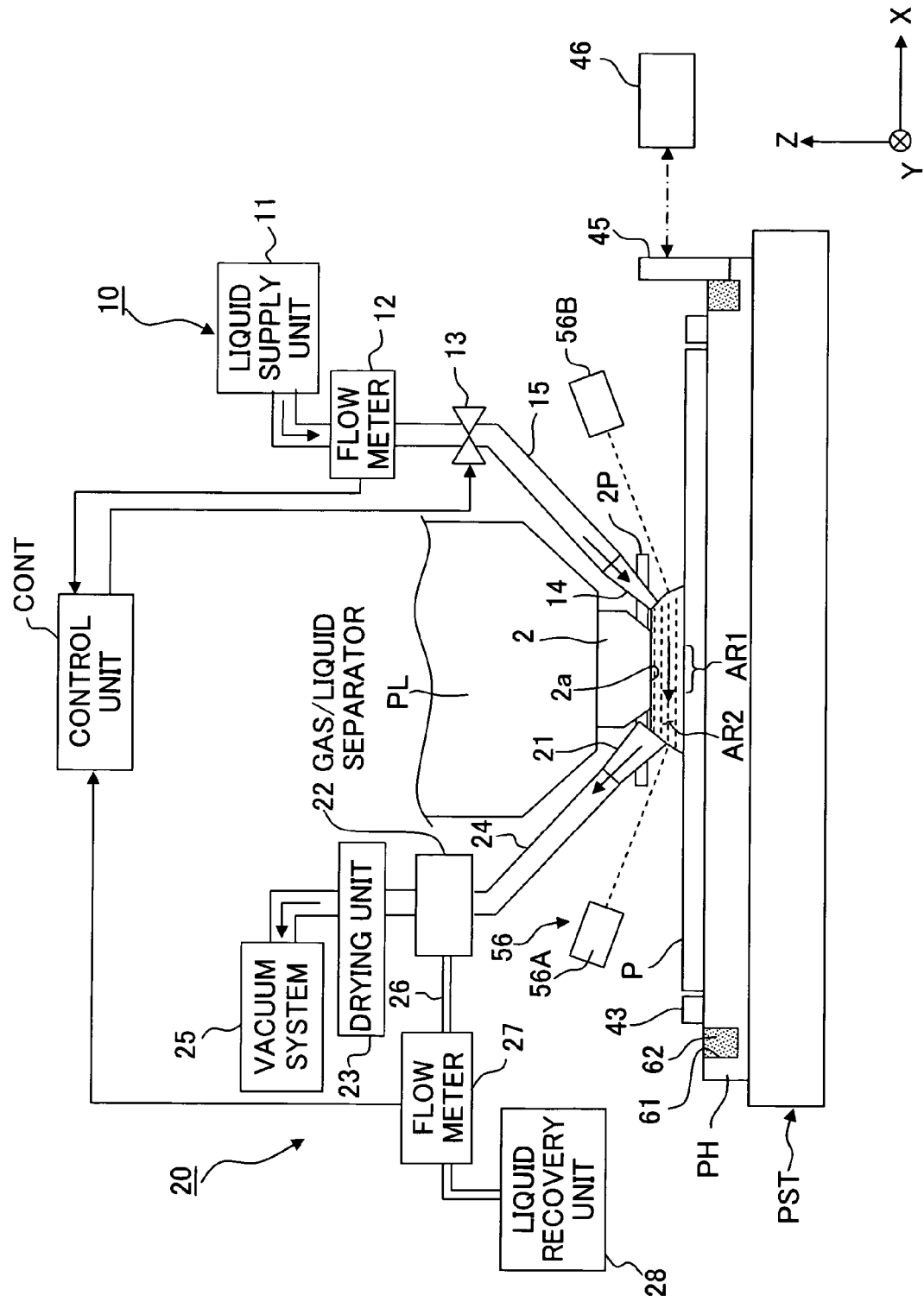
FIG. 3 shows a schematic arrangement illustrating those disposed in the vicinity of an end portion of a projection optical system, a liquid supply mechanism, and a liquid recovery mechanism.

FIG. 3 shows a magnified view illustrating those disposed in the vicinity of the liquid supply mechanism 10, the liquid recovery mechanism 20, and the end portion of the projection optical system PL. The liquid supply mechanism 10 supplies the liquid 1 to the space between the projection optical system PL and the substrate P. The liquid supply mechanism 10 includes a liquid supply unit 11 which is capable of feeding the liquid 1, and supply nozzles 14 which are connected to the liquid supply unit 11 via a supply tube 15 and which supply, onto the substrate P, the liquid 1 fed from the liquid supply unit 11. The supply nozzles 14 are arranged closely to the surface of the substrate P. The liquid supply unit 11 includes, for example, a tank for accommodating the liquid 1, and a pressurizing pump. The liquid supply unit 11 supplies the liquid 1 onto the substrate P through the supply tube 15 and the supply nozzles 14. The operation of the liquid supply unit 11 to supply the liquid is controlled by the control unit CONT. The control unit CONT is capable of controlling the liquid supply amount per unit time to be supplied onto the substrate P by the liquid supply unit 11.

A flow meter 12, which measures the amount of the liquid 1 to be supplied from the liquid supply unit 11 onto the substrate P (liquid supply amount per unit time), is provided at an intermediate position of the supply tube 15. The flow meter 12 always monitors the amount of the liquid 1 to be supplied onto the substrate P, and the result of the measurement is outputted to the control unit CONT. A valve 13, which opens/closes the flow passage of the supply tube 15, is provided at an intermediate position of the supply tube 15 between the flow meter 12 and the supply nozzle 14. The opening/closing operation of the valve 13 is controlled by the control unit CONT. In this embodiment, the valve 13 is based on the so-called normally off system in which the flow passage of the supply tube 15 is mechanically closed, for example, when the driving source (power source) of the exposure apparatus EX (control unit CONT) is stopped, for example, due to any power failure.

The liquid recovery mechanism 20 recovers, from the surface of the substrate P, the liquid 1 supplied by the liquid supply mechanism 10. The liquid recovery mechanism 20 includes recovery nozzles (suction ports) 21 which are arranged closely to the surface of the substrate P, and a vacuum system (suction system) 25 which is connected to the recovery nozzles 21 via a recovery tube 24. The vacuum system 25 is constructed to include a vacuum pump. The operation of the vacuum system 25 is controlled by the control unit CONT. When the vacuum system 25 is driven, the liquid 1 on the substrate P is recovered together with the surrounding gas (air) through the recovery nozzles 21. A vacuum system of a factory in which the exposure apparatus EX is arranged may be used as the vacuum system 25 instead of providing the vacuum pump for the exposure apparatus.

A gas/liquid separator 22, which separates the gas from the liquid 1 sucked through the recovery nozzles 21, is provided at an intermediate position of the recovery tube 24. In this embodiment, as described above, the surrounding gas is also recovered through the recovery nozzles 21 together with the liquid 1 on the substrate P. The gas/liquid separator 22 separates the gas from the liquid 1 recovered through the recovery nozzles 21. Those adoptable as the gas/liquid separator 22 include, for example, an apparatus based on the gravity separation system in which the recovered liquid and the gas are allowed to flow through a tube member having a plurality of holes and the liquid is allowed to fall through the holes in accordance with the gravity action to thereby separate the liquid and the gas from each other, and an apparatus based on the centrifugation system in which the recovered liquid and the gas are separated from each other by using the centrifugal force. The vacuum system 25 sucks the gas separated by the gas/liquid separator 22.

A drying unit 23, which dries the gas separated by the gas/liquid separator 22, is provided between the vacuum system 25 and the gas/liquid separator 22. If the gas separated by the gas/liquid separator 22 is mixed with any liquid component, then the gas is dried by the drying unit 23, and the dried gas is allowed to flow into the vacuum system 25. Accordingly, it is possible to avoid the occurrence of the inconvenience such as the malfunction of the vacuum system 25 which would be otherwise caused by the inflow of the liquid component. Those adoptable as the drying unit 23 include, for example, an apparatus such as a cooling unit which is based on such a system that the gas (gas mixed with the liquid component) supplied from the gas/liquid separator 22 is cooled to a temperature of not more than the dew point of the liquid to remove the liquid component thereby, and an apparatus such as a heater which is based on such a system that the gas is heated to a temperature of not less than the boiling point of the liquid to remove the liquid component thereby.

On the other hand, the liquid 1 separated by the gas/liquid separator 22 is recovered by a liquid recovery unit 28 through a second recovery tube 26. The liquid recovery unit 28 includes, for example, a tank for accommodating the recovered liquid 1. For example, the liquid 1, which is recovered by the liquid recovery unit 28, is discarded. Alternatively, the liquid 1 is cleaned and returned, for example, to the liquid supply unit 11 to reuse the liquid 1. A flow meter 27, which measures the amount of the recovered liquid 1 (liquid recovery amount per unit time), is provided at an intermediate position of the second recovery tube 26 between the gas/liquid separator 22 and the liquid recovery unit 28. The flow meter 27 always monitors the amount of the liquid 1 recovered from the surface of the substrate P, and the result of the measurement is outputted to the control unit CONT. As described above, the surrounding gas is also recovered through the recovery nozzles 21 together with the liquid 1 on the substrate P. However, the liquid 1 and the gas are separated from each other by the gas/liquid separator 22, and only the liquid component is fed to the flow meter 27. Accordingly, the flow meter 27 can correctly measure the amount of the liquid 1 recovered from the surface of the substrate P.

The exposure apparatus EX is provided with a focus-detecting system 56 which detects the position of the surface of the substrate P supported by the substrate stage PST. The focus-detecting system 56 includes a light-emitting section 56A which projects a detecting light flux from an obliquely upward position via the liquid 1 onto the substrate P, and a light-receiving section 56B which receives the reflected light beam of the detecting light flux reflected by the substrate P. The light-receiving result of the focus-detecting system 56 (light-receiving section 56B) is outputted to the control unit CONT. The control unit CONT can detect the position information about the surface of the substrate P in the Z axis direction on the basis of the result of the detection performed by the focus-detecting system 56. When a plurality of detecting light fluxes are radiated from the light-emitting section 56A, it is possible to detect the information about the inclination of the substrate P in the θX direction and the θY direction.

The focus-detecting system 56 is not limited to the detection of the substrate P, and can also detect the information about the surface position of any object arranged on the image plane side of the projection optical system PL. The focus-detecting system 56 detects the information about the surface position of the object (substrate P) via the liquid 1. However, it is also possible to adopt a focus-detecting system which detects the information about the surface position of the object (substrate P) not via the liquid 1 at the outside of the liquid immersion area AR2.

As shown in the partial sectional view in FIG. 1, the liquid supply mechanism 10 and the liquid recovery mechanism 20 are supported separately by the barrel surface plate 8. Accordingly, the vibration, which is generated in the liquid supply mechanism 10 and the liquid recovery mechanism 20, is not transmitted to the projection optical system PL via the barrel surface plate 8.

Figure 4:
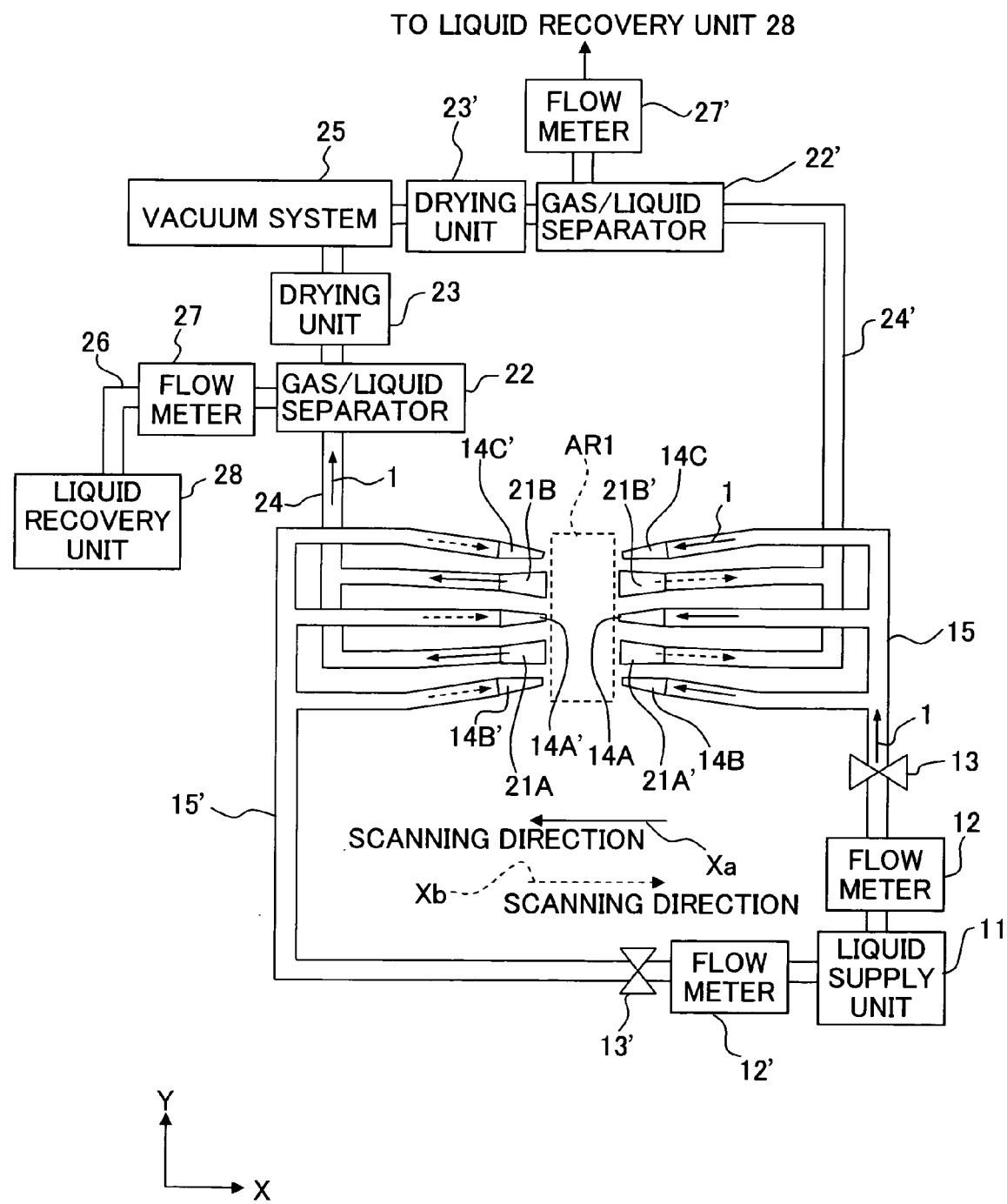
FIG. 4 shows a plan view illustrating a positional relationship among a projection area of the projection optical system, the liquid supply mechanism, and the liquid recovery mechanism.

FIG. 4 shows a plan view illustrating the positional relationship among the liquid supply mechanism 10, the liquid recovery mechanism 20, and the projection area AR1 of the projection optical system PL. The projection area AR1 of the projection optical system PL has a rectangular shape (slit-shaped form) which is long in the Y axis direction. Three supply nozzles 14A to 14C are arranged on the +X side, and two recovery nozzles 21A, 21B are arranged on the −X side to interpose the projection area AR1 in the X axis direction. The supply nozzles 14A to 14C are connected to the liquid supply unit 11 via the supply tube 15, and the recovery nozzles 21A, 21B are connected to the vacuum system 25 via the recovery tube 24. The supply nozzles 14A' to 14C' and the recovery nozzles 21A', 21B' are arranged at the positions obtained by rotating those of the supply nozzles 14A to 14C and the recovery nozzles 21A, 21B by approximately 180°. The supply nozzles 14A to 14C and the recovery nozzles 21A', 21B' are arranged alternately in the Y axis direction. The supply nozzles 14A' to 14C' and the recovery nozzles 21A, 21B are arranged alternately in the Y axis direction. The supply nozzles 14A' to 14C' are connected to the liquid supply unit 11 via the supply tube 15'. The recovery nozzles 21A', 21B' are connected to the vacuum system 25 via the recovery tube 24'. A flow meter 12' and a valve 13' are provided at intermediate positions of the supply tube 15' in the same manner as in the supply tube 15. A gas/liquid separator 22' and a drying unit 23' are provided at intermediate positions of the recovery tube 24' in the same manner as in the recovery tube 24.

Figure 5:
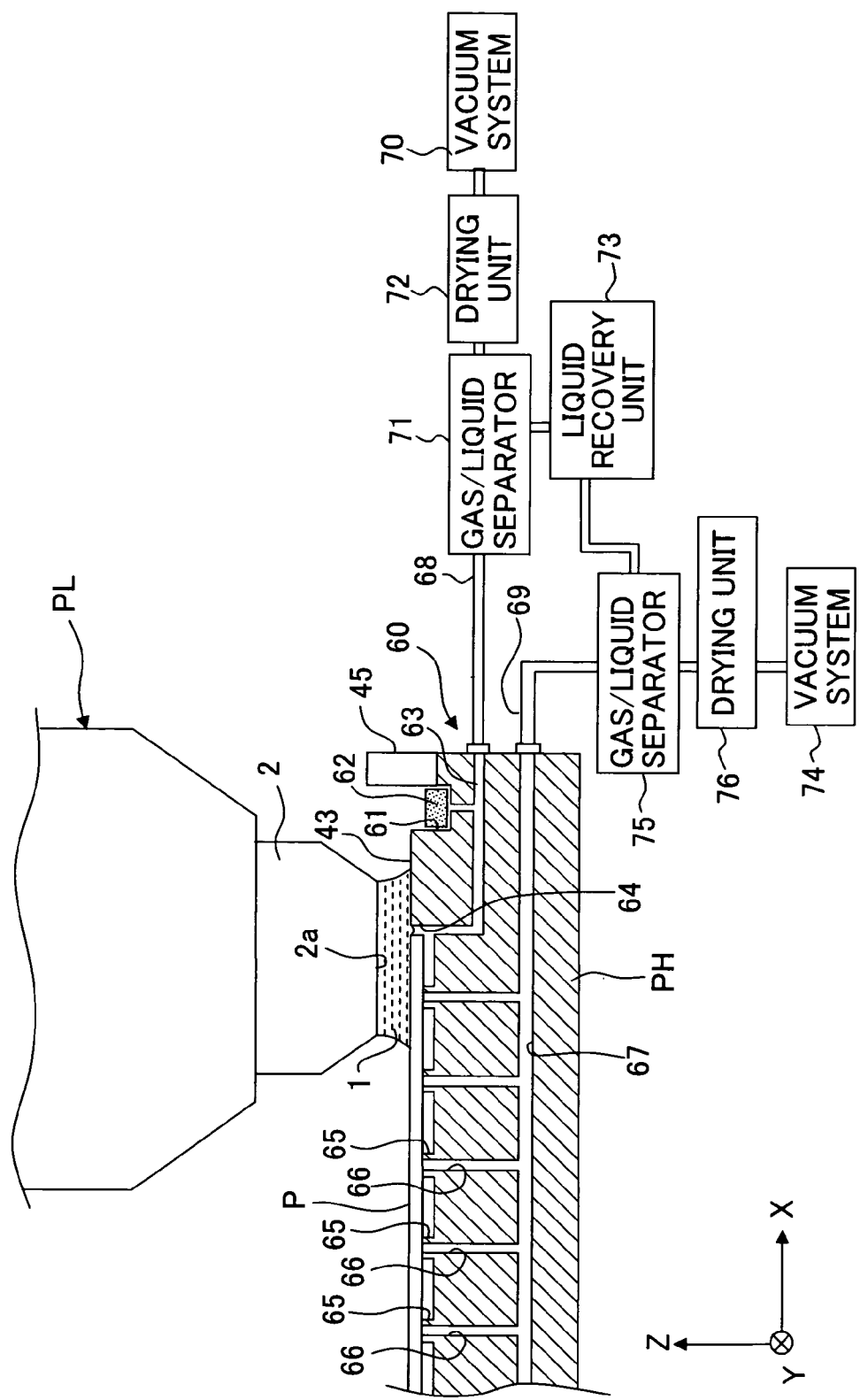
FIG. 5 schematically shows a sectional view illustrating a recovery unit provided for a substrate stage.

FIG. 5 shows the recovery unit 60 which recovers the liquid 1 outflowed to the outside of the substrate P. With reference to FIG. 5, the recovery unit 60 includes a recovery port (suction port) 61 which is formed annularly to surround the auxiliary plate 43 on the substrate holder PH, and a liquid-absorbing member 62 which is arranged in the recovery port 61 and which is formed of a sponge-like member or a porous member such as porous ceramics. The liquid-absorbing member 62 is an annular member having a predetermined width, which is capable of retaining a predetermined amount of the liquid 1. A flow passage 63, which is communicated with the recovery port 61, is formed in the substrate holder PH. The liquid-absorbing member 62, which is arranged in the recovery port 61, has the bottom which makes contact with the flow passage 63. A plurality of liquid recovery holes 64 are provided between the auxiliary plate 43 and the substrate P on the substrate holder PH. The liquid recovery holes 64 are also connected to the flow passage 63.

A plurality of projections 65, which are formed to support the back surface of the substrate P, are provided on the upper surface of the substrate holder (substrate-holding member) PH for holding the substrate P. Each of the projections 65 is provided with an attracting hole 66 for attracting and holding the substrate P. The respective attracting holes 66 are connected to a tube passage 67 formed in the substrate holder PH.

The flow passage 63, which is connected to the recovery port 61 and the liquid recovery holes 64 respectively, is connected to one end of a tube passage 68 which is provided outside the substrate holder PH. On the other hand, the other end of the tube passage 68 is connected to a vacuum system 70 including a vacuum pump. A gas/liquid separator 71 is provided at an intermediate position of the tube passage 68. A drying unit 72 is provided between the gas/liquid separator 71 and the vacuum system 70. When the vacuum system 70 is driven, the liquid 1 is recovered from the recovery port 61 together with the surrounding gas. Even when the liquid 1 makes invasion from any gap between the substrate P and the auxiliary plate 43, and the liquid 1 enters the back surface side of the substrate P, then the liquid is recovered from the recovery port 64 together with the surrounding gas. The gas, which is separated by the gas/liquid separator 71 and which is dried by the drying unit 72, flows into the vacuum system 70. On the other hand, the liquid 1, which is separated by the gas/liquid separator 71, flows into a liquid recovery unit 73 which is provided with a tank or the like capable of accommodating the liquid 1. For example, the liquid 1, which is recovered by the liquid recovery unit 73, is discarded. Alternatively, the liquid 1 is cleaned and returned, for example, to the liquid supply unit 11 to reuse the liquid 1.

The tube passage 67, which is connected to the attracting holes 66, is connected to one end of a tube passage 69 provided outside the substrate holder PH. On the other hand, the other end of the tube passage 69 is connected to a vacuum system 74 including a vacuum pump provided outside the substrate holder PH. When the vacuum system 74 is driven, the substrate P, which is supported by the projections 65, is attracted and held by the attracting holes 66. A gas/liquid separator 75 is provided at an intermediate position of the tube passage 69. A drying unit 76 is provided between the gas/liquid separator 75 and the vacuum system 74. The liquid recovery unit 73, which is provided with a tank or the like capable of accommodating the liquid 1, is connected to the gas/liquid separator 75.

Next, an explanation will be made with reference to, for example, FIG. 1 about the procedure for exposing the substrate P with the pattern of the mask M by using the exposure apparatus EX as described above.

The mask M is loaded on the mask stage MST, and the substrate P is loaded on the substrate stage PST. After that, the control unit CONT drives the liquid supply unit 11 of the liquid supply mechanism 10 to supply, onto the substrate P, a predetermined amount of liquid 1 per unit time by the aid of the supply tube 15 and the supply nozzles 14. The control unit CONT drives the vacuum system 25 of the liquid recovery mechanism 20 in accordance with the supply of the liquid 1 by the liquid supply mechanism 10 to recover a predetermined amount of the liquid 1 per unit time by the aid of the recovery nozzles 21 and the recovery tube 24. Accordingly, the liquid immersion area AR2 of the liquid 1 is formed between the substrate P and the optical element 2 disposed at the end portion of the projection optical system PL. In this procedure, the control unit CONT controls the liquid supply mechanism 10 and the liquid recovery mechanism 20 respectively so that the liquid supply amount onto the substrate P is substantially the same as the liquid recovery amount from the substrate P in order to form the liquid immersion area AR2. The control unit CONT illuminates the mask M with the exposure light beam EL by using the illumination optical system IL to project the image of the pattern of the mask M onto the substrate P via the projection optical system PL and the liquid 1.

During the scanning exposure, a part of the pattern image of the mask M is projected onto the projection area AR1. The mask M is moved at the velocity V in the −X direction (or in the +X direction) with respect to the projection optical system PL, in synchronization with which the substrate P is moved at the velocity $\beta \cdot V$ ($\beta$ represents the projection magnification) in the +X direction (or in the −X direction) by the aid of the substrate stage PST. After the exposure is completed for one shot area, the next shot area is moved to the scanning start position in accordance with the stepping movement of the substrate P. The exposure process is successively performed thereafter for the respective shot areas in the step-and-scan manner. This embodiment is set such that the liquid 1 is allowed to flow in parallel to the direction of movement of the substrate P in the same direction as the direction of movement of the substrate P. In other words, when the scanning exposure is performed while moving the substrate P in the scanning direction (−X direction) indicated by the arrow Xa (see FIG. 4), the supply tube 15, the supply nozzles 14A to 14C, the recovery tube 24, and the recovery nozzles 21A, 21B are used to supply and recover the liquid 1 by the liquid supply mechanism 10 and the liquid recovery mechanism 20. That is, when the substrate P is moved in the −X direction, then the liquid 1 is supplied to the space between the projection optical system PL and the substrate P by the supply nozzles 14 (14A to 14C), and the liquid 1 is recovered from the surface of the substrate P together with the surrounding gas by the recovery nozzles 21 (21A, 21B). The liquid 1 is allowed to flow in the −X direction so that the space between the substrate P and the optical element 2 disposed at the end portion of the projection optical system PL is filled with the liquid. On the other hand, when the substrate P is moved in the scanning direction (+X direction) indicated by the arrow Xb (see FIG. 4) to perform the scanning exposure, the supply tube 15', the supply nozzles 14A' to 14C', the recovery tube 24', and the recovery nozzles 21A', 21B' are used to supply and recover the liquid 1 by the liquid supply mechanism 10 and the liquid recovery mechanism 20. That is, when the substrate P is moved in the +X direction, then the liquid 1 is supplied to the space between the projection optical system PL and the substrate P by the supply nozzles 14' (14A' to 14C'), and the liquid 1 is recovered from the surface of the substrate P together with the surrounding gas by the recovery nozzles 21' (21A', 21B'). The liquid 1 is allowed to flow in the +X direction so that the space between the substrate P and the optical element 2 disposed at the end portion of the projection optical system PL is filled with the liquid. In this procedure, for example, the liquid 1, which is supplied through the supply nozzles 14, flows so that the liquid 1 is attracted and introduced into the space between the optical element 2 and the substrate P in accordance with the movement of the substrate P in the −X direction. Therefore, even when the supply energy of the liquid supply mechanism 10 (liquid supply unit 11) is small, the liquid 1 can be easily supplied to the space between the optical element 2 and the substrate P. When the direction of the flow of the liquid 1 is switched depending on the scanning direction, the space between the optical element 2 and the substrate P can be filled with the liquid 1 even when the substrate P is subjected to the scanning in any one of the +X direction and the −X direction. The exposure can be performed with the high resolution and the wide depth of focus.

During the exposure process, the measurement result obtained by the flow meter 12 provided for the liquid supply mechanism 10 and the measurement result obtained by the flow meter 27 provided for the liquid recovery mechanism 20 are always outputted to the control unit CONT. The control unit CONT compares the measurement result obtained by the flow meter 12, i.e., the amount of the liluid supplied onto the substrate P by the liquid supply mechanism 10 with the measurement result obtained by the flow meter 27, i.e., the amount of the liquid recovered from the substrate P by the liquid recovery mechanism 20 to control the valve 13 of the liquid supply mechanism 10 on the basis of the result of the comparison. Specifically, the control unit CONT determines the difference between the liquid supply amount onto the substrate P (measurement result obtained by the flow meter 12) and the liquid recovery amount from the substrate P (measurement result obtained by the flow meter 27) to control the valve 13 on the basis of the judgment whether or not the determined difference exceeds a preset allowable value (threshold value). In this procedure, as described above, the control unit CONT controls the liquid supply mechanism 10 and the liquid recovery mechanism 20 respectively so that the liquid supply amount onto the substrate P is approximately the same as the liquid recovery amount from the substrate P. Therefore, the determined difference is approximately zero in such a situation that the liquid supply operation by the liquid supply mechanism 10 and the liquid recovery operation by the liquid recovery mechanism 20 are normally performed respectively.

The control unit CONT judges that any abnormality arises in the recovery operation of the liquid recovery mechanism 20 and the liquid 1 cannot be recovered sufficiently when the determined difference is not less than the allowable value, i.e., when the liquid recovery amount is extremely smaller than the liquid supply amount. In this situation, for example, the control unit CONT judges that the abnormality such as the malfunction of the vacuum system 25 of the liquid recovery mechanism 20 arises. In order to avoid the leakage of the liquid 1 which would be otherwise caused by the failure of the normal recovery of the liquid 1 by the liquid recovery mechanism 20, the flow passage of the supply tube 15 is blocked by operating the valve 13 of the liquid supply mechanism 10 to stop the supply of the liquid 1 onto the substrate P by the liquid supply mechanism 10. As described above, the control unit CONT compares the liquid amount supplied from the liquid supply mechanism 10 onto the substrate P with the liquid amount recovered by the liquid recovery mechanism 20 to detect the abnormality of the recovery operation performed by the liquid recovery mechanism 20 on the basis of the result of the comparison. When the liquid 1 is excessively supplied, and the abnormality is detected, then the control unit CONT stops the supply of the liquid 1 onto the substrate P. Accordingly, it is possible to avoid the leakage of the liquid 1 to the outside of the substrate P and the substrate stage PST (substrate holder PH), the invasion of the liquid 1 into any undesirable place, and the expansion of the damage caused by the leakage and the invasion as described above.

When the abnormality of the recovery operation of the liquid recovery mechanism 20 is detected, the control unit CONT stops the supply of the electric power to the electric unit for constructing the exposure apparatus EX in order to avoid the electric leakage which would be otherwise caused by the adhesion of the leaked or invaded liquid 1. In this arrangement, the electric unit includes, for example, the linear motors 47, 48 for driving the substrate stage PST. The linear motors 47, 48 are disposed at the positions at which the liquid 1 leaked to the outside of the substrate P causes adhesion and invasion with ease. Therefore, the control unit CONT can avoid the electric leakage which would be otherwise caused by the adhesion of the liquid 1, by stopping the electric power supply to the linear motors 47, 48. The electric unit is not limited to the linear motors 47, 48, which also includes, for example, the sensor (photomultiplier) which is provided on the substrate stage PST to receive the exposure light beam EL radiated for the substrate stage PST. Further, the electric unit includes, for example, various actuators such as piezoelectric elements provided to adjust the position of the substrate holder PH in the Z axis direction and in the direction of inclination. When the abnormality is detected, it is also possible to stop the electric power supply to all of the electric units for constructing the exposure apparatus EX, and it is also possible to stop the electric power supply to a part of the electric units. In this procedure, when the abnormality of the recovery operation of the liquid recovery mechanism 20 is detected, for example, the control unit CONT stops the electric power supply to the electric unit (high voltage unit) including, for example, the linear motor, the piezoelectric element used at a voltage in the vicinity of 0 to 150 V, and the photomultiplier (sensor) used at a voltage in the vicinity of 300 to 900 V. Accordingly, it is possible to avoid the occurrence of the electric leakage, and it is possible to suppress the influence on the peripheral unit which would be otherwise caused by the electric leakage.

When the control unit CONT detects the abnormality of the recovery operation of the liquid recovery mechanism 20, for example, the control unit CONT stops the driving of the air bearing 24 disposed to move the substrate stage PST in the non-contact manner with respect to the guide surface 41A of the substrate surface plate 41. The air bearing 42 includes the discharge port 42B which discharges the gas (air) against the upper surface (guide surface) 41A of the substrate surface plate 41, and the suction port 42A which sucks the gas from the gap between the guide surface 41A and the lower surface (bearing surface) of the substrate stage PST. The balance, which is brought about between the repulsive force produced by the discharge of the gas from the discharge port 42B and the attracting force produced by the suction port 42A, maintains the constant gap between the guide surface 41A and the lower surface of the substrate stage PST. When the control unit CONT detects the abnormality of the recovery operation of the liquid recovery mechanism 20, the control unit CONT stops the operation of the air bearing 42, especially the suction through the suction port 42A in order to avoid the inflow (invasion) of the leaked liquid 1 into the suction port 42A of the air bearing 42. Accordingly, it is possible to avoid the inflow of the liquid 1 into the vacuum system connected to the suction port 42A, and it is possible to avoid the occurrence of the inconvenience such as the malfunction of the vacuum system which would be otherwise caused by the inflow of the liquid 1.

When the projections 65 and the suction holes 66 for holding the substrate P are provided for any separate member, and the separate member is attracted and held by the substrate holder PH, then the control unit CONT may stop the suction through suction holes (sucking holes) for attracting and holding the separate member.

When the control unit CONT detects the abnormality of the recovery operation of the liquid recovery mechanism 20, the control unit CONT drives the alarm unit K. The alarm unit K generates the alarm by using, for example, an alarm lamp, an alarm sound, and/or a display. Accordingly, for example, the operator can be informed of the occurrence of the leakage and/or the invasion of the liquid 1 in the exposure apparatus EX.

When the abnormality of the recovery operation of the liquid recovery mechanism 20 is detected, the control unit CONT increases the liquid recovery amount of the recovery unit 60. Specifically, the driving amount (driving force) of the vacuum system 70 of the recovery unit 60 is increased. The driving of the recovery unit 60 (vacuum system 70) brings about the vibration source. Therefore, it is desirable to decrease or stop the driving force of the recovery unit 60 during the exposure process. However, when the abnormality of the recovery operation of the liquid recovery mechanism 20 is detected, and any possibility arises for the leakage of the liquid 1, then the control unit CONT increases the driving force of the recovery unit 60. Accordingly, it is possible to avoid the leakage of the liquid 1 to the outside of the substrate stage PST (substrate holder PH) (to at least the outside of the recovery port 61), and it is possible to avoid the expansion of the leakage.

The liquid 1, which is supplied from the liquid supply mechanism 10, is recovered by the liquid recovery mechanism 20 during the period in which the shot area disposed in the vicinity of the center of the substrate P is exposed. On the other hand, as shown in FIG. 5, when the liquid immersion area AR2 is located in the vicinity of the edge area of the substrate P by executing the exposure process for the edge area of the substrate P, the liquid 1 can be continuously retained between the projection optical system PL and the substrate P by using the auxiliary plate 43. However, a part of the liquid 1 outflows to the outside of the auxiliary plate 43 in some cases. The outflow liquid 1 is recovered from the recovery port 61 arranged with the liquid-absorbing member 62. In this situation, the control unit CONT starts the operation of the recovery unit 60 together with the start of the driving of the liquid supply mechanism 10 and the liquid recovery mechanism 20 described above. Therefore, the liquid 1, which is recovered from the recovery port 61, is recovered through the flow passage 63 and the tube passage 68 together with the surrounding air in accordance with the suction by the vacuum system 70. The liquid 1, which flows into the gap between the substrate P and the auxiliary plate 43, is recovered through the flow passage 63 and the tube passage 68 together with the surrounding air by the aid of the liquid recovery hole 64. In this process, the gas/liquid separator 71 separates the gas from the liquid 1 recovered from the recovery port 61. The gas, which is separated by the gas/liquid separator 71, is dried by the drying unit 72, and then the gas flows into the vacuum system 70. Accordingly, it is possible to avoid the inconvenience which would be otherwise caused such that the liquid component flows into the vacuum system 70. On the other hand, the liquid, which is separated by the gas/liquid separator 71, is recovered by the liquid recovery unit 73.

In this process, a part of the liquid 1 supplied from the liquid supply mechanism 10 is recovered by the recovery unit 60. Therefore, the liquid amount to be recovered by the liquid recovery mechanism 20 is decreased. As a result, the liquid recovery amount measured by the flow meter 27 of the liquid recovery mechanism 20 is decreased. In such a situation, although the liquid 1 causes no leakage, there is such a possibility that the control unit CONT makes any erroneous judgment that the abnormality arises in the recovery operation of the liquid recovery mechanism 20, on the basis of the result of the comparison of the respective measurement results of the flow meter 12 of the liquid supply mechanism 10 and the flow meter 27 of the liquid recovery mechanism 20. Accordingly, a flow meter, which measures the amount of the recovered liquid, is previously provided between the gas/liquid separator 71 and the liquid recovery unit 73 of the recovery unit 60. The control unit CONT determines the overall liquid recovery amount on the basis of the measurement result of the flow meter of the recovery unit 60 and the measurement result of the flow meter 27 of the liquid recovery mechanism 20 to compare the determined overall liquid recovery amount with the measurement result of the flow meter 12 of the liquid supply mechanism 10. The control unit CONT judges whether or not any abnormality arises in the liquid recovery operation of the liquid recovery mechanism 20 on the basis of the result of the comparison. It is possible to execute the countermeasure including, for example, the stop of the liquid supply operation by the liquid supply mechanism 10, the stop of the electric power supply, and the stop of the suction operation from the suction port, on the basis of the result of the judgment.

When the measured value of the flow meter provided for the recovery unit 60 is excessively larger than a preset allowable value, the control unit CONT judges that a large amount of the liquid 1 outflows to the outside of the substrate P. In order to avoid, for example, the leakage of the liquid 1 to the outside of the substrate stage PST (substrate holder PH), the liquid supply mechanism 10 may be stopped.

Such a situation is also assumed that the liquid 1, which outflows to the outside of the substrate P, causes invasion through the gap between the substrate P and the auxiliary plate 43 to arrive at the back surface side of the substrate P. There is also such a possibility that the liquid 1, which enters the back surface side of the substrate P, flows into the suction hole (suction port) 66 for attracting and retaining the substrate P. In such a situation, the suction hole 66, which is provided for the substrate holder PH to attract and hold the substrate P, is connected to the vacuum system 74 via the tube passage 67 and the tube passage 69. Those provided at the intermediate positions are the gas/liquid separator 75 and the drying unit 76 for drying the gas separated by the gas/liquid separator 75. Therefore, even if the liquid 1 flows into the suction hole 66, the liquid 1, which inflows from the suction hole 66, is recovered by the liquid recovery unit 73. It is possible to avoid the inconvenience of the inflow of the liquid component into the vacuum system 74.

When the liquid 1 causes invasion from the suction hole 66, there is such a possibility that any inconvenience arises, for example, in the holding operation for the substrate P. Therefore, the following procedure is also available. That is, a flow meter is arranged between the liquid recovery unit 73 and the tube passage 69 or the gas/liquid separator 75. When the invasion of the liquid from the suction hole 66 is detected by the flow meter, it is judged that any abnormal situation occurs. It is possible to execute at least one of the stop of the liquid supply operation, the stop of the electric power supply, and the stop of the suction through the suction port as described above.

In the case of an arrangement in which the gas/liquid separator 75 is not provided for the tube passage 69 connected to the suction hole 66, the following procedure is also available. That is, when any abnormality is detected for the recovery operation of the liquid recovery mechanism 20 or the recovery unit 60, the driving of the vacuum system 74 (suction system) is stopped to stop the suction through the suction hole 66 in order to avoid the inflow of the liquid 1 into the suction hole (suction port) 66.

As explained above, when the abnormality of the leakage or the invasion of the liquid 1 is detected, the supply of the liquid 1 onto the substrate P by the liquid supply mechanism 10 is stopped. Therefore, for example, it is possible to avoid the leakage of the liquid 1, and/or it is possible to avoid the expansion of the leakage and the flooding or inundation. Even when the abnormality of the leakage or the invasion of the liquid 1 arises, the electric power supply is stopped for the electric unit represented by the linear motors 47, 48 for constructing the exposure apparatus EX. Accordingly, it is possible to avoid the occurrence of the electric leakage and the expansion of the damage caused by the electric leakage. The suction is stopped for the suction port 42A of the air bearing 42 and the respective suction ports communicated with the vacuum system, including, for example, the suction holes 66 provided for the substrate holder PH for the purpose of attracting and holding the substrate P. Accordingly, it is possible to avoid the occurrence of the inconvenience which would be otherwise caused such that the liquid 1 flows into the vacuum system connected to the suction port. Further, when the surrounding gas is recovered together with the liquid from the suction ports including, for example, the recovery nozzles 21, the recovery port 61, and the suction holes 66, then the liquid and the gas, which are sucked through the suction port, is subjected to the gas/liquid separation by using the gas/liquid separator, and the gas, which is separated by the gas/liquid separator, is further dried by the drying unit. Accordingly, it is possible to avoid the inconvenience of the inflow of the liquid component (for example, the wet gas) into the vacuum system, and it is possible to suppress the influence exerted on the vacuum system by the liquid. The present embodiment is constructed such that the liquid is recovered from the suction port together with the surrounding gas. However, when the recovered liquid is separated from the gas by the gas/liquid separator, it is possible to correctly measure the amount of the recovered liquid.

The foregoing embodiment has been explained as exemplified by the malfunction (abnormal operation) of the vacuum system 25 as the abnormality of the recovery operation of the liquid recovery mechanism 20. However, for example, the abnormal operation of the gas/liquid separator 22 may be also exemplified in addition to the malfunction of the vacuum system 25. In other words, the occurrence of the following situation is assumed. Even when the liquid 1 is successfully recovered from the surface of the substrate P by the aid of the recovery nozzles 21, then the gas/liquid separator 22 cannot separate the gas from the liquid recovered by the recovery nozzles 21, and the liquid amount measured by the flow meter 27 is smaller than the predetermined value. In such a situation, the liquid component, which is allowed to flow into the vacuum system 25, is increased, and hence the malfunction of the vacuum system 25 or the like is consequently caused. Therefore, the control unit CONT stops the liquid supply operation of the liquid supply mechanism 10, and the control unit CONT stops the liquid recovery operation of the liquid recovery mechanism 20 (vacuum system 25). Accordingly, it is possible to avoid the leakage of the liquid 1, and it is possible to avoid the malfunction of the vacuum system 25 as well.

In the present embodiment, the control unit CONT controls the liquid supply mechanism 10 and the liquid recovery mechanism 20 respectively so that the liquid supply amount to the substrate P is approximately the same as the liquid recovery amount from the substrate P. Therefore, the determined difference is approximately zero, and the allowable value is previously set to the small value corresponding thereto in the situation in which the liquid supply operation by the liquid supply mechanism 10 and the liquid recovery operation by the liquid recovery mechanism 20 are normally performed respectively. On the other hand, for example, when the liquid 1 to be used is highly volatile, it is assumed that the liquid 1 is volatilized on the substrate P, and the measured value obtained by the flow meter 27 of the liquid recovery mechanism 20 is smaller than the measured value obtained by the flow meter 12 of the liquid supply mechanism 10 even in the situation in which the liquid supply operation by the liquid supply mechanism 10 and the liquid recovery operation by the liquid recovery mechanism 20 are normally performed respectively. Therefore, the control unit CONT may previously set the allowable value to control the valve 13 on the basis of the result of the comparison between the preset allowable value and the determined difference, depending on the liquid 1 (volatility) to be used or the environment in which the substrate P is placed.

In the embodiment described above, the liquid supply amount of the liquid supply mechanism 10 is compared with the liquid recovery amount by the liquid recovery mechanism 20 to detect the abnormality of the flow state of the liquid 1. However, the abnormality may be detected for each of them on the basis of only the supply amount of the liquid supply mechanism 10 or only the recovery amount by the liquid recovery mechanism 20. Further, there is no limitation to the flow rate of the liquid. When any mechanical or electric abnormality is detected for the liquid supply mechanism 10 and/or the liquid recovery mechanism 20, the control unit CONT can also execute the countermeasure including, for example, the stop of the liquid supply operation by the liquid supply mechanism 10, the stop of the electric power supply, and the stop of the suction operation from through the suction port.

In the present embodiment, the surrounding gas is also recovered together with the liquid 1 from the recovery nozzles 21. Therefore, in order to measure the liquid recovery amount more correctly, the recovered liquid and the gas are separated from each other by using the gas/liquid separator 22 to measure the amount of the separated liquid by using the flow meter 27. Therefore, there is such a possibility that the liquid amount measured by the flow meter 27 may be varied depending on the ability of the gas/liquid separator 22 to separate the gas and the liquid from each other as well. Accordingly, the control unit CONT can also set the allowable value depending on the gas/liquid separator 22 to be used (gas/liquid separating ability).

The present embodiment has been exemplified such that all of the stop of the liquid supply operation by the liquid supply mechanism 10, the stop of the electric power to the electric unit, and the stop of the suction operation from the suction port are executed when the abnormality of the liquid recovery operation of the liquid recovery mechanism 20 is detected. However, it is also allowable to adopt such an arrangement that at least one of them is executed.

The present embodiment is constructed such that the surrounding gas is also recovered together with the liquid 1 from the recovery nozzles 21 of the liquid recovery mechanism 20. Therefore, the gas/liquid separator 22 is used to effect the separation into the liquid and the gas in order that the amount of the recovered liquid can be accurately measured with the flow meter 27. However, when the liquid recovery mechanism 20 is constructed such that only the liquid 1 is recovered from the recovery nozzles 21, the amount of the recovered liquid can be determined by measuring the amount of the recovered liquid, without separating the liquid and the gas from each other by using the gas/liquid separator 22.

The embodiment of the present invention is constructed such that the liquid supply operation by the liquid supply mechanism 10 is stopped, the electric power supply to the electric unit is stopped, and/or the suction operation from the suction port is stopped when the abnormality is detected for the recovery operation of the liquid recovery mechanism 20. However, when any abnormality is detected for the positional relationship between the projection optical system PL and the substrate stage (movable member) PST which is movable while holding the substrate P, it is also allowable to execute at least one of the stop of the liquid supply operation, the stop of the electric power supply, and the stop of the suction operation through the suction port. The abnormal positional relationship between the substrate stage PST and the projection optical system PL herein is such a state that the liquid 1 cannot be retained under the projection optical system PL, which includes the abnormality of the positional relationship in at least the Z axis direction and the XY direction. In other words, even when the supply operation of the liquid supply mechanism 10 and the recovery operation of the liquid recovery mechanism 20 are normal, if any abnormality arises, for example, in the operation of the substrate stage PST, and the substrate stage PST is arranged at any position deviated in the XY direction with respect to the desired position for the projection optical system PL, then a situation arises such that the liquid immersion area AR2 of the liquid 1 cannot be formed satisfactorily between the projection optical system PL and the substrate P held by the substrate stage PST (state in which the liquid 1 cannot be retained under the projection optical system PL). In this case, any situation occurs such that the liquid 1 leaks to the outside of the substrate P and to the outside of the substrate holder PH and/or the movement mirror 45 of the substrate stage PST (substrate holder PH) is inundated with the liquid 1 or water. In such a situation, the liquid recovery mechanism 20 cannot recover the predetermined amount of the liquid 1. Therefore, the flow meter 27 of the liquid recovery mechanism 20 outputs, to the control unit CONT, the measurement result of a value smaller than the predetermined value. The control unit CONT can detect the abnormality of the position of the substrate stage PST at which the leakage of the liquid 1 or the like occurs, on the basis of the measurement result of the flow meter 27. When the abnormality is detected, the control unit CONT executes, for example, the stop of the liquid supply operation, the stop of the electric power supply, and the stop of the suction operation from the suction port.

The liquid immersion area AR2 is formed such that the distance between the projection optical system PL and the substrate P is set to be a predetermined distance (about 0.1 mm to 1 mm) of such an extent that the liquid immersion area AR2 can be formed by the surface tension of the liquid 1. However, for example, when any inconvenience arises in the position control in relation to the Z axis direction for the substrate stage PST, then the distance between the projection optical system PL and the substrate P on the substrate stage PST is increased, and a situation arises such that the liquid 1 cannot be retained under the projection optical system PL.

Also in this case, for example, the liquid 1 is leaked to the outside of the substrate P and the outside of the substrate stage PST (substrate holder PH), and the liquid recovery mechanism 20 cannot recover the predetermined amount of the liquid 1. Therefore, the flow meter 27 of the liquid recovery mechanism 20 outputs, to the control unit CONT, the measurement result of a value which is smaller than the predetermined value. The control unit CONT can detect the abnormality of the position of the substrate stage PST at which the leakage of the liquid 1 occurs, on the basis of the measurement result obtained by the flow meter 27. When the abnormality is detected, the control unit CONT executes, for example, the stop of the liquid supply operation, the stop of the electric power supply, and the stop of the suction operation from the suction port.

In order to detect the abnormality of the positional relationship of the substrate stage PST with respect to the projection optical system PL, for example, the position of the substrate stage PST in the XY direction is detected by using the interferometer 46, and the abnormality of the positional relationship can be detected on the basis of the detection result of the position, without using the measurement result of the flow meter 27 of the liquid recovery mechanism 20. The control unit CONT may compare the detection result of the position of the substrate stage obtained by the interferometer 46 with a preset allowable value. When the detection result of the position of the stage obtained by the interferometer 46 exceeds the allowable value, for example, the stop of the supply operation of the liquid 1 may be executed. Alternatively, the position of the substrate stage PST in the Z axis direction may be detected by the focus-detecting system 56 to compare the detection result of the position of the stage obtained by the focus-detecting system 56 with a preset allowable value. When the detection result obtained by the focus-detecting system 56 exceeds the allowable value, the control unit CONT may execute, for example, the stop of the supply operation of the liquid 1. As described above, the control unit CONT detects the abnormality of the positional relationship between the projection optical system PL and the substrate stage PST on the basis of the detection result obtained by the substrate stage position-detecting unit including the interferometer 46 and the focus-detecting system 56. When the abnormality is detected, it is possible to execute, for example, the stop of the liquid supply operation, the stop of the electric power supply to the electric unit, and the stop of the suction operation from the suction port.

When the interferometer 46 causes any error, the control unit CONT may stop the liquid supply operation to be performed by the liquid supply mechanism 10. The error of the interferometer 46 herein includes such a situation that the measurement of the position of the substrate stage PST cannot be performed due to any cause including, for example, the malfunction of the interferometer 46 itself and the arrangement of any foreign matter on the optical path for the measuring light beam of the interferometer. When the interferometer 46 causes the error, the control unit CONT cannot grasp the position of the substrate stage PST. Simultaneously, the control unit CONT cannot control the position of the substrate stage PST. In this situation, it is feared that any abnormality arises in the positional relationship between the projection optical system PL and the substrate stage PST, and the liquid 1 causes the leakage and the outflow. Accordingly, it is possible to avoid the inconvenience of the leakage of the liquid 1 by stopping the liquid supply to be performed by the liquid supply mechanism 10 when the interferometer 46 causes the error.

Similarly, when the measuring system (focus-detecting system 56 in this embodiment), which is provided to control the position of the substrate stage PST in the Z axis direction, causes any error, it is feared that any abnormality arises in the positional relationship between the projection optical system PL and the substrate stage PST, and the liquid 1 causes the leakage and the outflow. Therefore, when the focus-detecting system 56 causes the error, the control unit CONT can stop the liquid supply operation to be performed by the liquid supply mechanism 10.

A detecting system based on the non-optical system such as a capacitance sensor may be used for the abnormality of the positional relationship in the Z axis direction between the substrate stage PST (substrate holder PH) and the projection optical system PL, without being limited to the focus-detecting system 56.

The positional relationship between the image plane of the projection optical system PL and the surface of the substrate stage PST (substrate P) can be also managed by using an interferometer. The management of the positional relationship between the image plane of the projection optical system PL and the surface of the substrate stage PST (substrate P), which is performed by using the interferometer, is disclosed, for example, in U.S. Pat. No. 6,020,964, contents of which is incorporated herein by reference within a range of permission of the domestic laws and ordinances of the state designated or selected in this international application.

The embodiment described above is illustrative of the case in which the abnormality arises during the exposure operation. However, the present invention is also applicable equivalently in the same manner as described above when the abnormality arises when the exposure for the substrate P is not performed.

In the embodiment described above, the supply of the liquid is stopped when the abnormality is detected during the supply of the liquid. However, the start of the supply of the liquid may be stopped as well when the abnormality concerning, for example, the positional relationship between the projection optical system PL and the substrate stage PST is detected when the supply of the liquid is started.

Next, an explanation will be made about a second embodiment of the exposure apparatus EX of the present invention. In the following explanation, the constitutive components, which are the same as or equivalent to those of the embodiment described above, are designated by the same reference numerals, any explanation of which will be simplified or omitted. In this embodiment, the leakage of the liquid 1, for example, to the outside of the substrate P or the substrate stage PST (substrate holder PH) is optically detected by using a detector including an optical fiber to execute at least one of the stop of the liquid supply operation by the liquid supply mechanism 10, the stop of the electric power supply to the electric unit, and the stop of the suction operation from the suction port when the leakage or the invasion of the liquid 1 is detected.

Figure 6:
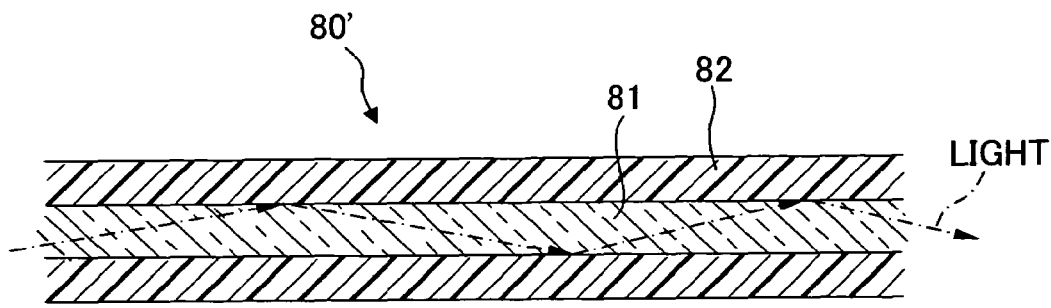
FIG. 6 schematically illustrates a detector provided with an optical fiber concerning a second embodiment of the exposure apparatus of the present invention.

An explanation will be made with reference to FIGS. 6 and 7 about the detection principle of the detector for detecting the leakage of the liquid 1. The optical fiber is used as the detector in this embodiment. FIG. 6 shows a schematic arrangement illustrating a general optical fiber. With reference to FIG. 6, the optical fiber 80' includes a core portion 81 through which the light is transmitted, and a clad portion 82 which is provided around the core portion 81 and which has an refractive index smaller than that of the core portion 81. In the optical fiber 80', the light is transmitted by being confined in the core portion 81 having the refractive index higher than that of the clad portion 82.

Figure 7:
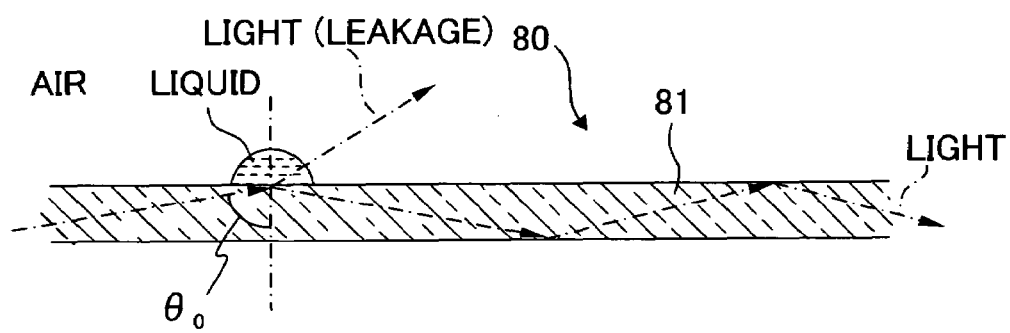
FIG. 7 schematically illustrates a detector provided with an optical fiber according to the second embodiment of the exposure apparatus of the present invention.

FIG. 7 shows a schematic arrangement illustrating the optical fiber 80 according to the embodiment of the present invention. With reference to FIG. 7, the optical fiber 80 is such an optical fiber (clad-less fiber) that the optical fiber 80 has a core portion 81 through which the light is transmitted, and no clad portion is provided therearound. The core portion 81 of the optical fiber 80 has a refractive index nc which is higher than a refractive index na of the surrounding gas (air in this embodiment). Further, the core portion 81 has the refractive index which is lower than a refractive index nw of the liquid (pure water in this embodiment) 1 (na<nc<nw). Therefore, when the surrounding of the optical fiber 80 is filled with the air, the light is transmitted while being confined in the core portion 81 having the refractive index nc higher than that of the air, provided that the angle of incidence $\theta_0$ of the light satisfies the total reflection condition $\sin \theta_0 >$ na/nc. In other words, the light, which comes from the incoming end of the optical fiber 80, outgoes from the outgoing end while the light amount is not greatly attenuated. However, when the liquid (pure water) 1 adheres to the surface of the optical fiber 80, then the total reflection condition $\sin \theta_0 =$ na/nc cannot be satisfied at any angle of incidence at the place to which water adheres, because of nc<nw, and the total reflection is not caused at the interface between the liquid 1 and the optical fiber 80. Accordingly, the light is leaked from the liquid adhesion portion of the optical fiber 80. Therefore, the light, which comes from the incoming end of the optical fiber 80, has the light amount which is decreased when the light outgoes from the outgoing end. Accordingly, when the optical fiber 80 is installed beforehand at a predetermined position of the exposure apparatus EX, and the light amount is measured at the outgoing end of the optical fiber 80, then the control unit CONT can detect whether or not the liquid 1 adheres to the optical fiber 80, i.e., whether or not the liquid 1 is leaked. The refractive index of the air is about 1, and the refractive index of the water is about 1.4 to 1.6. Therefore, it is preferable that the core portion 81 is formed of, for example, a material having a refractive index of about 1.2 (for example, quartz or glass having a specified composition).

The amount of the liquid 1 adhered to the optical fiber 80 can be also determined in accordance with the amount of attenuation of the light allowed to outgo from the outgoing end of the optical fiber 80. That is, the amount of attenuation of the light depends on the area of the portion at which the liquid 1 adheres to the optical fiber. When a small amount of the liquid 1 adheres to the circumference of the optical fiber 80, the amount of attenuation of the light is small at the outgoing end. When a large amount of the liquid 1 adheres, the amount of attenuation is large. Therefore, it is considered that the area of the portion, at which the liquid 1 adheres, depends on the amount of leakage of the liquid. Accordingly, the amount of leakage of the liquid 1 can be determined by measuring the light amount at the outgoing end of the optical fiber 80. Further, the measured value of the light amount at the outgoing end of the optical fiber is compared with a plurality of preset threshold values (reference values), and specified signals are outputted respectively when the measured value exceeds the respective threshold values. Accordingly, the amount of leakage of the liquid 1 can be detected in a stepwise manner.

Figure 8:
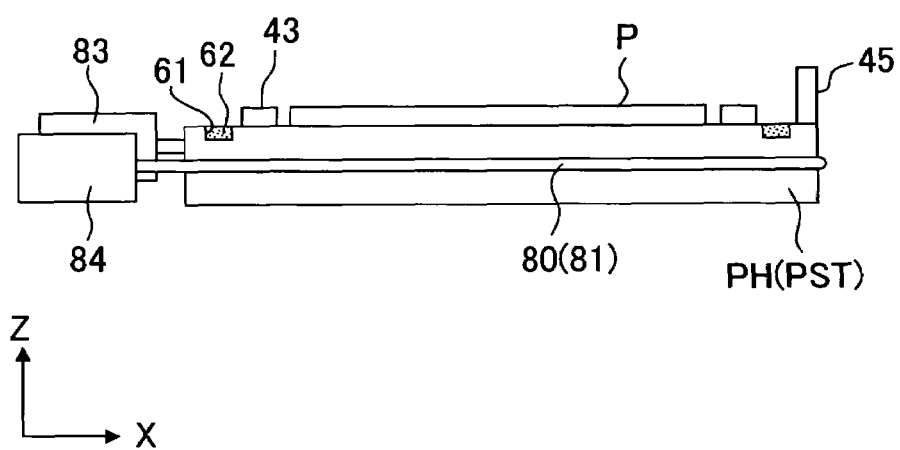
FIG. 8 shows a side view illustrating an exemplary arrangement of the detector provided with the optical fiber.
Figure 9:
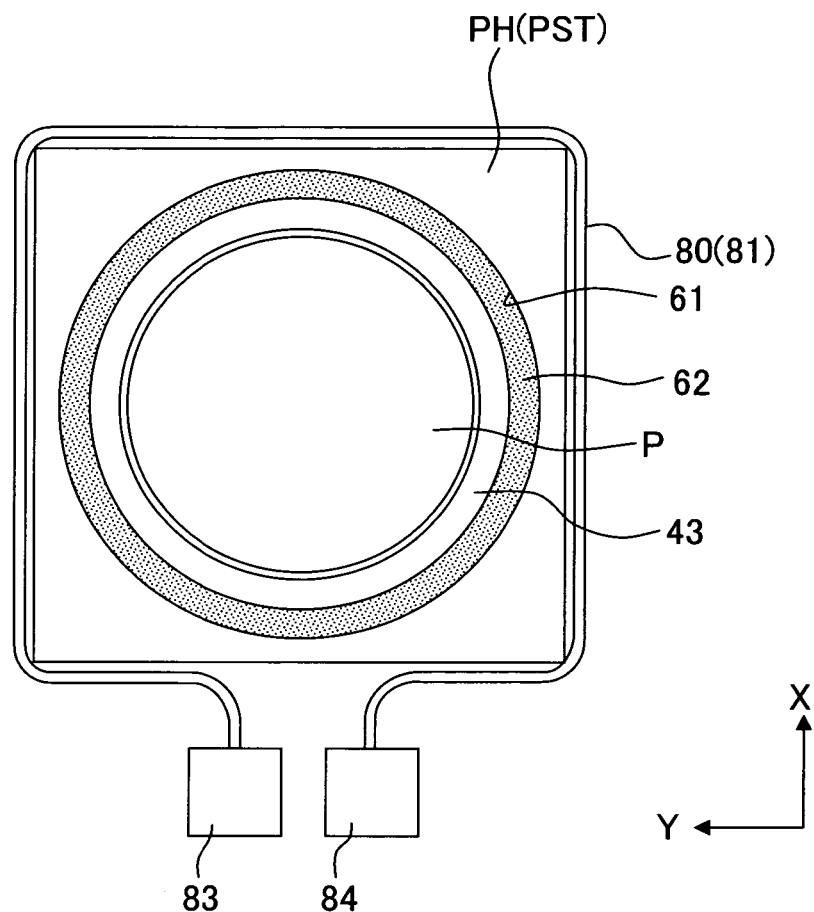
FIG. 9 shows a plan view illustrating the arrangement shown in FIG. 8.

FIG. 8 shows a side view illustrating a state in which the optical fiber 80 of the detector as described above is arranged around the substrate stage PST (substrate holder PH), and FIG. 9 shows a plan view of the state. As shown in FIGS. 8 and 9, the optical fiber 80 is arranged to surround the circumference of the substrate stage PST (substrate holder PH). A light-emitting section 83, which is capable of allowing the light to come into the optical fiber 80, is connected to the incoming end of the optical fiber 80. A light-receiving section 84, which is capable of receiving the light transmitted through the optical fiber 80 and allowed to outgo from the outgoing end, is connected to the outgoing end of the optical fiber 80. The control unit CONT determines the attenuation ratio of the light at the outgoing end with respect to the incoming end of the optical fiber 80 on the basis of the amount of the light allowed to come into the optical fiber 80 from the light-emitting section 83 and the amount of the light received by the light-receiving section 84. The control unit CONT judges whether or not the liquid 1 adheres to the optical fiber 80, i.e., whether or not the liquid 1 leaks to the outside of the substrate stage PST (substrate holder PH), on the basis of the determined result. When it is judged that the liquid 1 leaks, the control unit CONT executes, for example, the stop of the operation to supply the liquid by the liquid supply mechanism 10, the stop of the electric power supply to the electric unit, and the stop of the suction operation from the suction port.

The optical fiber 80 may be arranged on the upper surface of the substrate stage PST (substrate holder PH), especially around the recovery port 61. Alternatively, in order to check the inundation with the water (inundation with the liquid) of the movement mirror 45, the optical fiber 80 may be arranged on the movement mirror 45 or at any portion therearound.

Figure 10:
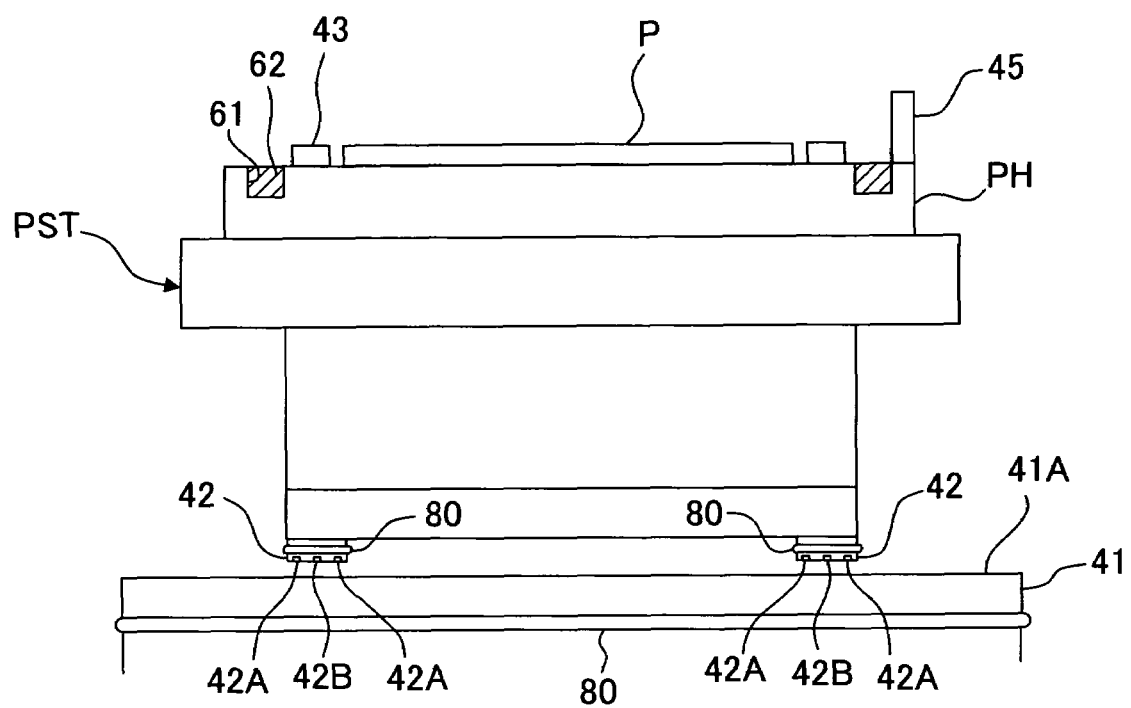
FIG. 10 shows a side view illustrating another exemplary arrangement of the detector provided with the optical fiber.

FIG. 10 shows an example in which the optical fibers 80 are arranged around the air bearings 42 provided on the lower surface of the substrate stage PST and around the substrate surface plate (base member) 41 for movably supporting the substrate stage PST. The optical fiber 80 is arbitrarily bendable. Therefore, the optical fiber 80 can be attached in a winding manner at any arbitrary position of, for example, the substrate stage PST (substrate holder PH), the air bearing 42, and the substrate surface plate 41 at which the liquid 1 tends to leak. The optical fiber 80 can be freely laid out and arranged in any arbitrary form. In particular, when the optical fiber 80 is attached around the air bearing 42, then it is possible to satisfactorily detect whether or not the liquid 1 adheres (leaks) to the vicinity of the air bearing 42, and it is possible to previously avoid the inconvenience of the inflow of the liquid 1 into the suction port 42A of the air bearing 42.

Figure 11:
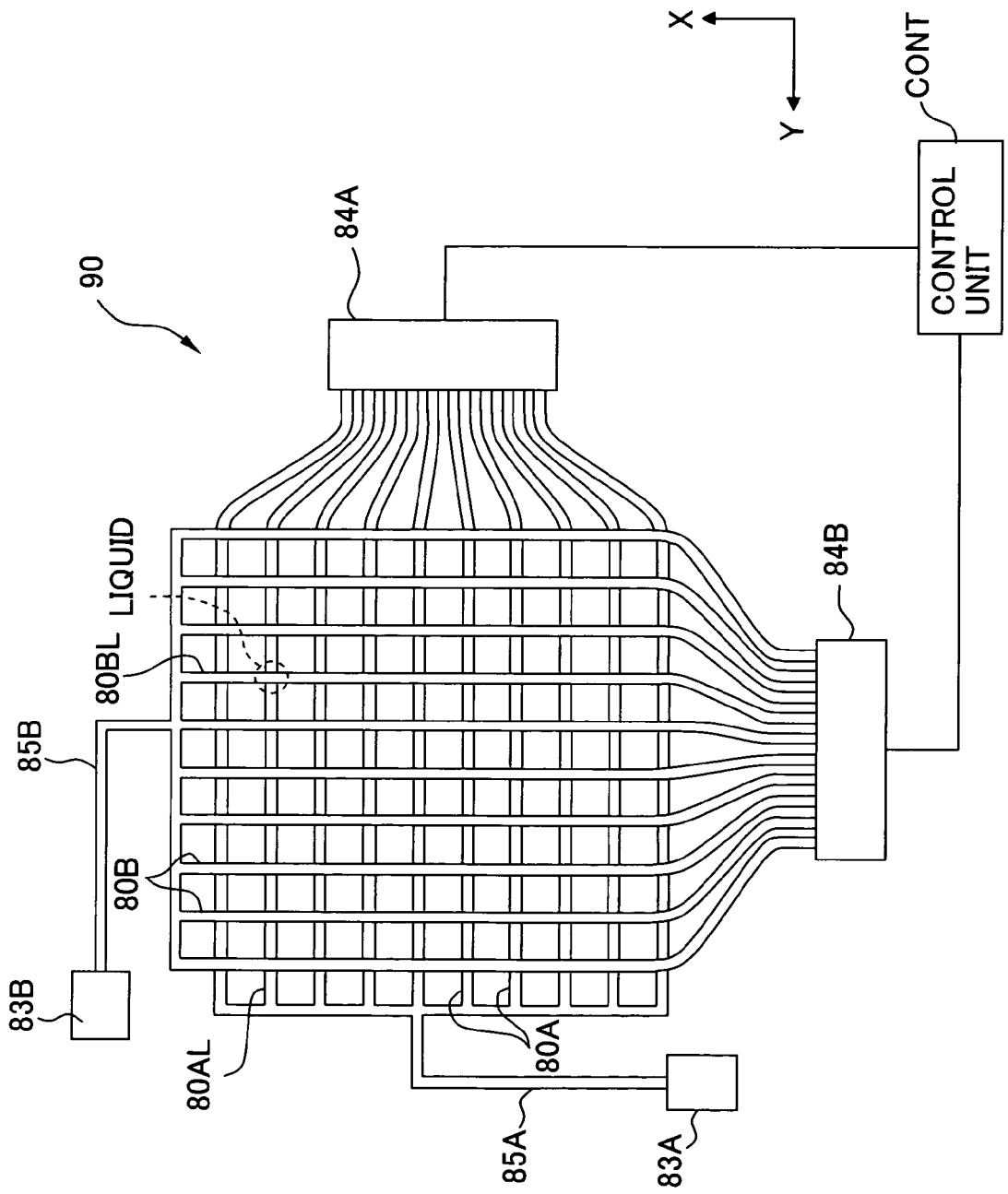
FIG. 11 shows a plan view illustrating another embodiment of a detector provided with the optical fiber.

In the case of the optical fiber 80 as described above, when the distance from the incoming end to the outgoing end is long, it is sometimes difficult to specify the position at which the liquid 1 adheres to the optical fiber 80, i.e., the position of the leakage of the liquid 1. Accordingly, a plurality of optical fibers 80 are arranged two-dimensionally in a matrix form as shown in FIG. 11, and thus it is possible to specify the position of the leakage of the liquid 1. In FIG. 11, a detector 90 includes a plurality of first optical fibers 80A which are provided and aligned in a second direction (X axis direction) perpendicular to a first direction provided that the first direction (Y axis direction) is the longitudinal direction, and a plurality of second optical fibers 80B which are provided and aligned in the first direction provided that the second direction is the longitudinal direction. The plurality of first and second optical fibers 80A, 80B are arranged in the matrix form (network form). Respective incoming ends of the plurality of first optical fibers 80A are collected, and the collected portion is connected to an outgoing end of a collective fiber 85A. An incoming end of the collective fiber 85A is connected to a light-emitting section 83A. On the other hand, respective outgoing ends of the plurality of first optical fibers 80A are connected to a light-receiving section 84A constructed of, for example, a one-dimensional CCD line sensor. Similarly, respective incoming ends of the plurality of second optical fibers 80B are collected, and the collected portion is connected to an outgoing end of a collective fiber 85B. An incoming end of the collective fiber 85B is connected to a light-emitting section 83B. On the other hand, respective outgoing ends of the plurality of second optical fibers 80B are connected to a light-receiving section 84B constructed of, for example, a one-dimensional CCD line sensor.

The light, which is emitted from the light-emitting section 83A, is transmitted through the collective fiber 85A, and then the light is branched into each of the plurality of first optical fibers 80A respectively. The lights, which come from the respective incoming ends of the first optical fibers 80A, are transmitted through the first optical fibers 80A. After that, the lights outgo from the outgoing ends, and the lights are received by the light-receiving section 84A. The light-receiving section 84A detects the amounts of the lights allowed to outgo from the respective outgoing ends of the plurality of first optical fibers 80A respectively. As shown in FIG. 11, when the liquid 1 adheres to the specified first optical fiber 80AL of the plurality of first optical fibers 80A, the light amount is lowered at the outgoing end of the first optical fiber 80AL. The light-receiving result of the light-receiving section 84A is outputted to the control unit CONT. Similarly, the light, which is emitted from the light-emitting section 83B, is transmitted through the collective fiber 85B, and then the light is branched into each of the plurality of second optical fibers 80B respectively. The lights, which come from the respective incoming ends of the second optical fibers 80B, are transmitted through the second optical fibers 80B. After that, the lights outgo from the outgoing ends, and the lights are received by the light-receiving section 84B. The light-receiving section 84B detects the amounts of the lights allowed to outgo from the respective outgoing ends of the plurality of second optical fibers 80B respectively. As shown in FIG. 11, when the liquid 1 adheres to the specified second optical fiber 80BL of the plurality of second optical fibers 80B, the light amount is lowered at the outgoing end of the second optical fiber 80BL. The light-receiving result of the light-receiving section 84B is outputted to the control unit CONT. The control unit CONT can specify the fact that the leakage position of the liquid 1 (position of the adhesion of the leaked liquid 1 with respect to the detector 90) is located in the vicinity of the point of intersection between the first optical fiber 80AL and the second optical fiber 80BL on the basis of the respective light-receiving results of the light-receiving sections 84A, 84B.

Figure 12:
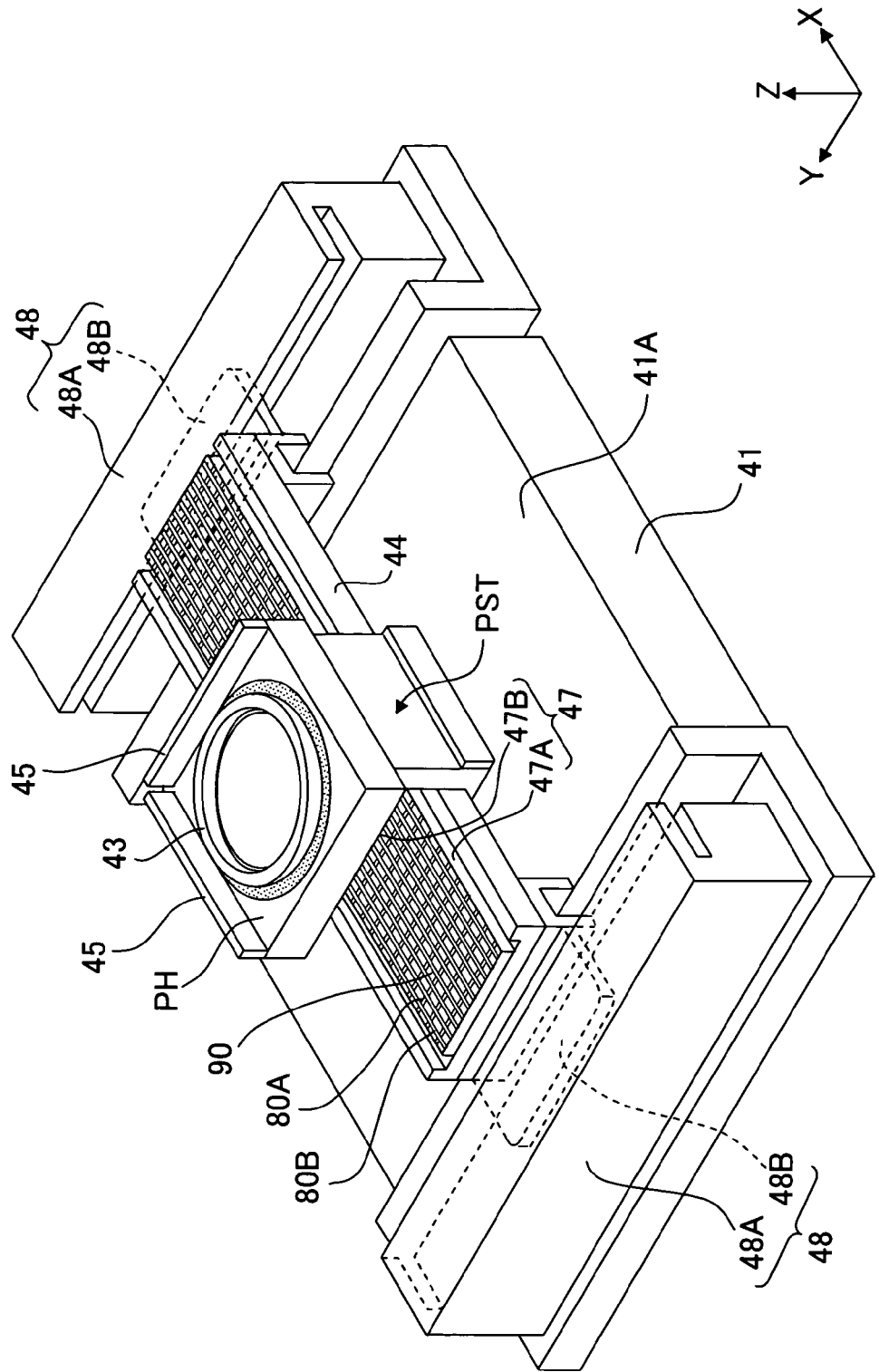
FIG. 12 shows a perspective view illustrating another exemplary arrangement of a detector provided with the optical fiber.

FIG. 12 shows an example in which the detector 90, which has the optical fibers 80A, 80B arranged in a matrix form, is arranged for the linear motor 47 (stator 47A) as the electromagnetic driving source for driving the substrate stage PST. When the detector 90 is arranged for the linear motor 47, it is possible to specify the position of the liquid 1 which leaks to the outside of the substrate stage PST and which adheres onto the linear motor 47. When the position of the leaked liquid 1 is specified, for example, it is possible to efficiently perform the operation for removing the leaked liquid 1.

When the liquid 1 is water, and the leaked liquid (water) is removed, then the removing operation (wiping operation) is performed by using absolute alcohol. Accordingly, it is possible to satisfactorily remove the water. Further, the removing operation can be performed smoothly, because alcohol is volatilized immediately.

Figure 13:
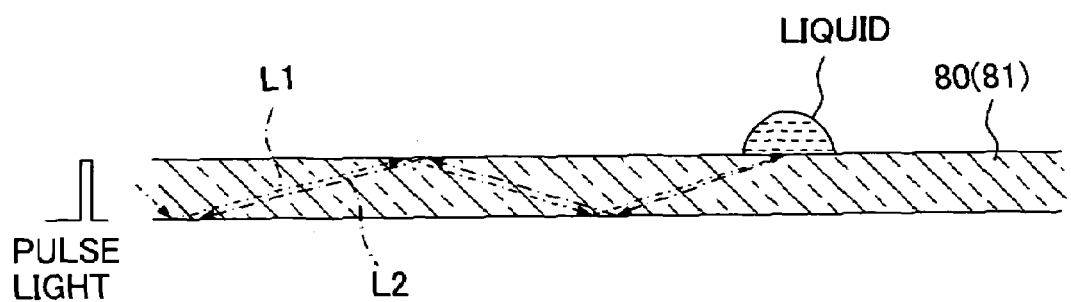
FIG. 13 schematically shows another embodiment of a detector provided with the optical fiber.

As schematically shown in FIG. 13, when the pulse light is allowed to come from the incoming end of the optical fiber 80, it is possible to specify the position of the liquid 1 adhered to the surface of the optical fiber 80. When the liquid 1 adheres to the surface of the optical fiber 80, a phenomenon occurs such that the pulse light L1, which comes from the incoming end of the optical fiber 80, is reflected at the position of the adhesion of the liquid 1, and the reflected light L2 is returned toward the incoming end again. Accordingly, an optical element such as a polarizing beam splitter is provided on the incoming side, and the reflected light is introduced with the optical element into a light-receiving unit to detect the reflected light. According to the result of the detection, the distance between the incoming end and the position of the adhesion of the liquid 1 can be determined on the basis of the difference in time between the timing at which the pulse light L1 is allowed to come into the optical fiber 80 and the timing at which the reflected light L2 is received at the incoming end, and the velocity of the light transmitted through the optical fiber 80. Accordingly, it is possible to specify the position of the adhesion of the liquid 1 (position of the leakage of the liquid 1). The velocity of the light transmitted through the optical fiber 80 is changed depending on the material for forming the optical fiber 80 (core portion 81). Therefore, the velocity of the light can be determined on the basis of the material for forming the optical fiber 80.

Next, an explanation will be made about a third embodiment of the exposure apparatus EX of the present invention. In this embodiment, the leakage of the liquid 1 is optically detected by using a detector including a prism (optical element). When the leakage of the liquid 1 is detected, at least one of the stop of the liquid supply operation by the liquid supply mechanism 10, the stop of the electric power supply to the electric unit, and the stop of the suction operation from the suction port is executed.

Figure 14:
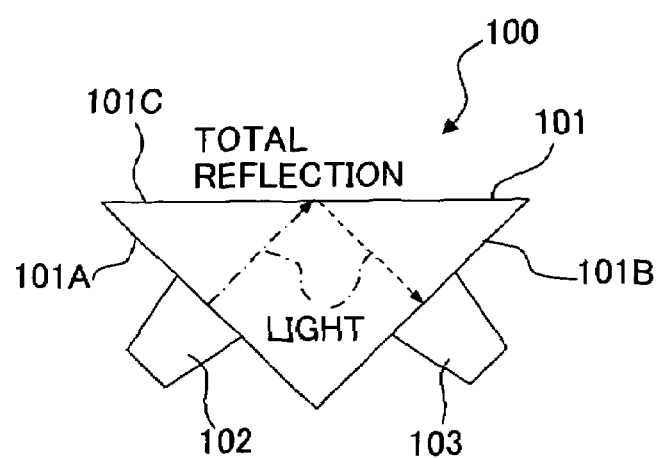
FIG. 14 schematically illustrates a detector provided with a prism according to a third embodiment of the exposure apparatus of the present invention.

An explanation will be made about the detection principle of the detector for detecting the leakage of the liquid 1 with reference to FIGS. 14 and 15. In this embodiment, the prism is used as the detector. FIG. 14 shows a schematic arrangement of the detector 100 based on the use of the prism. With reference to FIG. 14, the detector 100 includes the prism 101, a light-emitting section 102 which is attached to a first surface 101A of the prism 101 and which emits the light with respect to the prism 101, and a light-receiving section 103 which is attached to a second surface 101B of the prism 101 and which receives the reflected light of the light emitted from the light-emitting section 102 and reflected by a third surface 101C of the prism 101. The first surface 101A is approximately perpendicular to the second surface The prism 101 has a refractive index higher than that of the surrounding gas (air in this embodiment), and the refractive index is lower than that of the liquid (pure water in this embodiment) 1. The refractive index of the prism is selected so that the light, which is emitted from the light-emitting section 102 to the third surface 101C, is subjected to the total reflection on the third surface 101C when the surrounding of the prism 101 is filled with the air. Accordingly, the light, which is emitted from the light-emitting section 102, is received by the light-receiving section 103 without greatly attenuating the light amount thereof.

Figure 15:
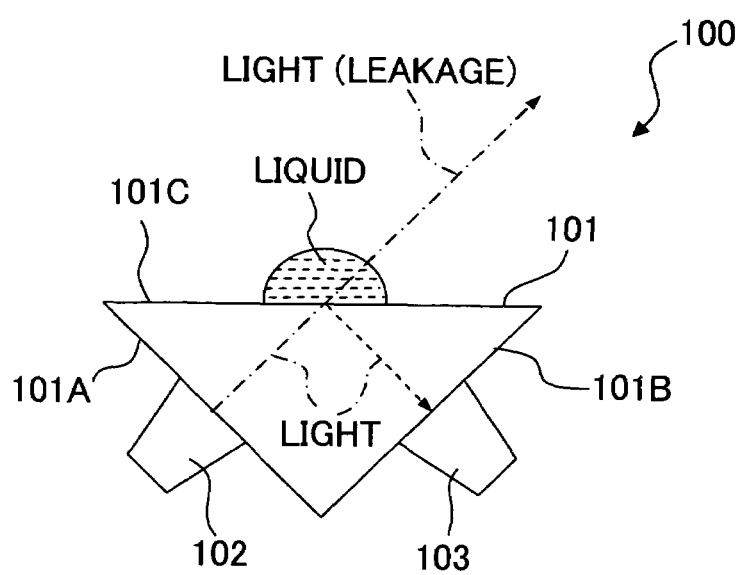
FIG. 15 schematically illustrates the detector provided with the prism according to the third embodiment of the exposure apparatus of the present invention.

FIG. 15 shows a state in which the liquid 1 adheres to the third surface 101C of the prism 101 of the detector 100. With reference to FIG. 15, the light, which is emitted from the light-emitting section 102 to the third surface 101C, is not subjected to the total reflection on the third surface 101C due to the presence of the liquid 1. A part of (or all of) the light component leaks to the outside from the liquid adhesion portion of the prism 101. Therefore, the light amount of the light component to arrive at the second surface 101B, which is included in the light emitted from the light-emitting section 102, is attenuated. Therefore, the light-receiving section 103 can detect whether or not the liquid 1 adheres to the third surface 101C of the prism 101 on the basis of the received light amount (light information or optical information).

Accordingly, the detector 100 provided with the prism 101 is previously installed at a predetermined position of the exposure apparatus EX, and thus the control unit CONT can detect whether or not the liquid 1 adheres to the prism 101, i.e., whether or not the liquid 1 leaks, on the basis of the light-receiving result of the light-receiving section 103.

Figure 16:
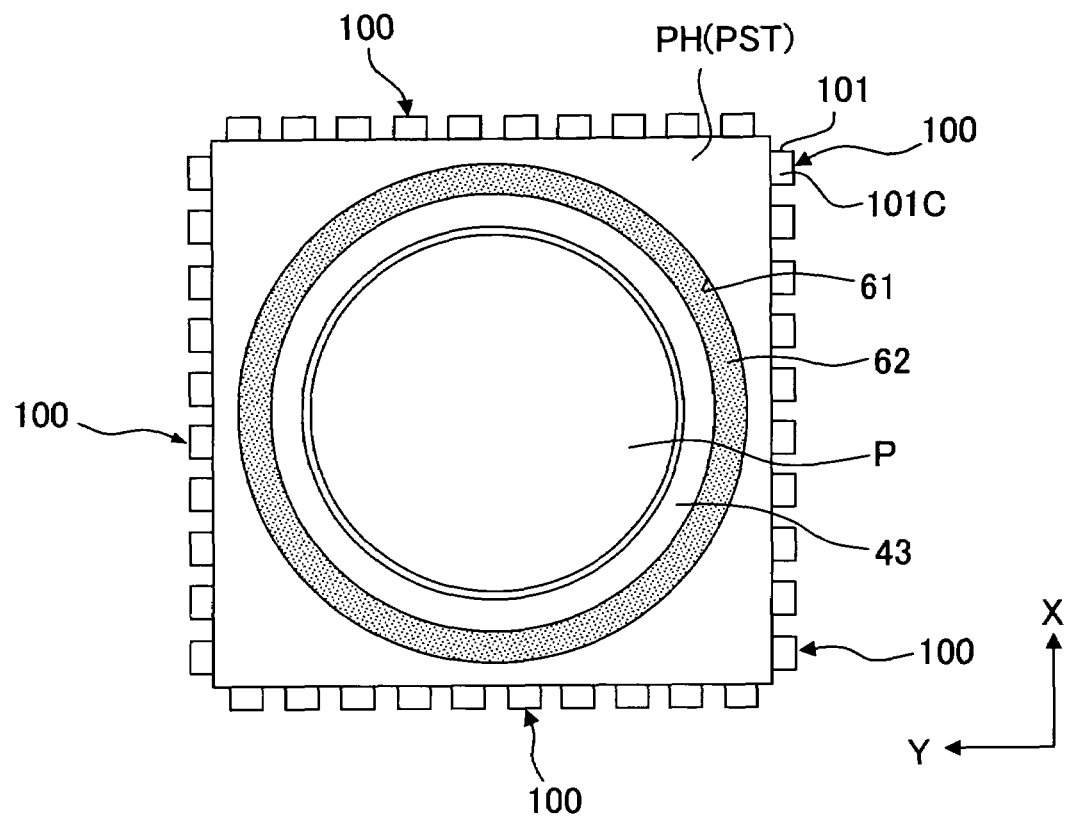
FIG. 16 shows a plan view illustrating an exemplary arrangement of the detector provided with the prism.

FIG. 16 shows a plan view illustrating an example in which the detectors 100 provided with the prisms 101 are arranged around the substrate stage PST. With reference to FIG. 16, a plurality of detectors 100 are attached at predetermined intervals to the circumference of the substrate stage PST (substrate holder PH) in a state in which the third surfaces 101C of the prisms 101 are directed upwardly. The control unit CONT determines the attenuation ratio of the outgoing light amount with respect to the incoming light amount allowed to come into the prism 101, on the basis of the light amount obtained when the light comes into the prism 101 from the light-emitting section 102 of each of the detectors 100 and the light amount received by the light-receiving section 103. On the basis of the determined result, the control unit CONT judges whether or not the liquid 1 adheres to the prism 101, i.e., whether or not the liquid 1 leaks to the outside of the substrate stage PST (substrate holder PH). When it is judges that the liquid 1 leaks, the control unit CONT executes, for example, the stop of the supply operation of the liquid by the liquid supply mechanism 10, the stop of the electric power supply to the electric unit, and the stop of the suction operation from the suction port.

In this embodiment, the control unit CONT can easily specify the leakage position of the liquid 1 on the basis of the respective detection results of the plurality of detectors 100 and the information about the attachment positions of the detectors 100. The prism 101 can be easily attached to any arbitrary position of the exposure apparatus EX, because the prism 101 is relatively small. The installation operability is satisfactory as well.

Figure 17:
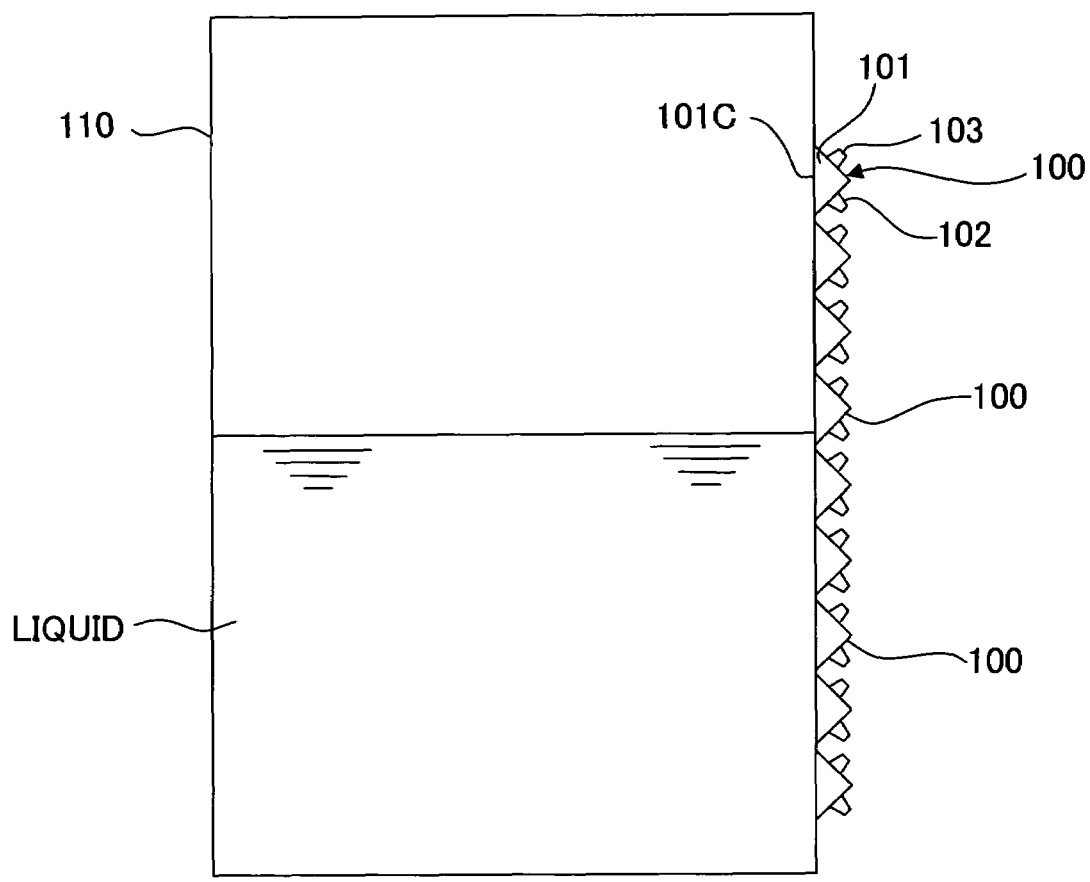
FIG. 17 shows another exemplary use of the detector provided with the prism.

The detector 100 as described above is also applicable to a water gauge or a water level indicator (liquid level indicator). FIG. 17 schematically shows an example in which a plurality of detectors 100 are attached to the wall surface of a tank 110 capable of accommodating the liquid (water) 1 while being aligned in the height direction (Z axis direction). The wall surface of the tank 110 is transparent. The detectors 100 are attached so that the third surfaces 101C of the prisms 101 make contact with the wall surface of the tank 110. The light-receiving signal of the detector 100 (light-receiving section 103) which detects the liquid 1 in the tank 110 and which is included in the plurality of detectors 100 exhibits a value lower than that of the light-receiving signal of the detector 100 (light-receiving section 103) which does not detect the liquid 1. Therefore, the control unit CONT can determine the liquid level (water level) of the liquid 1 contained in the tank 110 on the basis of the respective detection results (light-receiving results) of the plurality of detectors 100 and the information about the attachment positions of the plurality of detectors 100 with respect to the tank 110. Accordingly, it is possible to determine the liquid amount in the tank 110.

Figure 18:
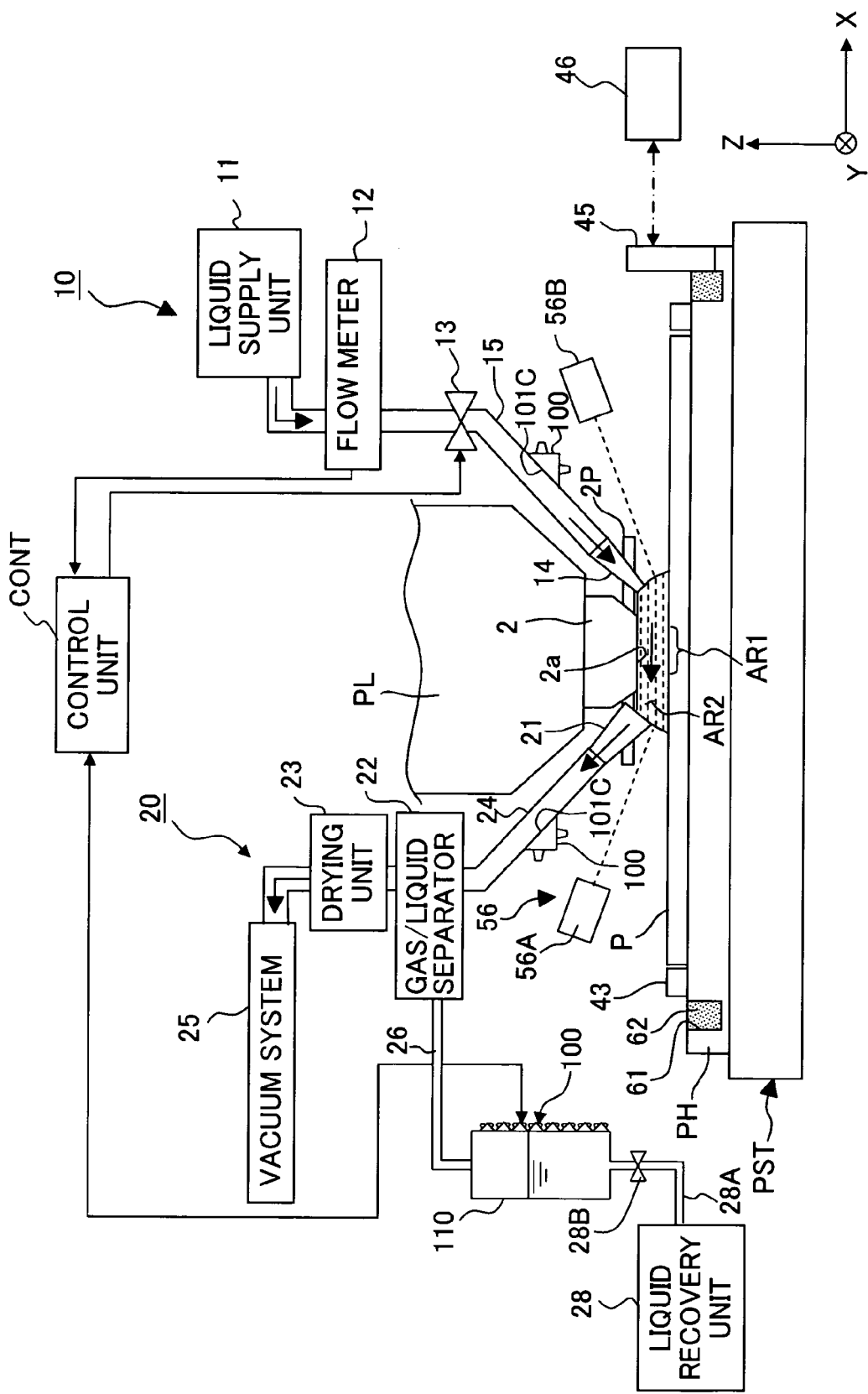
FIG. 18 schematically shows another exemplary arrangement of the detector provided with the prism.

FIG. 18 shows a schematic arrangement illustrating an example in which the tank 110 provided with the detectors 100 for constructing the water level indicator is applied to a part of the liquid recovery mechanism 20. The liquid recovery mechanism 20 shown in FIG. 18 includes recovery nozzles 21, a vacuum system 25 which is connected via a recovery tube 24 to the recovery nozzles 21, a gas/liquid separator 22 and a drying unit 23 which are provided at intermediate positions of the recovery tube 24. The liquid 1, which is separated by the gas/liquid separator 22, passes through a second recovery tube 26, and the liquid 1 is accommodated in the tank 110 provided with the detectors 100. In other words, this embodiment is constructed such that the tank 110 is provided in place of the flow meter 27 of the liquid recovery mechanism 20 as explained with reference to FIG. 3. The detection results of the detectors 100 are outputted to the control unit CONT. The control unit CONT determines the liquid amount recovered by the recovery nozzles 21 on the basis of the detection results of the detectors 100. The control unit CONT can detect the abnormality of the recovery operation of the liquid recovery mechanism 20 by comparing the liquid amount recovered with the recovery nozzles 21 and the liquid amount supplied from the liquid supply mechanism 10. The liquid recovery unit 28 is connected to the tank 110 via a tube passage 28A. A valve 28B is provided at an intermediate position of the tube passage 28A. The control unit CONT operates the valve 28B to open the flow passage 28A when the tank 110 is filled with the liquid 1 of an amount of not less than a predetermined amount (or periodically). The liquid 1 contained in the tank 110 is recovered by the liquid recovery unit 28.

In the embodiment shown in FIG. 18, the detectors 100 are attached to the supply tube 15 and the recovery tube 24 respectively. Each of the supply tube 15 and the recovery tube 24 is formed of a transparent material. The detectors 100 are attached so that the detection surfaces 100c of the detectors 100 make tight contact with the outer surfaces of the tubes. The control unit CONT can detect whether or not the liquid 1 flows through the supply tube 15 on the basis of the light-receiving result of the light-receiving section 103 of the detector 100 attached to the supply tube 15. In other words, the value of the light-receiving signal of the light-receiving section 103 is small when the liquid 1 flows through the supply tube 15 as compared with when the liquid 1 does not flows through the supply tube 15. Therefore, the control unit CONT can detect whether or not the liquid 1 flows through the supply tube 15, i.e., whether or not the supply operation of the liquid supply mechanism 10 is performed normally, on the basis of the light-receiving result of the light-receiving section 103. Similarly, the control unit CONT can detect whether or not the liquid 1 flows through the recovery tube 24, i.e., whether or not the recovery operation of the liquid recovery mechanism 20 is performed normally, on the basis of the light-receiving result of the light-receiving section 103 of the detector 100 attached to the recovery tube 24. As described above, the detector 100 can be also used as a presence/absence sensor for the liquid for optically detecting whether or not the liquid 1 flows through the supply tube or the recovery tube.

When the detector 100 having the prism 101 is attached, for example, to the vicinity of the end portion of the projection optical system PL (the vicinity of the optical element 2), the detector 100 can be used to detect whether or not the space between the projection optical system PL and the substrate P is filled with the liquid 1 as well.

In the embodiments described above, the leakage of the liquid 1 and/or the presence or absence of the liquid 1 is optically detected by using the optical fiber 80 or the prism 101. However, the leakage of the liquid 1 and/or the presence or absence of the liquid 1 may be electrically detected by using a capacitance sensor.

When the liquid 1 is water, the leakage of the liquid 1 and/or the presence or absence of the liquid 1 can be also detected electrically by a water leakage sensor which is constructed of two electric wires separated from each other by a predetermined spacing distance to detect the leakage of the liquid 1 in accordance with the presence or absence of the conduction between the two electric wires. In the embodiment of the present invention, water is used as the liquid 1. Therefore, it is possible to use the water leakage sensor constructed as described above. When ultrapure water is used as the liquid 1, the water leakage sensor constructed as described above cannot detect the presence or absence of the liquid 1, because ultrapure water has no conductivity. In such a situation, when an electrolyte substance is previously contained in the coatings of the separated two electric wires, the conductivity is obtained at the point of time of the immersion of ultrapure water. Therefore, the liquid 1 as ultrapure water can be detected with the water leakage sensor constructed as described above.

It goes without saying that the features of the respective embodiments described above can be used in combination. For example, the optical fiber 80 can be laid out around the linear motor, and the detector 100 having the prism 101 can be arranged around the substrate stage PST (substrate holder PH).

It is also allowable that the optical fiber and/or the prism are not installed at all of the positions described above. The optical fiber and/or the prism may be installed in the substrate stage PST and at the positions in the vicinity of the photoelectric detector and the piezoelectric element, if necessary.

Figure 19A:
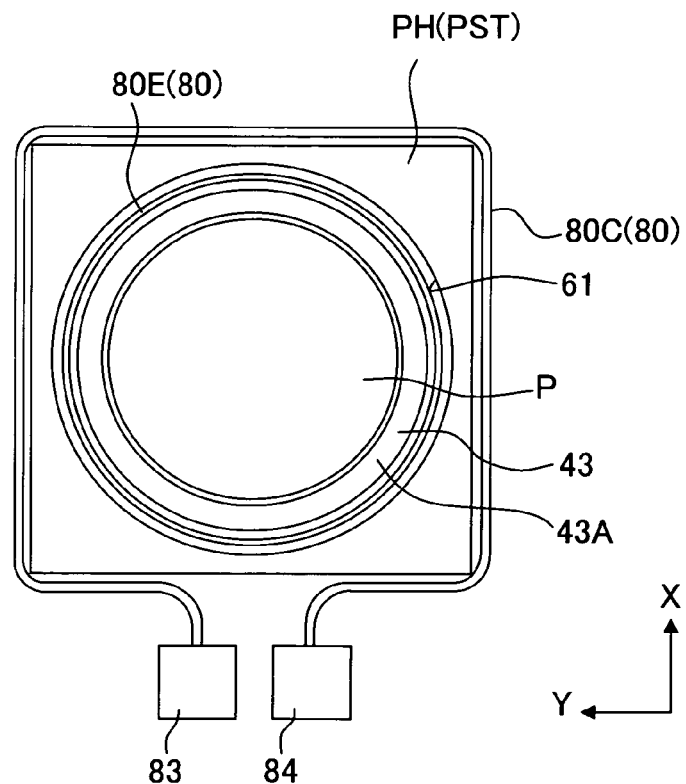
FIGS. 19A and 19B show another embodiment of the detector provided with the optical fiber.
Figure 19B:
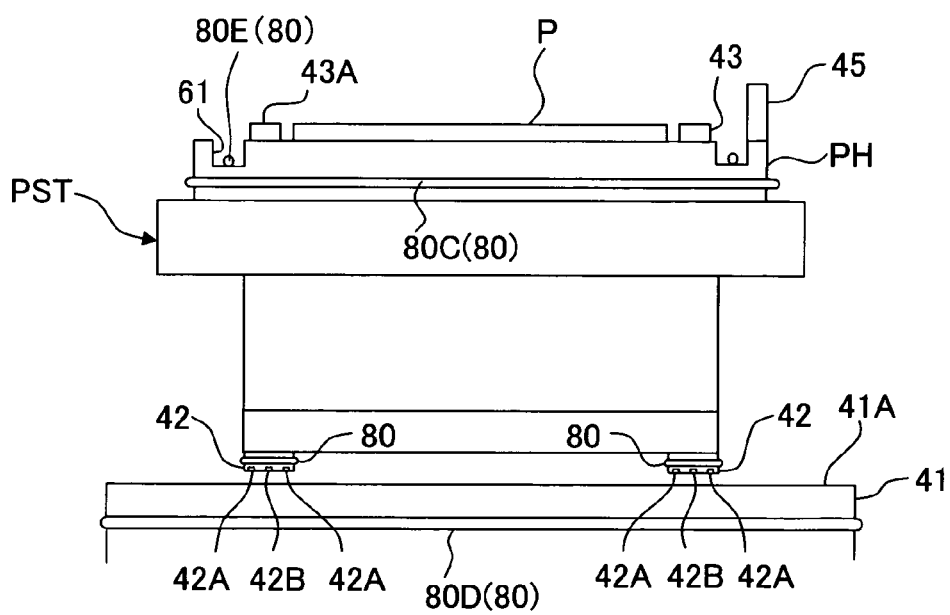

As explained with reference to FIGS. 8 to 10, the optical fiber 80 can be arranged to surround the circumference of the substrate stage PST and the circumference of the substrate surface plate 41. However, as shown in a side view of FIG. 19B, the following combination is of course allowable. That is, the first optical fiber 80C is provided around the substrate stage PST, and the second optical fiber 80D is provided around the substrate surface plate 41. Further, the optical fiber 80 (80E) may be also arranged in the recovery port 61 provided on the substrate stage PST. In FIG. 19, in the same manner as in the embodiment described above, the substrate stage PST is provided with the auxiliary plate 43 which is formed to surround the circumference of the substrate P held by the substrate holder PH, and the recovery port 61 which is provided at the outside thereof. The auxiliary plate 43 has the flat surface (flat portion) 43A which is provided around the substrate P held by the substrate holder PH and which is substantially flush with the surface of the substrate P. The flat surface 43A is provided annularly to surround the circumference of the substrate P. The recovery port 61 is provided outside the auxiliary plate 43 (flat surface 43A). The recovery port 61 is an annular groove which is formed to surround the auxiliary plate 43 (substrate P). In this embodiment, the liquid-absorbing member (62) is not arranged inside the recovery port 61. As shown in a plan view of FIG. 19A, the optical fiber 80E is arranged to extend over the entire circumference of the recovery port 61 which is formed annularly. When the optical fiber 80E for detecting the presence or absence of the liquid 1 is provided in the recovery port 61, the leaked liquid 1 can be detected with the optical fiber 80E before the leaked liquid 1 is diffused, even when the liquid 1 leaks from the surface of the substrate P. Therefore, the control unit CONT applies any appropriate treatment including, for example, the stop of the liquid supply operation of the liquid supply mechanism 10 by using the valve 13 when the optical fiber 80E detects the presence of the liquid 1. Accordingly, it is possible to avoid the diffusion of the liquid 1 and the leakage from the surface of the substrate stage PST. When the optical fiber 80E is arranged in the recovery port 61, the liquid-absorbing member (62) may be arranged for the recovery port 61.

As shown in FIG. 19B, when a plurality of optical fibers 80 for detecting the presence or absence of the liquid 1 are provided at a plurality of predetermined positions of the exposure apparatus EX (substrate stage PST) respectively, the control unit CONT may control the operation of the exposure apparatus EX depending on the detection results of the plurality of optical fibers 80. For example, the control unit CONT selects at least one operation of the stop of the liquid supply by the liquid supply mechanism 10 and the stop of the electric power supply to the electric unit depending on the position of the optical fiber 80 which has detected the liquid 1 and which is included in the plurality of optical fibers 80.

Specifically, the control unit CONT stops the liquid supply operation of the liquid supply mechanism 10 when the first optical fiber 80C provided for the substrate stage PST detects the presence of the liquid 1, and the control unit CONT stops the electric power supply to the predetermined electric unit when the second optical fiber 80D provided for the substrate surface plate 41 detects the presence of the liquid 1. The predetermined electric unit herein includes, for example, the linear motors 47, 48 for driving the substrate stage PST and the anti-vibration unit 9 for supporting the substrate surface plate 41 in the anti-vibration manner.

When the first optical fiber 80C provided for the substrate stage PST detects the presence of the liquid 1, and the second optical fiber 80D provided for the substrate surface plate 41 does not detect the presence of the liquid 1, then the control unit CONT judges that the leaked liquid 1 does not arrive at the linear motors 47, 48 for driving the substrate stage PST and the anti-vibration unit 9. In other words, the control unit CONT judges that the diffusion range of the leaked liquid 1 is relatively narrow. In this case, the control unit CONT executes the stop of the liquid supply operation of the liquid supply mechanism 10, but the control unit CONT continues the electric power supply to the linear motors 47, 48 and the anti-vibration unit 9. On the other hand, when the second optical fiber 80D provided for the substrate surface plate 41 detects the presence of the liquid 1, the control unit CONT judges that the leaked liquid 1 arrives at the linear motors 47, 48 and the anti-vibration unit 9. In other words, the control unit CONT judges that the diffusion range of the leaked liquid 1 is relatively wide. In this case, the control unit CONT stops the liquid supply operation of the liquid supply mechanism 10, and the control unit CONT stops the electric power supply to at least one of the linear motors 47, 48 and the anti-vibration unit 9. When the second optical fiber 80D detects the presence of the liquid 1, the control unit CONT executes the stop of the electric power supply to the linear motors 47, 48 or the anti-vibration unit 9. However, it is preferable that the control unit CONT does not execute the stop of the electric power supply to the entire exposure apparatus EX, for the following reason. That is, if the electric power supply to the entire exposure apparatus EX is stopped, a long period of time is required for the restoring operation and the stabilization to be performed thereafter.

As described above, the operation of the exposure apparatus EX is controlled depending on the detection results of the first optical fiber 80C and the second optical fiber 80D which are provided at the mutually different positions. Accordingly, it is possible to apply the appropriate treatment or countermeasure depending on the diffusion range of the leaked liquid 1. Therefore, it is possible to shorten the time required for the restoring operation after the occurrence of the leakage of the liquid 1, and it is possible to avoid the decrease in the working rate of the exposure apparatus EX. When the first optical fiber 80C provided for the substrate stage PST detects the presence of the liquid 1, then the control unit CONT stops the liquid supply by the liquid supply mechanism 10, and the control unit CONT continues the electric power supply to the electric unit. Accordingly, the period of time, which is required for the restoring operation and the stabilization, can be suppressed to the minimum. On the other hand, when the second optical fiber 80D provided for the substrate surface plate 41 detects the presence of the liquid 1, the control unit CONT stops the electric power supply to the anti-vibration unit 9 and/or the linear motors 47, 48 for driving the substrate stage PST. Accordingly, even when the leaked liquid is diffused over a wide range, it is possible to avoid the occurrence of the damage such as the electric leakage and the malfunction.

The control unit CONT may control the operation of the exposure apparatus EX depending on the amount of the liquid 1 detected by the optical fiber 80. For example, the control unit CONT selects at least one operation of the stop of the liquid supply operation of the liquid supply mechanism 10 and the stop of the electric power supply to the electric unit depending on the amount of the liquid 1 detected by the optical fiber 80.

Specifically, the control unit CONT stops the liquid supply operation of the liquid supply mechanism 10 when at least one of the first optical fiber 80C and the second optical fiber 80D detects the liquid 1 of an amount of not less than a preset first reference value, and the control unit CONT stops the electric power supply to the electric unit including, for example, the linear motors 47, 48 for driving the substrate stage PST and the anti-vibration unit 9 for supporting the substrate surface plate 41 in the anti-vibration manner when at least one of the first optical fiber 80C and the second optical fiber 80D detects the liquid 1 of an amount of not less than a second reference value. In this procedure, the second reference value is larger than the first reference value.

When it is judged that the amount of the liquid 1, which is detected by at least any one of the first optical fiber 80C and the second optical fiber 80D, is not less than the first reference value and less than second reference value, the control unit CONT judges that the amount of the leaked liquid 1 is relatively small. In this case, the control unit CONT executes the stop of the liquid supply operation of the liquid supply mechanism 10, but the control unit CONT continues the electric power supply to the linear motors 47, 48 and the anti-vibration unit 9. On the other hand, when it is judged that the amount of the liquid 1, which is detected by at least any one of the first optical fiber 80C and the second optical fiber 80D, is not less than the second reference value, the control unit CONT judges that the amount of the leaked liquid 1 is large. In this case, the control unit CONT stops the liquid supply operation of the liquid supply mechanism 10, and the control unit CONT stops the electric power supply to at least one of the linear motors 47, 48 and the anti-vibration unit 9. When the optical fibers 80C, 80D detect the amount of the liquid 1 of not less than the second reference value, it is preferable that the control unit CONT executes the stop of the electric power supply to the linear motors 47, 48 or the anti-vibration unit 9, but the control unit CONT does not execute the stop of the electric power supply to the entire exposure apparatus EX, for the following reason. That is, if the electric power supply to the entire exposure apparatus EX is stopped, a long period of time is required for the restoring operation and the stabilization to be performed thereafter.

As described above, the operation of the exposure apparatus EX can be controlled depending on the amount of the liquid 1 detected by the optical fiber 80 as well. Also in this case, it is possible to apply the appropriate treatment depending on the amount of the leaked liquid 1. Therefore, it is possible to shorten the period of time required for the restoring operation after the occurrence of the leakage of the liquid 1, and it is possible to avoid the decrease in the working rate of the exposure apparatus EX.

In the embodiment described above, one optical fiber 80 is arranged to surround the circumference of each of the substrate surface plate 41 and the substrate stage PST. However, a plurality of optical fibers can be used to surround the circumference of each of the substrate surface plate 41 and the substrate stage PST as well. For example, one optical fiber 80 can be arranged for each of the four sides of the substrate surface plate 41, and the four optical fibers 80 in total can be used to surround the circumference of the substrate surface plate 41. Accordingly, when one of the optical fibers detects the liquid 1, it is possible to easily specify the place of the leakage of the liquid 1 by investigating the optical fiber which undergoes the reaction.

As described above, for example, when the positional relationship between the projection optical system PL and the substrate stage PST is abnormal, the inconvenience arises such that the liquid 1 cannot be retained under the projection optical system PL, and the liquid 1 leaks. Accordingly, in order to avoid the leakage of the liquid 1, the range of movement of the substrate stage PST may be restricted as well. This procedure will be explained with reference to FIG. 20.

In FIG. 20, the substrate stage PST has a first area LA1 as a flat area which includes the surface of the substrate P (or the dummy substrate DP) held by the substrate holder PH and the flat surface 43A of the auxiliary plate 43 flush with the surface of the substrate P. A second area LA2 as a flat area, which includes the end surface (lower surface) 2a of the projection optical system PL on the image plane side and a part of the lower surface of the plate member 2P flush with the lower surface 2a, is provided at the position opposed to the first area LA1. In this arrangement, the liquid 1 forms the liquid immersion area AR2 while being retained between the first flat surface on the substrate stage PST and the second flat surface including the end surface 2a of the projection optical system PL and opposed to the first flat surface. Therefore, the area capable of retaining the liquid includes the first area A1 on the substrate stage PST and the second area LA2 opposed to the first area LA1 and including the end surface 2a of the projection optical system PL. The liquid 1 forms the liquid immersion area AR2 while being retained between a part of the first area LA1 and the second area LA2. It is not necessarily indispensable that the first area LA1 and the second area LA2 are flat surfaces. The surfaces may include curved surfaces and/or irregularities provided that the liquid 1 can be retained.

In this embodiment, the liquid 1 in the liquid immersion area AR2 also makes contact with parts of the recovery nozzles 21 having the liquid recovery ports 21K and the supply nozzles 14 having liquid supply ports 14K arranged around the optical element 2 disposed at the end portion of the projection optical system PL. In other words, the second area LA2, which is capable of retaining the liquid 1, is constructed to include the liquid contact surfaces of the supply nozzles 14 and the recovery nozzles 21.

Figure 20A:
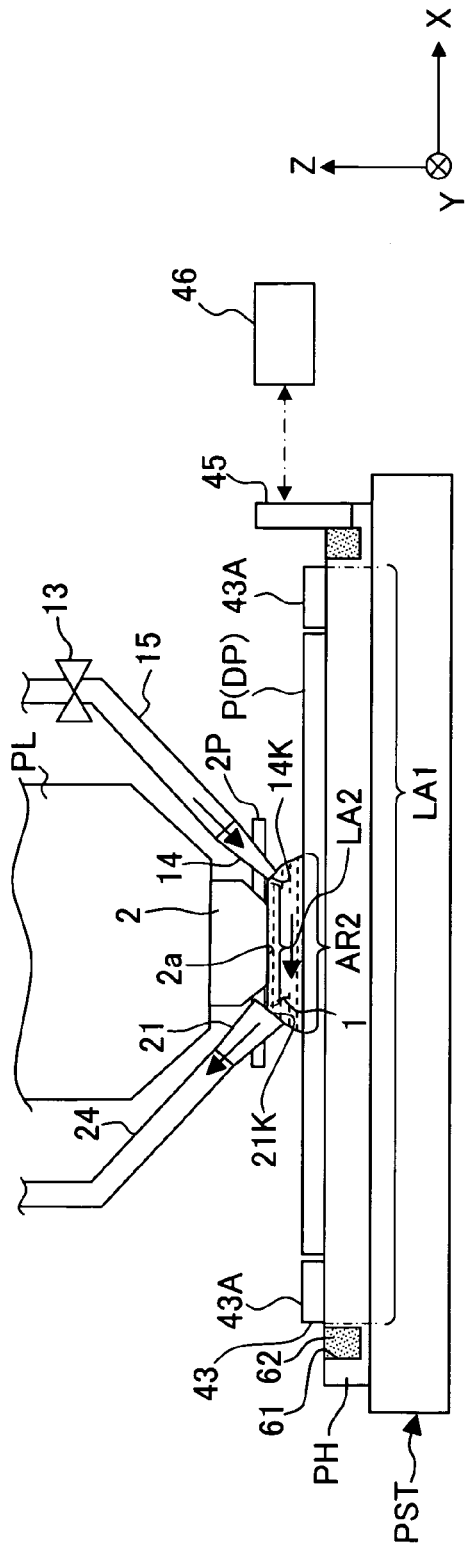
FIGS. 20A and 20B illustrate another embodiment of the present invention.
Figure 20B:
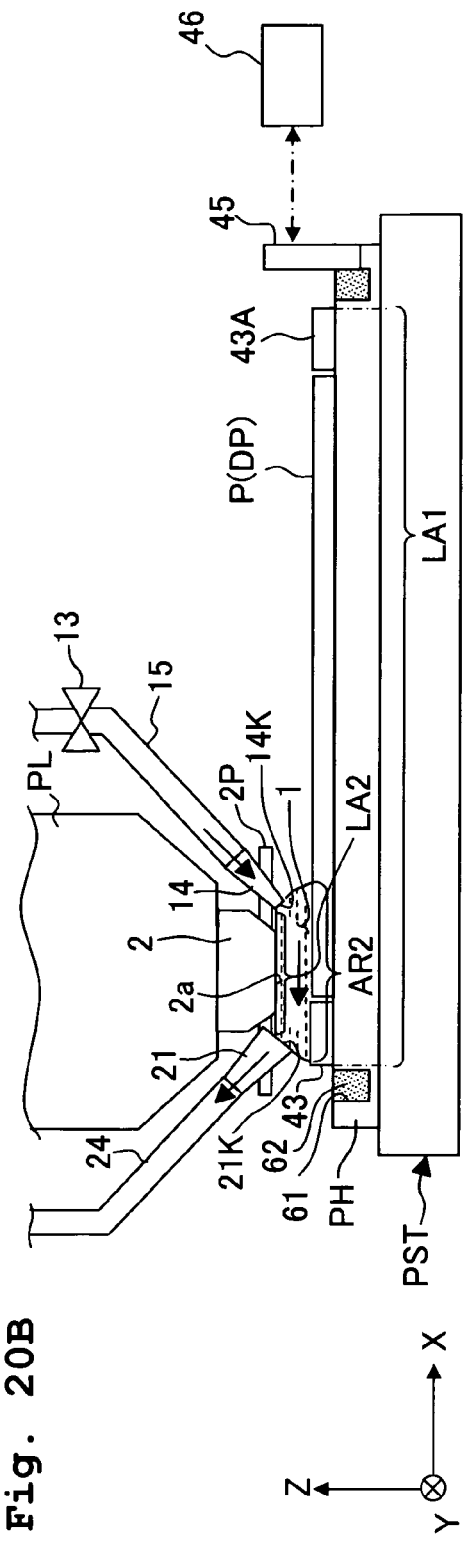

In this embodiment, the control unit CONT restricts the movement of the substrate stage PST depending on the positional relationship between the first area LA1 and the second area LA2. Specifically, as shown in FIG. 20A, when the liquid 1 is retained between the first area LA1 and the second area LA2, the liquid 1 can be retained until arrival at the positional relationship between the first area LA1 and the second area LA2 as shown in FIG. 20B. However, when the substrate stage PST is moved in the +X direction with respect to the positional relationship shown in FIG. 20B, a situation arises such that a part of the liquid immersion area AR2 protrudes to the outside of the first area LA1, and the liquid 1 cannot be retained between the first area LA1 and the second area LA2. In this situation, the control unit CONT judges that the abnormality arises in the positional relationship between the first area LA1 and the second area LA2, and the control unit CONT restricts the movement of the substrate stage PST. Specifically, the control unit CONT stops the movement of the substrate stage PST. Accordingly, it is possible to avoid the inconvenience such as the outflow of the liquid 1.

In this procedure, the control unit CONT can judge whether or not the abnormality arises in the positional relationship between the first area LA1 and the second area LA2 according to the measurement result of the interferometer 46. The control unit CONT detects the position of the substrate stage PST in the XY direction by the interferometer 46. The control unit CONT determines the position information of the first area LA1 with respect to the second area LA2, i.e., the positional relationship between the first area LA1 and the second area LA2 on the basis of the position detection result. The information about the respective sizes of the first area LA1 and the second area LA2 is previously stored in the control unit CONT. The information about the size of the liquid immersion area AR2 to be formed between the first area LA1 and the second area LA2 is also previously determined, for example, by an experiment or simulation, which is stored in the control unit CONT. Further, the abnormal value in relation to the positional relationship between the first area LA1 and the second area LA2 is previously determined for the control unit CONT, and the abnormal value is stored in the control unit CONT. In this procedure, the abnormal value is a value (relative distance) in which a positional relationship that the liquid 1 cannot be retained between the first area LA1 and the second area LA2. When the first area LA1 exceeds the abnormal value with respect to the second area LA2, it is impossible to retain the liquid 1 between the first area LA1 and the second area LA2.

When the position of the first area LA1 with respect to the second area LA2 exceeds the abnormal value on the basis of the measurement result of the interferometer 46, the control unit CONT restricts (stops) the movement of the substrate stage PST. Accordingly, it is possible to avoid the inconvenience such as the outflow of the liquid 1.

When the position of the first area LA1 with respect to the second area LA2 exceeds the abnormal value on the basis of the measurement result of the interferometer 46, the control unit CONT may change the direction of the movement of the substrate stage PST in place of the stop of the movement of the substrate stage PST. Specifically, with reference to FIG. 20, when the second area LA2 is in the abnormal positional relationship with respect to the first area LA1 due to the movement of the substrate stage PST in the +X direction, the control unit CONT moves the substrate stage PST, for example, in the −X direction. Accordingly, it is also possible to avoid the inconvenience such as the outflow of the liquid 1.

When the abnormality arises in the positional relationship between the first area LA1 and the second area LA2, and the position of the first area LA1 with respect to the second area LA2 exceeds the abnormal value, then the control unit CONT may restrict the operation of the liquid supply mechanism (10). Specifically, when the abnormality arises in the positional relationship between the first area LA1 and the second area LA2, the control unit CONT stops the liquid supply operation by the liquid supply mechanism (10). Accordingly, it is also possible to avoid the inconvenience such as the outflow of the liquid 1. Alternatively, when the second area LA2 is in the abnormal positional relationship with respect to the first area LA1, the control unit CONT reduces the liquid supply amount (liquid supply amount per unit time) by the liquid supply mechanism (10). Further alternatively, when the abnormality arises in the positional relationship between the first area LA1 and the second area LA2, then the control unit CONT may stop the electric power supply to the linear motors (47, 48) and the anti-vibration unit (9), or the control unit CONT may stop the suction through the suction port (42A).

On the other hand, the liquid 1 is not retained between the first area LA1 and the second area LA2, for example, after stopping the supply of the liquid by the liquid supply mechanism (10) after the completion of the liquid immersion exposure for the substrate P and recovering the liquid 1 from the surface of the substrate P (substrate stage PST) by the liquid recovery mechanism (20). In such a situation, the control unit CONT releases the substrate stage PST from the restriction of the movement. In other words, the control unit CONT restricts the movement range of the substrate stage PST to be the first range in which the liquid 1 can be retained between the first area LA1 and the second area LA2 during the period in which the liquid supply mechanism (10) supplies the liquid 1, while the control unit CONT restricts the movement range of the substrate stage PST to be the second range which is wider than the first range during the period in which the liquid supply mechanism (10) stops the supply of the liquid 1. That is, the control unit CONT restricts the movement range of the substrate stage PST to be the first range when the liquid 1 is retained between the projection optical system PL and the substrate stage PST (substrate P), while the control unit CONT permits the movement of the substrate stage PST within the second range which is wider than the first range when the liquid 1 is not retained between the projection optical system PL and the substrate stage PST (substrate P). Accordingly, the liquid 1 can be satisfactorily retained continuously between the projection optical system PL and the substrate stage PST (substrate P), for example, during the exposure for the substrate P. It is possible to smoothly perform the predetermined operation including, for example, the operation in which the substrate stage PST is moved to the load/unload position for the substrate P as the operation to be performed thereafter.

Figure 21A:
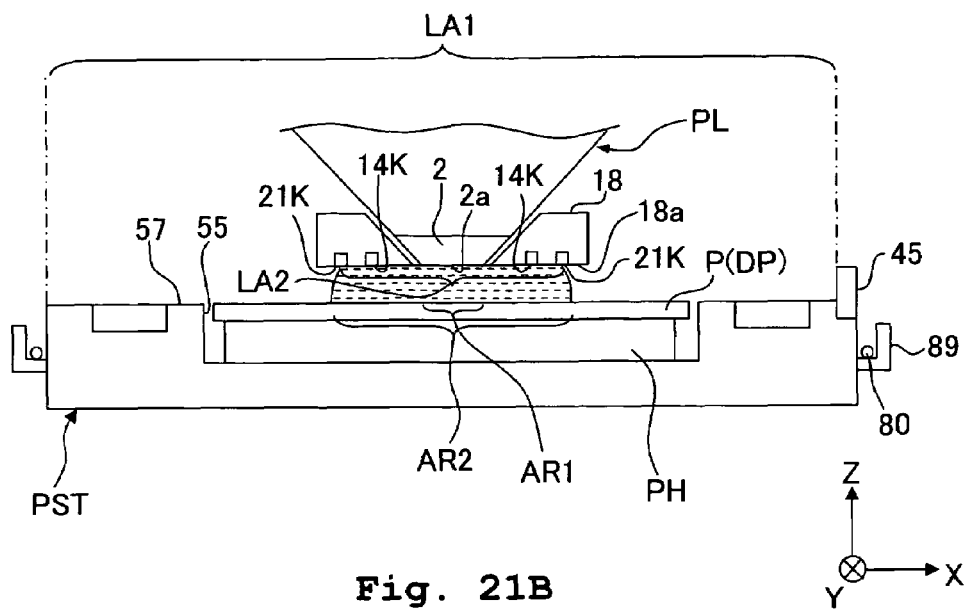
FIGS. 21A and 21B illustrate another embodiment of the present invention.
Figure 21B:
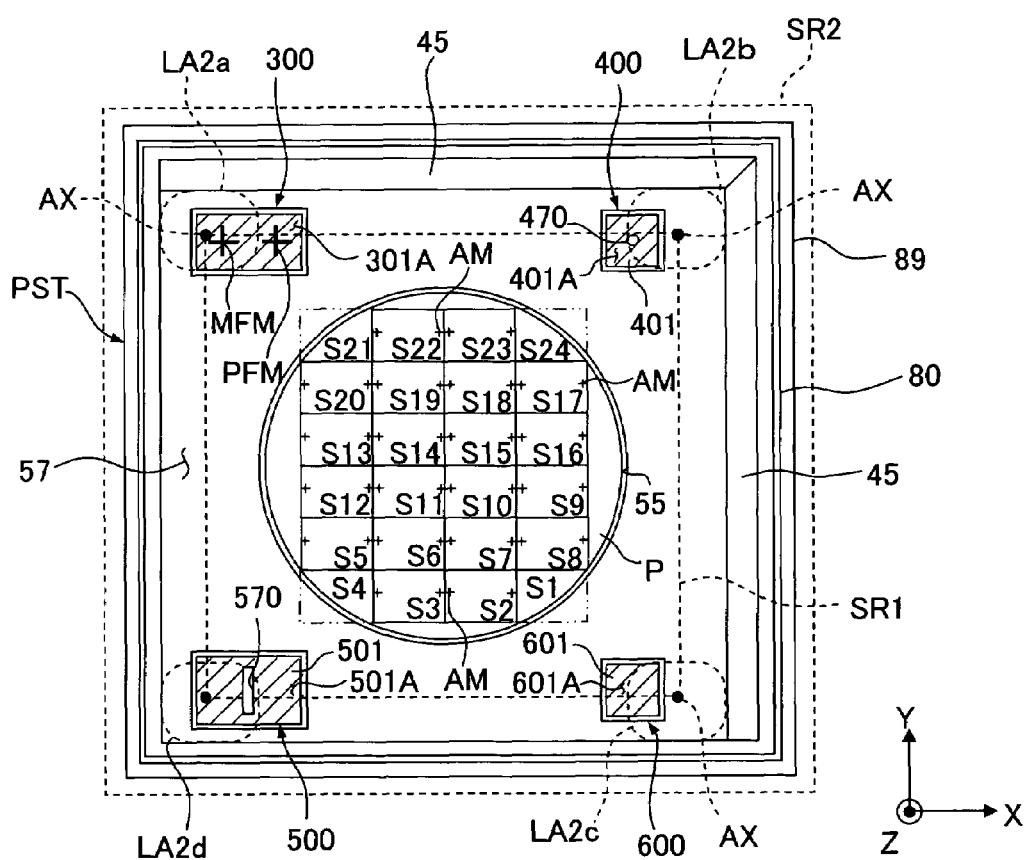

FIG. 21 shows another embodiment of the present invention, wherein FIG. 21A shows a side view, and FIG. 21B shows a plan view in which the substrate stage is viewed from an upward position. With reference to FIG. 21A, a nozzle member 18, which has liquid supply ports 14K and liquid recovery ports 21K, is provided around the optical element 2 of the projection optical system PL. In this embodiment, the nozzle member 18 is an annular member which is provided to surround the side surface of the optical element 2 over the substrate P (substrate stage PST). The gap is provided between the nozzle member 18 and the optical element 2. The nozzle member 18 is supported by a predetermined support mechanism so that the nozzle member 18 is isolated from the vibration of the optical element 2.

The nozzle member 18 is provided with the liquid supply ports 14K which are provided over the substrate P (substrate stage PST) and which are arranged to be opposed to the surface of the substrate P. In this embodiment, the nozzle member 18 has the two liquid supply ports 14K. The liquid supply ports 14K are provided on the lower surface 18a of the nozzle member 18.

Further, the nozzle member 18 is provided with the liquid recovery ports 21K which are provided over the substrate P (substrate stage PST) and which are arranged to be opposed to the surface of the substrate P. In this embodiment, the nozzle member 18 has the two liquid recovery ports 21K. The liquid recovery ports 21K are provided on the lower surface 18a of the nozzle member 18.

The liquid supply ports 14K, 14K are provided at the respective positions on the both sides in the X axis direction with the projection area AR1 of the projection optical system PL intervening therebetween. The liquid recovery ports 21K, 21K are provided outside the liquid supply ports 14K, 14K with respect to the projection area AR1 of the projection optical system PL. In this embodiment, the projection area AR1 of the projection optical system PL is set to have a rectangular shape as viewed in a plan view in which the Y axis direction is the longitudinal direction and the X axis direction is the transverse direction.

The lower surface (surface directed toward the substrate P) 18a of the nozzle member 18 is a substantially flat surface. The lower surface (liquid contact surface) 2a of the optical element 2 is also a flat surface. The lower surface 18a of the nozzle member 18 is substantially flush with the lower surface 2a of the optical element 2. Accordingly, the liquid immersion area AR2 can be satisfactorily formed over a wide range. The second area LA2, in which the liquid 1 can be retained, is the area disposed inside the recovery ports 21K, of the lower surface 2a of the optical element 2 and the lower surface 18a of the nozzle member 18.

A recess 55 is provided on the substrate stage PST. The substrate holder PH is arranged in the recess 55. The upper surface 57 other than the recess 55 of the substrate stage PST is the flat surface (flat portion) to have approximately the same height as that of (to be flush with) the surface of the substrate P held by the substrate holder PH. The first area LA1, in which the liquid 1 can be retained, is the area which includes the upper surface 57 and the surface of the substrate P.

As shown in FIG. 21B, the movement mirrors 45 are arranged at the two edges of the substrate stage PST which has a rectangular shape as viewed in the plan view, the two edges being perpendicular to one another. A reference member 300 is arranged at a predetermined position outside the substrate P on the substrate stage PST. A reference mark PFM to be detected by an unillustrated substrate alignment system and a reference mark MFM to be detected by a mask alignment system are provided in a predetermined positional relationship on the reference member 300. In this embodiment, the FIA (field image alignment) system is adopted for the substrate alignment system as disclosed, for example, in Japanese Patent Application Laid-open No. 4-65603, in which the illumination light beam such as the white light is radiated from a halogen lamp while allowing the substrate stage PST to stand still, and an obtained image of a mark is photographed in a predetermined image pickup field by an image pickup element to measure the position of the mark by means of the image processing. In this embodiment, the VRA (visual reticle alignment) system is adopted for the mask alignment system as disclosed, for example, in Japanese Patent Application Laid-open No. 7-176468 in which the light beam is radiated onto a mark, and the image data of the mark photographed by a CCD camera or the like is subjected to the image processing to detect the position of the mark. The upper surface 301A of the reference member 300 is a substantially flat surface, which is provided to have approximately the same height as those of (to be flush with) the upper surface 57 of the substrate stage PST and the surface of the substrate P held by the substrate stage PST. The upper surface 301A of the reference member 300 can also serve as the reference surface for the focus-detecting system 56.

The substrate alignment system also detects alignment marks AM formed on the substrate P. As shown in FIG. 21B, a plurality of shot areas S1 to S24 are formed on the substrate P. The plurality of alignment marks AM are provided on the substrate P corresponding to the plurality of shot areas S1 to S24.

An uneven illuminance sensor 400 as a measuring sensor, which is disclosed, for example, in Japanese Patent Application Laid-open No. 57-117238, is arranged at a predetermined position outside the substrate P on the substrate stage PST. The uneven illuminance sensor 400 is provided with an upper plate 401 which is rectangular as viewed in a plan view. The upper surface 401A of the upper plate 401 is a substantially flat surface, which is provided to have substantially the same height as those of (to be flush with) the surface of the substrate P held by the substrate stage PST and the upper surface 57 of the substrate stage PST. A pinhole portion 470, through which the light is transmissive, is provided through the upper surface 401A of the upper plate 401. Portions of the upper surface 401A other than the pinhole portion 470 are coated with a light-shielding material such as chromium.

A spatial image-measuring sensor 500 as a measuring sensor, which is disclosed, for example, in Japanese Patent Application Laid-open No. 2002-14005, is provided at a predetermined position outside the substrate P on the substrate stage PST. The spatial image-measuring sensor 500 is provided with an upper plate 501 which is rectangular as viewed in a plan view. The upper surface 501A of the upper plate 501 is a substantially flat surface, which is provided to have substantially the same height as those of (to be flush with) the surface of the substrate P held by the substrate stage PST and the upper surface 57 of the substrate stage PST. A slit portion 570, through which the light is transmissive, is provided through the upper surface 501A of the upper plate 501. Portions of the upper surface 501A other than the slit portion 570 are coated with a light-shielding material such as chromium.

A radiation amount sensor (illuminance sensor) 600, which is disclosed, for example, in Japanese Patent Application Laid-open No. 11-16816, is also provided on the substrate stage PST. The upper surface 601A of the upper plate 601 of the radiation amount sensor 600 is provided to have substantially the same height as those of (to be flush with) the surface of the substrate P held by the substrate stage PST and the upper surface 57 of the substrate stage PST.

A gutter member 89 is provided on the side surfaces of the substrate stage PST to surround the substrate stage PST. The gutter member 89 is capable of recovering (capable of retaining) the liquid 1 leaked from the surface of the substrate P and the surface of the substrate stage PST, and is provided outside the upper surface (flat surface) 57 of the substrate stage PST. An optical fiber 80, which is capable of detecting the presence or absence of the liquid 1, is arranged in the gutter member 89. When the optical fiber 80 in the gutter member 89 detects the presence of the liquid 1, the control unit CONT applies the appropriate treatment such as the stop of the liquid supply operation of the liquid supply mechanism (10) in the same manner as in the embodiment described above.

In this embodiment, the liquid immersion area AR2 is formed on the substrate P when the substrate P is exposed as a matter of course, and the liquid immersion area AR2 is formed on the upper plates 301, 401, 501, 601 respectively when the reference mark MFM of, for example, the reference member 300 is measured and when the measuring process is performed by using the sensors 400, 500, 600. The measuring process is performed via the liquid 1. For example, when the reference mark MFM on the reference member 300 is measured via the liquid 1, then the area of the first area LA1 including the upper surface 301A of the reference member 300 is opposed to the second area LA2, and the space between a part of the first area LA1 and the second area LA2 is filled with the liquid 1. When the measuring process is performed via the liquid 1 by using the uneven illuminance sensor 400, then the area of the first area LA1 including the upper surface 401A of the upper plate 401 is opposed to the second area LA2, and the space between a part of the first area LA1 and the second area LA2 is filled with the liquid 1. Similarly, when the measuring process is performed via the liquid 1 by using the sensors 500, 600, then the area of the first area LA1 including the upper surfaces 501A, 601A of the upper plates 501, 601 is opposed to the second area LA2, and the space between a part of the first area LA1 and the second area LA2 is filled with the liquid 1.

The control unit CONT restricts the movement range of the substrate stage PST to be the first range SR1 shown in FIG. 21B during the period in which the liquid supply mechanism (10) supplies the liquid 1 to form the liquid immersion area AR2 on the substrate stage PST (on the first area LA1). With reference to FIG. 21B, the reference numeral LA2a indicates the position obtained when the second area LA2 is arranged most closely to the +Y side and the −X side in the first area LA1 within the range in which the liquid 1 can be retained. In FIG. 21B, the explanation is made assuming that the optical axis AX of the projection optical system PL (second area LA2) is moved with respect to the substrate stage PST (first area LA1) in order to simplify the explanation. Similarly, the reference numeral LA2b indicates the position obtained when the second area LA2 is arranged most closely to the +Y side and the +X side in the first area LA1. The reference numeral LA2c indicates the position obtained when the second area LA2 is arranged most closely to the −Y side and the +X side in the first area LA1. The reference numeral LA2d indicates the position obtained when the second area LA2 is arranged most closely to the −Y side and the −X side in the first area LA1.

The inner area, which is obtained by connecting the respective centers (positions of the optical axis AX of the projection optical system PL in this case) of the respective second areas LA2a to LA2d, is the first range SR1. As described above, the movement range of the substrate stage PST is restricted to the first range SR1 during the period in which the liquid supply mechanism (10) supplies the liquid 1. Accordingly, the liquid 1 can be always retained between the first area LA1 and the second area LA2. It is possible to avoid the inconvenience such as the leakage of the liquid 1.

On the other hand, the control unit CONT restricts the movement range of the substrate stage PST to the second range SR2 which is wider than the first range SR1 during the period in which the liquid supply mechanism (10) does not supply the liquid 1. In this arrangement, the first range SR1 is included in the second range SR2. As described above, the movement range of the substrate stage PST is restricted to the second range SR2 which is wider than the first range SR1 during the period in which the liquid supply mechanism (10) stops the supply of the liquid 1. Accordingly, it is possible to smoothly perform the predetermined operation such as the operation for allowing the substrate stage PST to be moved to the load/unload position for the substrate P.

As described above, the respective embodiments of the present invention have been specifically explained. According to the present invention, when the abnormality is detected by the control unit provided for the exposure apparatus, the control unit controls the appropriate mechanism and the unit of the exposure apparatus to previously avoid, for example, the electric leakage caused by the water leakage or the like and the suction of the leak water. FIG. 23 shows a block diagram collectively illustrating the relationship among the detecting section for detecting the abnormality, the control unit, and the control objective section to be controlled by the control unit. The control unit of the exposure apparatus is connected to the various detecting systems including, for example, the various detecting units provided in the exposure apparatus such as the supply side/recovery side flow meter for detecting the abnormality of the situation (liquid flow) on the basis of the supply side flow meter or the recovery side flow meter singly or the difference in the flow rate therebetween, the stage interferometer for detecting the stage position abnormality (or the occurrence of the water leakage caused thereby) by measuring the stage position of the substrate stage, the focus-detecting system for detecting the stage position abnormality (or the occurrence of the water leakage caused thereby) by measuring the focus situation of the substrate stage, the leakage detector 700, 701 for detecting the water leakage (abnormality) adhered to the optical fiber and/or the prism provided for the substrate stage and/or the base plate, and the water level indicator for detecting the abnormality of the recovery amount from the water level of the recovery tank. The control unit can receive the abnormal signal from the detecting systems as described above. In this procedure, the control unit can judge whether the signal is the normal signal or the abnormal signal by comparing the predetermined reference signal with the signal received from each of the detectors.

The control unit of the exposure apparatus is also connected to the various related units disposed outside the exposure apparatus, including, for example, the liquid (pure water) producing unit, the liquid (pure water) temperature adjusting unit, the developing unit, and the substrate transport unit. The control unit can receive the signal notifying the abnormality of the related units as described above. The control unit of the exposure apparatus can also receive the signal notifying the abnormality of the factory in which the exposure apparatus is installed. The abnormality of the factory or the like in which the exposure apparatus is installed includes, for example, the abnormality of the clean room in which the exposure apparatus is arranged, the abnormality of the capacity of the electric power and the pure water to be supplied to the exposure apparatus, the earthquake, and the fire. The control unit may judge whether or not the signal is the normal signal or the abnormal signal by comparing the predetermined reference signal with each of the signals received from the respective related units.

Further, as explained in the respective embodiments described above, the control unit of the exposure apparatus is connected to the control objective units such as the various components including, for example, the liquid supply mechanism, the liquid recovery mechanism, the stage unit, especially the stage air bearing, the stage linear motor, the substrate holder-attracting system, the sensor such as the photomultiplier, the anti-vibration unit, and the actuator. The control unit can receive the signals notifying the abnormality of the respective components. When the sensor for detecting the earthquake is provided, the control unit can also receive the abnormal signal from the earthquake sensor. When the water quality sensor for measuring the quality of the liquid 1 (temperature, dissolved oxygen concentration, and ratio of impurity such as organic matter) is provided, the control unit can also receive the abnormal signal from the water quality sensor.

Figure 24:
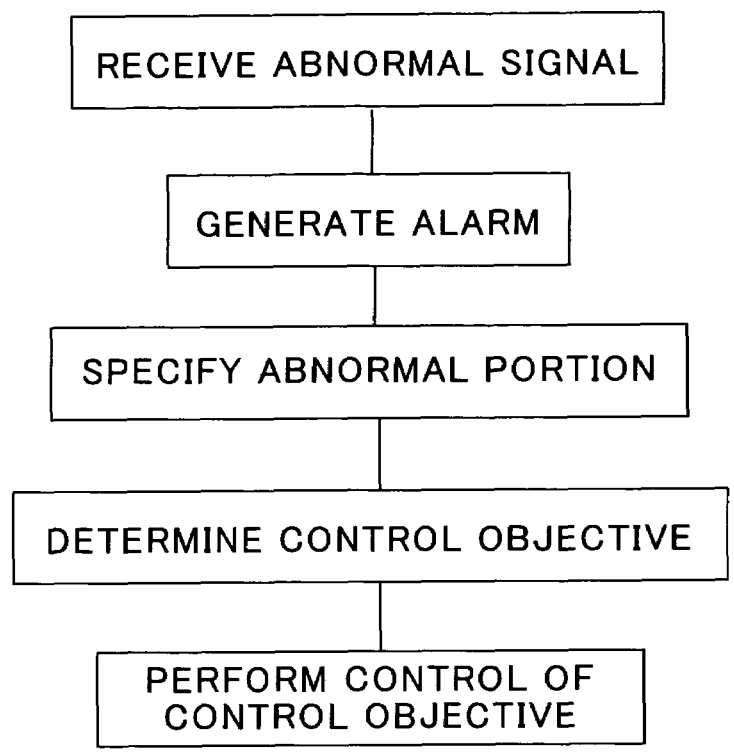
FIG. 24 shows a flow chart illustrating the control contents of the control unit of the exposure apparatus according to the present invention.

The control operation of the control unit will be briefly explained with reference to FIG. 24. The control unit receives the signal to indicate the abnormality, for example, from the detecting system disposed inside the exposure apparatus or the related units 1 to 4 disposed outside the exposure apparatus. The signal, which indicates the abnormality, is, for example, the signal which exerts any influence on the flow of the liquid supplied (and recovered) for the liquid immersion exposure. In this procedure, the control unit may compare the received signal with the reference signal to judge that the received signal is the abnormal signal. Subsequently, the control unit specifies, from the abnormal signal, the portion at which the abnormality arises. In this situation, the control unit may generate the alarm by the alarm unit. The control unit judges any unit or device to be controlled depending on the portion at which the abnormality arises. The control unit feeds the control signal to the unit to make the countermeasure against the abnormal situation. For example, when the liquid leakage is detected by the detector 1 (for example, the optical fiber) provided for the substrate stage, the control unit can stop the liquid supply by the liquid supply mechanism, the movement of the stage by the stage control system, the suction by the stage air bearing and the substrate holder-attracting system, and the electric power supply to the stage linear motor, the substrate holder-attracting system, the sensor, the anti-vibration unit, and the actuator respectively depending on the detection signal, while the control unit can continue only the liquid recovery by the liquid recovery mechanism. The control unit judges any certain unit for which the operation is to be stopped, depending on the place at which the liquid leaks and the degree thereof (magnitude of the signal). Depending on the magnitude of the detection signal, only the operation of the liquid supply mechanism may be stopped, while the electric units such as the stage linear motor and the sensor are operated as they are.

As described above, pure water is used as the liquid 1 in the embodiments of the present invention. Pure water is advantageous in that pure water is available in a large amount with ease, for example, in the semiconductor production factory, and pure water exerts no harmful influence, for example, on the optical element (lens) and the photoresist on the substrate P. Further, pure water exerts no harmful influence on the environment, and the content of impurity is extremely low. Therefore, it is also expected to obtain the function to wash the surface of the substrate P and the surface of the optical element provided at the end surface of the projection optical system PL.

It is approved that the refractive index n of pure water (water) with respect to the exposure light beam EL having a wavelength of about 193 nm is approximately in an extent of 1.44. When the ArF excimer laser beam (wavelength: 193 nm) is used as the light source of the exposure light beam EL, then the wavelength is shortened on the substrate P by 1/n, i.e., to about 134 nm, and a high resolution is obtained. Further, the depth of focus is magnified about n times, i.e., about 1.44 times as compared with the value obtained in the air. Therefore, when it is enough to secure an approximately equivalent depth of focus as compared with the case of the use in the air, it is possible to further increase the numerical aperture of the projection optical system PL. Also in this viewpoint, the resolution is improved.

In the embodiments of the present invention, the optical element 2 is attached to the end portion of the projection optical system PL. However, the optical element, which is attached to the end portion of the projection optical system PL, may be an optical plate which is usable to adjust the optical characteristics of the projection optical system PL, for example, the aberration (for example, spherical aberration and comatic aberration). Alternatively, the optical element may be a parallel plane plate through which the exposure light beam EL is transmissive. When the optical element, which makes contact with the liquid 1, is the parallel plane plate which is cheaper than the lens, it is enough that the parallel plane plate is merely exchanged immediately before supplying the liquid 1 even when any substance (for example, any silicon-based organic matter), which deteriorates the transmittance of the projection optical system PL, the illuminance of the exposure light beam EL on the substrate P, and the uniformity of the illuminance distribution, is adhered to the parallel plane plate, for example, during the transport, the assembling, and/or the adjustment of the exposure apparatus EX. An advantage is obtained such that the exchange cost is lowered as compared with the case in which the optical element to make contact with the liquid 1 is the lens. That is, the surface of the optical element to make contact with the liquid 1 is dirtied, for example, due to the adhesion of scattered particles generated from the resist by being irradiated with the exposure light beam EL or any impurity contained in the liquid 1. Therefore, it is necessary to periodically exchange the optical element. However, when the optical element is the cheap parallel plane plate, then the cost of the exchange part is low as compared with the lens, and it is possible to shorten the time required for the exchange. Thus, it is possible to suppress the increase in the maintenance cost (running cost) and the decrease in the throughput.

The liquid 1 is water in the embodiments of the present invention. However, the liquid 1 may be any liquid other than water. For example, when the light source of the exposure light beam EL is the $F_2$ laser, the $F_2$ laser beam is not transmitted through water. Therefore, in this case, liquids preferably usable as the liquid 1 may include, for example, the fluorine-based liquid such as fluorine-based oil and perfluoropolyether (PFPE) through which the $F_2$ laser beam is transmissive. Alternatively, other than the above, it is also possible to use, as the liquid 1, liquids (for example, cedar oil) which have the transmittance with respect to the exposure light beam EL, which have the refractive index as high as possible, and which are stable against the photoresist coated on the surface of the substrate P and the projection optical system PL.

In the respective embodiments described above, the shape of the nozzle is not specifically limited. For example, two pairs of the nozzles may be used to supply or recover the liquid 1 for the long side of the projection area AR1. In this arrangement, the supply nozzles and the recovery nozzles may be arranged while being aligned vertically in order that the liquid 1 can be supplied and recovered in any one of the directions of the +X direction and the −X direction.

The substrate P, which is usable in the respective embodiments described above, is not limited to the semiconductor wafer for producing the semiconductor device. The applicable substrates include, for example, the glass substrate for the display device, the ceramic wafer for the thin film magnetic head, and the master plate (synthetic quartz, silicon wafer) for the mask or the reticle to be used for the exposure apparatus.

In the embodiments described above, the exposure apparatus is adopted, in which the space between the projection optical system PL and the substrate P is locally filled with the liquid. However, the present invention is also applicable to a liquid immersion exposure apparatus in which a stage holding a substrate as an exposure objective is moved in a liquid tank, and a liquid immersion exposure apparatus in which a liquid tank having a predetermined depth is formed on a stage and a substrate is held therein. The structure and the exposure operation of the liquid immersion exposure apparatus in which the stage holding the substrate as the exposure objective is moved in the liquid tank are described in detail, for example, in Japanese Patent Application Laid-open No. 6-124873. The structure and the exposure operation of the liquid immersion exposure apparatus in which the liquid tank having the predetermined depth is formed on the stage and the substrate is held therein are described in detail, for example, in Japanese Patent Application Laid-open No. 10-303114 and U.S. Pat. No. 5,825,043, contents of which are incorporated herein by reference respectively within a range of permission of the domestic laws and ordinances of the state designated or selected in this international application.

As for the exposure apparatus EX, the present invention is also applicable to the scanning type exposure apparatus (scanning stepper) based on the step-and-scan system for performing the scanning exposure for the pattern of the mask M by synchronously moving the mask M and the substrate P as well as the projection exposure apparatus (stepper) based on the step-and-repeat system for performing the full field exposure for the pattern of the mask M in a state in which the mask M and the substrate P are allowed to stand still, while successively step-moving the substrate P. The present invention is also applicable to the exposure apparatus based on the step-and-stitch system in which at least two patterns are partially overlaid and transferred on the substrate P.

The present invention is also applicable to a twin-stage type exposure apparatus which is provided with two stages capable of moving independently in the XY direction while separately placing processing objective substrates such as wafers. The structure and the exposure operation of the twin-stage type exposure apparatus are disclosed, for example, in Japanese Patent Application Laid-open Nos. 10-163099 and 10-214783 (corresponding to U.S. Pat. Nos. 6,341,007, 6,400,441, 6,549,269, and 6,590,634), Published Japanese Translation of PCT International Publication for Patent Application No. 2000-505958 (corresponding to U.S. Pat. No. 5,969,441), and U.S. Pat. No. 6,208,407, contents of which are incorporated herein by reference within a range of permission of the domestic laws and ordinances of the state designated or selected in this international application.

As disclosed in Japanese Patent Application Laid-open No. 11-135400, the present invention is also applicable to the exposure apparatus which is provided with a substrate stage for holding the substrate P, and a measuring stage provided with, for example, various measuring members and sensors. In this case, the liquid can be also retained between the projection optical system and the upper surface of the measuring stage. The countermeasure such as the water leakage detector as described above can be also applied to the measuring stage.

As for the type of the exposure apparatus EX, the present invention is not limited to the exposure apparatus for the semiconductor device production for exposing the substrate P with the semiconductor device pattern. The present invention is also widely applicable, for example, to the exposure apparatus for producing the liquid crystal display device or for producing the display as well as the exposure apparatus for producing, for example, the thin film magnetic head, the image pickup device (CCD), the reticle, or the mask.

When the linear motor is used for the substrate stage PST and/or the mask stage MST, it is allowable to use any one of those of the air floating type based on the use of the air bearing and those of the magnetic floating type based on the use of the Lorentz's force or the reactance force. Each of the stages PST, MST may be either of the type in which the movement is effected along the guide or of the guideless type in which no guide is provided. An example of the use of the linear motor for the stage is disclosed in U.S. Pat. Nos. 5,623,853 and 5,528,118, contents of which are incorporated herein by reference respectively within a range of permission of the domestic laws and ordinances of the state designated or selected in this international application.

As for the driving mechanism for each of the stages PST, MST, it is also allowable to use a plane motor in which a magnet unit provided with two-dimensionally arranged magnets and an armature unit provided with two-dimensionally arranged coils are opposed to one another, and each of the stages PST, MST is driven by the electromagnetic force. In this arrangement, any one of the magnet unit and the armature unit is connected to the stage PST, MST, and the other of the magnet unit and the armature unit is provided on the side of the movable surface of the stage PST, MST.

The reaction force, which is generated in accordance with the movement of the substrate stage PST, may be mechanically released to the floor (ground) by using a frame member so that the reaction force is not transmitted to the projection optical system PL. The method for handling the reaction force is disclosed in detail, for example, in U.S. Pat. No. 5,528,118 (Japanese Patent Application Laid-open No. 8-166475), contents of which are incorporated herein by reference within a range of permission of the domestic laws and ordinances of the state designated or selected in this international application.

The reaction force, which is generated in accordance with the movement of the mask stage MST, may be mechanically released to the floor (ground) by using a frame member so that the reaction force is not transmitted to the projection optical system PL. The method for handling the reaction force is disclosed in detail, for example, in U.S. Pat. No. 5,874,820 (Japanese Patent Application Laid-open No. 8-330224), contents of which are incorporated herein by reference within a range of permission of the domestic laws and ordinances of the state designated or selected in this international application.

The exposure apparatus EX according to the embodiment of the present invention is produced by assembling the various subsystems including the respective constitutive elements as defined in claims so that the predetermined mechanical accuracy, the electric accuracy, and the optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which, for example, the temperature and the cleanness are managed.

Figure 22:
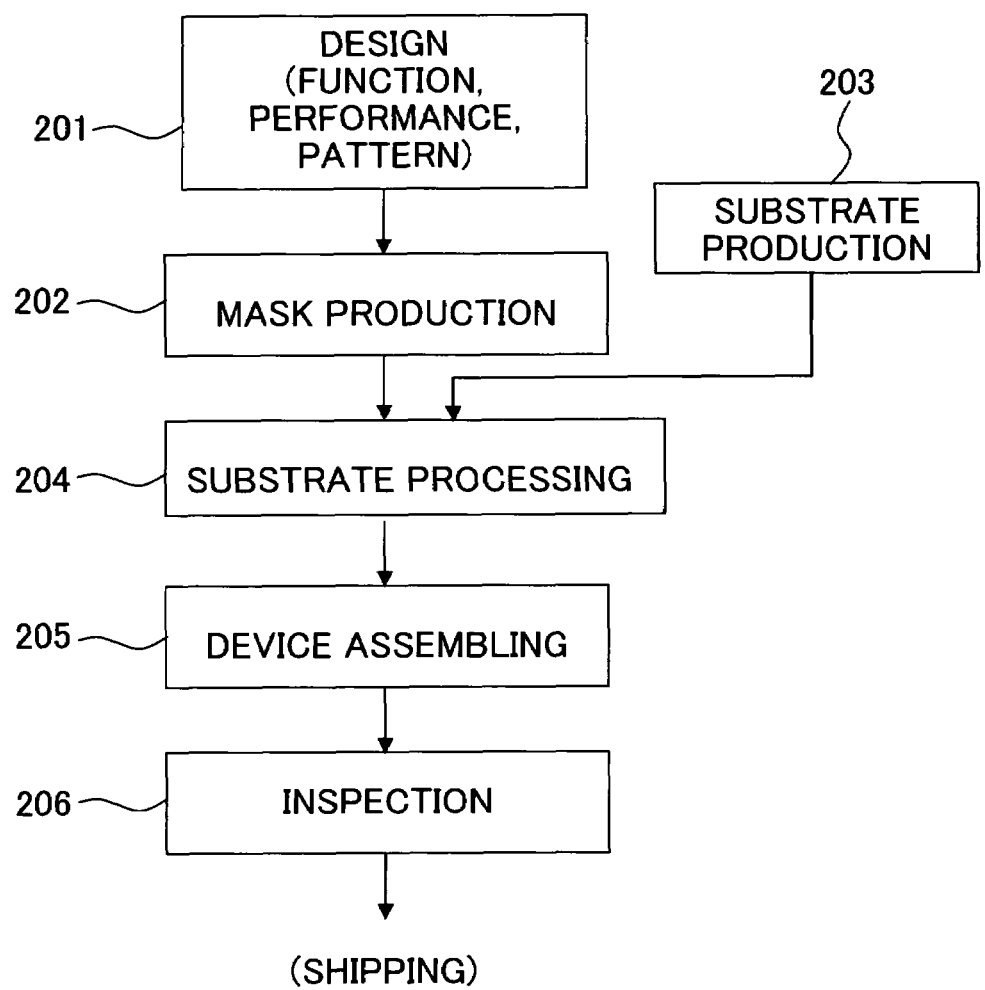
FIG. 22 shows a flow chart illustrating exemplary steps of producing a semiconductor device.

As shown in FIG. 22, the microdevice such as the semiconductor device is produced by performing, for example, a step 201 of designing the function and the performance of the microdevice, a step 202 of manufacturing a mask (reticle) based on the designing step, a step 203 of producing a substrate as a base material for the device, a substrate processing step 204 of exposing the substrate with a pattern of the reticle by using the exposure apparatus EX of the embodiment described above, a step 205 of assembling the device (including a dicing step, a bonding step, and a packaging step), and an inspection step 206.

According to the present invention, the abnormality of the internal unit of the exposure apparatus or the related unit disposed outside the exposure apparatus, which affects the liquid immersion exposure, can be detected to suppress or reduce the influence exerted on the peripheral unit, the members, and/or the exposure operation due to the leakage and/or the invasion of the liquid for the exposure. Therefore, it is possible to maintain the satisfactory state of the expensive exposure apparatus, and it is possible to accurately perform the liquid immersion exposure process. Accordingly, it is possible to produce the device having the desired performance.

What is claimed is:

1. An exposure apparatus which exposes a substrate by radiating an exposure light beam onto the substrate through a liquid, the exposure apparatus comprising:
    a projection optical system which projects an image of a pattern onto the substrate;
    a liquid supply system which supplies the liquid to a space between the projection optical system and the substrate during the exposure, wherein the liquid supply system stops the supply of the liquid when any abnormality is detected; and
    a liquid recovery system which recovers the liquid supplied by the liquid supply system, wherein the abnormality includes abnormality of recovery operation performed by the liquid recovery system.

2. The exposure apparatus according to claim 1, wherein the abnormality of the operation of the liquid recovery system is detected by comparing an amount of the liquid supplied from the liquid supply system with an amount of the liquid recovered by the liquid recovery system.

3. The exposure apparatus according to claim 2, wherein the abnormality of the operation of the liquid recovery system is detected when a difference between the amount of the liquid supplied from the liquid supply system and the amount of the liquid recovered by the liquid recovery system is not less than a threshold value.

4. The exposure apparatus according to claim 2, wherein
    the liquid recovery system includes a flow meter which measures the amount of the liquid recovered by the liquid recovery system, and
    the liquid supply system includes a flow meter which measures the amount of the liquid supplied by the liquid supply system.

5. The exposure apparatus according to claim 2, wherein an oversupply is detected on the basis of the amount of the liquid supplied from the liquid supply system and the amount of the liquid recovered by the liquid recovery system.

6. A device manufacturing method comprising:
    exposing an image of a pattern onto a substrate using the exposure apparatus as defined in claim 1; and
    processing the exposed substrate.

7. The exposure apparatus according to claim 1, wherein
    the liquid recovery system includes a flow meter which measures an amount of the liquid recovered by the liquid recovery system, and
    the abnormality of the operation of the liquid recovery system is detected based on the measurement of the amount of the liquid recovered by the liquid recovery system.

8. The exposure apparatus according to claim 1, wherein the liquid recovery system connects to a vacuum system, and the abnormality of recovery operation includes a malfunction of the vacuum system.

9. The exposure apparatus according to claim 1, wherein the liquid recovery system includes a gas/liquid separator, and the abnormality of recovery operation includes a malfunction of the gas/liquid separator.

10. The exposure apparatus according to claim 1, wherein the liquid supply system includes a valve which stops the supply of the liquid when the abnormality is detected.

11. The exposure apparatus according to claim 10, wherein the valve mechanically stops the supply of the liquid when a power source of the exposure apparatus is stopped.

12. The exposure apparatus according to claim 1, further comprising:
an electric unit,
wherein supply of electric power to the electric unit is stopped when the abnormality is detected.

13. The exposure apparatus according to claim 12, further comprising a movable member which holds the substrate, wherein the electric unit includes a motor which moves the movable member.

14. The exposure apparatus according to claim 1, further comprising:
a suction port,
wherein suction from the suction port is stopped when the abnormality is detected.

15. The exposure apparatus according to claim 14, further comprising
a movable member which holds the substrate, and
a gas bearing which has the suction port and by which the movable member is moved while making no contact with a guide surface,
wherein the suction port sucks gas existing between the movable member and the guide surface.

16. The exposure apparatus according to claim 1, wherein the abnormality includes abnormality of a positional relationship between the projection optical system and a movable member which holds the substrate.

17. The exposure apparatus according to claim 16, wherein the abnormality of the positional relationship is a state in which the liquid cannot be retained under the projection optical system.

18. The exposure apparatus according to claim 17, further comprising
a first area which is defined on the movable member, and
a second area which includes an end portion of the projection optical system on an image plane side,
wherein the liquid is retained between at least a part of the first area and the second area to form a liquid immersion area in a situation in which the first area is opposed to the second area, and the abnormality of positional relationship is between the first area and the second area.

19. The exposure apparatus according to claim 18, wherein the abnormality of the positional relationship includes a state in which at least a part of the liquid immersion area protrudes to outside from the first area.

20. The exposure apparatus according to claim 18, wherein movement of the movable member is stopped when the abnormality of the positional relationship between the first area and the second area is detected.

21. The exposure apparatus according to claim 1, wherein the abnormality includes leakage of the liquid.

22. The exposure apparatus according to claim 21, further comprising
a detector which detects the leakage of the liquid, and
a controller which controls operation of the exposure apparatus on a basis of a result of detection performed by the detector.

23. The exposure apparatus according to claim 22, wherein the detector is arranged in a liquid recovery port which is provided for a movable member that holds the substrate.

24. The exposure apparatus according to claim 23, further comprising a flat portion which is substantially flush with a surface of the substrate and which is provided around the substrate held by the movable member.

25. The exposure apparatus according to claim 23, wherein the liquid recovery port includes a groove which is formed so as to surround the substrate.

26. The exposure apparatus according to claim 22, wherein the detector optically detects the leakage of the liquid.

27. An exposure method comprising:
supplying a liquid to a space between a projection optical system and a substrate by a liquid supply system;
recovering the supplied liquid by a liquid recovery system; and
exposing the substrate via the supplied liquid,
wherein the liquid supply system stops the supply of the liquid when any abnormality is detected, and the abnormality includes abnormality of recovery operation performed by the liquid recovery system.

28. The exposure method according to claim 27, wherein the abnormality of the operation of the liquid recovery system is detected by comparing an amount of the liquid supplied from the liquid supply system with an amount of the liquid recovered by the liquid recovery system.

29. The exposure method according to claim 28, wherein the abnormality of the operation of the liquid recovery system is detected when a difference between the amount of the liquid supplied from the liquid supply system and the amount of the liquid recovered by the liquid recovery system is not less than a threshold value.

30. The exposure method according to claim 28, wherein
the liquid recovery system includes a flow meter which measures the amount of the liquid recovered by the liquid recovery system, and
the liquid supply system includes a flow meter which measures the amount of the liquid supplied by the liquid supply system.

31. The exposure method according to claim 28, wherein an oversupply is detected on the basis of the amount of the liquid supplied from the liquid supply system and the amount of the liquid recovered by the liquid recovery system.

32. The exposure method according to claim 27, wherein
the liquid recovery system includes a flow meter which measures an amount of the liquid recovered by the liquid recovery system, and
the abnormality of the operation of the liquid recovery system is detected based on the amount of the liquid recovered by the liquid recovery system.

33. The exposure method according to claim 27, wherein the liquid recovery system connects to a vacuum system, and the abnormality of recovery operation includes a malfunction of the vacuum system.

34. The exposure method according to claim 27, wherein the liquid recovery system includes a gas/liquid separator, and the abnormality of recovery operation includes a malfunction of the gas/liquid separator.

35. The exposure method according to claim 27, wherein the liquid supply system includes a valve which stops the supply of the liquid when the abnormality is detected.

36. The exposure method according to claim 35, wherein the valve mechanically stops the supply of the liquid when a power source is stopped.

37. The exposure method according to claim 27, further comprising:
stopping supply of electric power to an electric unit when the abnormality is detected.

38. The exposure method according to claim 37, wherein the electric unit comprises a motor which moves a movable member which holds the substrate.

39. The exposure method according to claim 27, further comprising:
stopping suction from a suction port when the abnormality is detected.

40. The exposure method according to claim 39, wherein
a gas bearing has the suction port and moves a movable member which holds the substrate while making no contact with a guide surface, and
the suction port sucks gas existing between the movable member and the guide surface.

41. The exposure method according to claim 27, wherein the abnormality includes abnormality of a positional relationship between the projection optical system and a movable member which holds the substrate.

42. The exposure method according to claim 41, wherein the abnormality of the positional relationship is a state in which the liquid cannot be retained under the projection optical system.

43. The exposure method according to claim 42, wherein
a first area is defined on the movable member,
a second area includes an end portion of the projection optical system on an image plane side,
the liquid is retained between at least a part of the first area and the second area to form a liquid immersion area in a situation in which the first area is opposed to the second area, and
the abnormality of positional relationship is between the first area and the second area.

44. The exposure method according to claim 43, wherein the abnormality of the positional relationship includes a state in which at least a part of the liquid immersion area protrudes to outside from the first area.

45. The exposure method according to claim 43, wherein movement of the movable member is stopped when the abnormality of the positional relationship between the first area and the second area is detected.

46. The exposure method according to claim 27, wherein the abnormality includes leakage of the liquid.

47. The exposure method according to claim 46, further comprising:
detecting the leakage of the liquid,
wherein operation of an exposure apparatus is performed on the basis of a result of the detection.

48. The exposure method according to claim 46, wherein a detector is arranged in a liquid recovery port which is provided for a movable member that holds the substrate.

49. The exposure method according to claim 48, wherein the movable member has a flat portion which is substantially flush with a surface of the substrate and which is provided around the substrate held by the movable member.

50. The exposure method according to claim 48, wherein the liquid recovery port includes a groove which is formed so as to surround the substrate.

51. The exposure method according to claim 48, wherein the detector optically detects the leakage of the liquid.

* * * * *